(12) United States Patent
Liu et al.

(10) Patent No.: US 12,211,452 B2
(45) Date of Patent: Jan. 28, 2025

(54) DISPLAY SUBSTRATE AND DISPLAY DEVICE

(71) Applicants: Beijing BOE Technology Development Co., Ltd., Beijing (CN); BOE TECHNOLOGY GROUP CO., LTD., Beijing (CN)

(72) Inventors: Miao Liu, Beijing (CN); Xueguang Hao, Beijing (CN); Libin Liu, Beijing (CN); Teng Chen, Beijing (CN); Xinyin Wu, Beijing (CN); Yong Qiao, Beijing (CN); Xing Yao, Beijing (CN); Jingquan Wang, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/572,742

(22) PCT Filed: May 31, 2023

(86) PCT No.: PCT/CN2023/097462
§ 371 (c)(1),
(2) Date: Dec. 20, 2023

(87) PCT Pub. No.: WO2023/236831
PCT Pub. Date: Dec. 14, 2023

(65) Prior Publication Data
US 2024/0371329 A1 Nov. 7, 2024

(30) Foreign Application Priority Data

Jun. 9, 2022 (CN) .......................... 202210644140.7

(51) Int. Cl.
*G09G 3/3266* (2016.01)
*G09G 3/20* (2006.01)
(Continued)

(52) U.S. Cl.
CPC ......... *G09G 3/3266* (2013.01); *G09G 3/2092* (2013.01); *G09G 3/3233* (2013.01);
(Continued)

(58) Field of Classification Search
USPC ....................................... 345/212
See application file for complete search history.

(56) References Cited

U.S. PATENT DOCUMENTS

2019/0004634 A1 1/2019 Liu et al.
2020/0243151 A1 7/2020 Li et al.
(Continued)

FOREIGN PATENT DOCUMENTS

CN 107340914 A 11/2017
CN 110148389 A 8/2019
(Continued)

OTHER PUBLICATIONS

Zhang, J. et al., "New design of narrow border LCD panel," Chinese Journal of Liquid Crystals and Displays, vol. 30, No. 3, Jun. 2015, 11 pages. (Submitted with English Translation).
(Continued)

*Primary Examiner* — Chineyere D Wills-Burns
(74) *Attorney, Agent, or Firm* — McCoy Russell LLP

(57) ABSTRACT

The display substrate includes a shift register arranged on a base substrate, and the shift register includes a plurality of stages of driving circuits; a plurality of stages of the driving circuit are provided in the driving circuit area of the base substrate; a stage of driving circuit area includes a first area and a second area, and the first area is provided with a first type of transistor included in the driving circuit, a second
(Continued)

type of transistor included in the driving circuit is provided in the second area; one side of the first area is a side of the power line away from the second area, and the other side of the first area is a side close to the second area of an active layer of the first type of transistor close to the second area.

20 Claims, 47 Drawing Sheets

(51) Int. Cl.
*G09G 3/3233* (2016.01)
*G11C 19/28* (2006.01)
*H10K 59/121* (2023.01)
*H10K 59/126* (2023.01)

(52) U.S. Cl.
CPC ..... *G11C 19/28* (2013.01); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2320/045* (2013.01); *G09G 2330/02* (2013.01); *H10K 59/1213* (2023.02); *H10K 59/1216* (2023.02); *H10K 59/126* (2023.02)

(56) References Cited

U.S. PATENT DOCUMENTS

| | | | |
|---|---|---|---|
| 2021/0090484 A1 | 3/2021 | Shang et al. | |
| 2021/0312869 A1* | 10/2021 | Dai | G09G 3/3266 |
| 2021/0407426 A1* | 12/2021 | Zeng | G11C 19/28 |
| 2022/0051628 A1 | 2/2022 | Dai et al. | |
| 2022/0052144 A1* | 2/2022 | Dai | H10K 71/20 |
| 2022/0068212 A1* | 3/2022 | Yao | G11C 19/28 |
| 2022/0199029 A1* | 6/2022 | Xiao | G09G 3/3266 |
| 2022/0310006 A1* | 9/2022 | Yu | G11C 19/28 |
| 2022/0383820 A1* | 12/2022 | Zeng | G11C 19/28 |
| 2023/0012488 A1 | 1/2023 | Ma et al. | |
| 2023/0126436 A1* | 4/2023 | Bai | G11C 19/28 345/204 |
| 2023/0162684 A1* | 5/2023 | Lu | H10K 59/131 345/204 |
| 2023/0207031 A1 | 6/2023 | Wang et al. | |
| 2023/0260462 A1* | 8/2023 | Chen | G09G 3/3266 345/214 |
| 2023/0298509 A1* | 9/2023 | Liu | G02F 1/133 345/55 |
| 2023/0335051 A1* | 10/2023 | Yu | H10K 59/1213 |
| 2023/0352110 A1 | 11/2023 | Wang et al. | |

FOREIGN PATENT DOCUMENTS

| | | |
|---|---|---|
| CN | 110930942 A | 3/2020 |
| CN | 111145823 A | 5/2020 |
| CN | 112863586 A | 5/2021 |
| CN | 113192551 A | 7/2021 |
| CN | 113284543 A | 8/2021 |
| CN | 113421518 A | 9/2021 |
| CN | 113838404 A | 12/2021 |
| CN | 113851174 A | 12/2021 |
| CN | 113870796 A | 12/2021 |
| CN | 114175166 A | 3/2022 |
| CN | 114223135 A | 3/2022 |
| CN | 114724613 A | 7/2022 |

OTHER PUBLICATIONS

Xue, Y. et al., "Gate Driver Circuit for a 15-inch AMOLED Display with Narrow Border," Proceedings of the 2021 IEEE 4th International Conference on Electronics Technology, May 7, 2021, Chengdu, China, 5 pages.

State Intellectual Property Office of the People's Republic of China, Office Action and Search Report Issued in Application 202210644140. 7, Jul. 15, 2022, 7 pages. (Submitted with Partial English Translation).

* cited by examiner

DISPLAY SUBSTRATE AND DISPLAY DEVICE

CROSS REFERENCE TO RELATED APPLICATION

This application is the U.S. national phase of PCT Application No. PCT/CN2023/097462 filed on May 31, 2023, which claims priorities of the Chinese patent application No. 202210644140.7 filed on Jun. 9, 2022, which are incorporated herein by reference in their entireties.

TECHNICAL FIELD

The present disclosure relates to the field of display technology, in particular to a display substrate and a display device.

BACKGROUND

The display panel includes a plurality of pixel circuits arranged in an array in the display area and a shift register located in the edge area. The shift register includes a plurality of driving circuits. The driving circuit is used to provide corresponding a scanning driving signal for the corresponding pixel circuit. Since the shift register is arranged in the edge area of the display panel, the arrangement of the driving circuit determines the frame width of the display panel.

SUMMARY

In one aspect, the present disclosure provides in some embodiments a display substrate, including a shift register arranged on a base substrate, wherein the shift register includes a plurality of stages of driving circuits; the driving circuit includes a first input circuit, a second input circuit, a first output circuit and a control circuit; the first output circuit is configured to provide a first scanning driving signal to a first driving signal output terminal under the control of a potential of a first node and a potential of a second node; the first input circuit is configured to input a signal to a third node under the control of a clock signal; the second input circuit is configured to input a signal provided by a power line to the second node under the control of a potential of the third node; the control circuit is configured to control the potential of the third node and the potential of the first node; a plurality of stages of driving circuits are provided in a driving circuit area of the base substrate; wherein a stage of driving circuit area includes a first area and a second area, and a first type of transistor included in the driving circuit is arranged in the first area, a second type of transistor included in the driving circuit is arranged in the second area; one side of the first area is a side of the power line away from the second area, and the other side of the first area is a side close to the second area of an active layer of the first type of transistor close to the second area; one side of the second area is a side of the power line away from the first area, and the other side of the second area is the side close to the second area of the active layer of the first type of transistor close to the second area.

Optionally, the power line includes a first power line; the second input circuit is configured to input a first voltage signal provided by a first power line into the second node under the control of the potential of the third node; $X1/X3 \geq 0.21$; wherein, $X1$ is a width of the first area in a first direction, and $X3$ is a width of the second area in the first direction; the first direction is a direction intersecting an extending direction of the first power line.

Optionally, the power line includes a second power line; the second input circuit is configured to input a second voltage signal provided by a second power line to the second node under the control of the potential of the third node; $X1/X3 \geq 0.52$; wherein, $X1$ is a width of the first area in a first direction, and $X3$ is a width of the second area in the first direction; the first direction is a direction intersecting an extension direction of the second power line.

Optionally, the first type of transistor is an N-type transistor, and the second type of transistor is a P-type transistor; a distance between at least one of the N-type transistors and the second power line is smaller than a distance between the P-type transistor and the second power line.

Optionally, the second input circuit includes a first transistor; a gate electrode of the first transistor is electrically connected to the third node, and a first electrode of the first transistor is electrically connected to the second power line, a second electrode of the first transistor is electrically connected to the second node; the first transistor is a first type of transistor; $WT1/X1 \geq 0.258$; wherein, $WT1$ is a width of an active layer of the first transistor along the first direction.

Optionally, the driving circuit further includes a second output circuit, and the second output circuit is configured to control the second driving signal output terminal to output the second scanning driving signal under the control of the potential of the third node; the second output circuit includes a second transistor; a gate electrode of the second transistor is electrically connected to the third node, and a first electrode of the second transistor is electrically connected to the second power line, a second electrode of the second transistor is electrically connected to the second driving signal output terminal; the second transistor is a first type of transistor; $WT2/X1 \geq 0.33$; $WT2$ is a width of the active layer of the second transistor along the first direction.

Optionally, the second input circuit includes a first transistor; a gate electrode of the first transistor is electrically connected to the third node, and a first electrode of the first transistor is electrically connected to the second power line, a second electrode of the first transistor is electrically connected to the second node; the driving circuit also includes a second output circuit, the second output circuit is configured to control the second driving signal output terminal to output a second scanning driving signal under the control of the potential of the third node; the second output circuit includes a second transistor; a gate electrode of the second transistor is electrically connected to the third node, and a first electrode of the second transistor is electrically connected to the second power line, and a second electrode of the second transistor is electrically connected to the second driving signal output terminal; both the first transistor and the second transistor are first type of transistors; $WT2/WT1 \geq 3.25$; the width of the active layer of the first transistor along the first direction is $WT1$, and $WT2$ is the width of the active layer of the second transistor along the first direction.

Optionally, the display substrate further includes a clock signal line group arranged in a driving circuit area, the clock signal line group is configured to provide the clock signal; an active layer of at least one first type of transistor is located between the clock signal line group and the power line in the first direction; an overlapping area between an orthographic projection of the active layer of at least one first type of transistor on the base substrate and an orthographic projection of the power line on the base substrate is less than or equal to five-sixth of an area of the active layer of the at least one first type of transistor.

Optionally, a ratio of a length of the active layer of at least one first type of transistor along the second direction to a height of the driving circuit is less than or equal to 0.75.

Optionally, the display substrate further includes a first active layer arranged in the second area; the first active layer includes a first active portion, two second active portions, and two third active portions; the display substrate further includes a second output circuit; the first active portion serves as an active layer of a third transistor, the two second active portions serve as an active layer of a fourth transistor, and the two third active portions serve as an active layer of a fifth transistor; the third transistor is a transistor included in the first output circuit that outputs a first voltage signal, the fifth transistor is a transistor included in the first output circuit that outputs a clock signal, and the fourth transistor is a transistor included in the second output circuit that outputs a third voltage signal; a channel area of an nth transistor is ARn, ARn≥2 (n-1) i, where n is equal to 1, 2 or 3, and i is an unit channel area.

Optionally, an area P1 of the first active portion is p, a sum P2 of areas of the two second active portions is greater than or equal to 2p and less than or equal to 3p; a sum P3 of areas of the two third active portions is greater than or equal to 3p and less than or equal to 4p.

Optionally, the display substrate further includes a clock signal line arranged in the driving circuit area; the clock signal line is configured to provide the clock signal; a first electrode of the fourth transistor is electrically connected to the third power line; a ratio between a first distance and a length of the active layer of the third transistor in the first direction is less than or equal to 10.78; the first distance is a distance between a side of the clock signal line away from the display area and a side of the third power line close to the display area.

Optionally, the display substrate further includes a clock signal line arranged in the driving circuit area; the clock signal line is configured to provide a clock signal; the first electrode of the fourth transistor is electrically connected to the third power line; a ratio between the line width of the first power line and the first distance is greater than or equal to 0.060; the line width of the first power line is a length of the first power line along the first direction, the first distance is a distance between the side of the clock signal line away from the display area and the side of the third power line close to the display area.

Optionally, the display substrate further includes a clock signal line arranged in the driving circuit area; the clock signal line is configured to provide a clock signal; the first electrode of the fourth transistor is electrically connected to the third power line; a ratio between the line width of the third power line and the first distance is less than or equal to 0.045; the line width of the third power line is the length of the third power line along the first direction, and the first distance is the distance between the side of the clock signal line away from the display area and the side of the third power line close to the display area.

Optionally, the display substrate further includes a clock signal line group arranged in the driving circuit area; the clock signal line group includes at least one clock signal line, and the clock signal line is configured to provide a clock signal; the display substrate includes at least two power lines; the clock signal line group is located between two of the at least two power lines; or, the clock signal line group is located on a side of the power line away from the display area.

Optionally, the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node; a ratio of a second distance to a length of the active layer of the third transistor in the first direction is less than or equal to 8.47; the third transistor is a transistor included in the first output circuit that outputs a first voltage signal; the second distance is a distance between a side of the first power line away from the display area and a side of the third power line close to the display area.

Optionally, the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node; a ratio between the line width of the first power line and the second distance is greater than or equal to 0.077; the line width of the first power line is the length of the first power line in the first direction; the second distance is a distance between the side of the first power line away from the display area and the side of the third power line close to the display area.

Optionally, the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node; a ratio between the line width of the third power line and the second distance is greater than or equal to 0.058; the line width of the third power line is the length of the third power line in the first direction; the second distance is the distance between the side of the first power line away from the display area and the side of the third power line close to the display area.

Optionally, the display substrate includes a first source-drain metal layer and a second source-drain metal layer sequentially stacked in a direction away from the base substrate; the clock signal line includes a first clock signal line portion arranged on the first source-drain metal layer or a second clock signal line portion arranged on the second source-drain metal layer.

Optionally, the display substrate further includes a third gate metal layer arranged between the first source-drain metal layer and the base substrate; the clock signal line further includes a third clock signal line portion arranged on the third gate metal layer; the clock signal line includes the first clock signal line portion, and the third clock signal line portion and the first clock signal line portion are in direct contact or are electrically connected to each other through a via hole; or, the clock signal line portion includes the second clock signal line portion, and the third clock signal line portion and the second clock signal line portion are in direct contact or are electrically connected to each other through a via hole.

Optionally, the clock signal line includes two clock signal line portions coupled to each other, and the two clock signal line portions are respectively arranged on different metal layers; one of the two clock signal line portions is continuous, and the other of the two clock signal line portions is discontinuous.

Optionally, the display substrate includes a first transfer electrode; a first electrode of the fifth transistor included in a current stage of driving circuit, a gate electrode of the sixth transistor included in the current stage of driving circuit, and a gate electrode of the seventh transistor included in an adjacent stage of driving circuit are connected to each other through a same first transfer electrode; the fifth transistor is a transistor included in the first output circuit that outputs a clock signal, the sixth transistor is a transistor included in the control circuit that operates under the control of a clock signal, and the seventh transistor is a transistor included in the first input circuit that provides an input voltage to the third node.

Optionally, the display substrate includes a first power line and a second power line; the display substrate further includes a second output circuit; the first input circuit includes a seventh transistor; and the second input circuit includes an eighth transistor; the seventh transistor is a transistor that provides an input voltage to the third node, and the eighth transistor is a transistor that inputs the first voltage signal provided by the first power line to the second node under the control of the potential of the third node; the fourth transistor is a transistor included in the second output circuit that outputs a third voltage signal; an extension direction of the active layer of the seventh transistor is the same as or perpendicular to an extension direction of the active layer of the eighth transistor; in a same stage of driving circuit, a position of the first electrode of the seventh transistor in the second direction is lower than a position of the second electrode of the fourth transistor in the second direction.

Optionally, the display substrate includes a first power line, the display substrate further includes a second transfer electrode, and the second transfer electrode and the first power line are an integral structure; the second input circuit includes an eighth transistor; the first output circuit includes a third transistor; the eighth transistor is a transistor that inputs the first voltage signal provided by the first power line to the second node under control of the potential of the third node; the third transistor is a transistor included in the first output circuit that outputs a first voltage signal; the second transfer electrode includes a first electrode portion, a second electrode portion and a third electrode portion; the first electrode portion serves as a connection electrode between the first power line and the first electrode of the eighth transistor, and the second electrode portion is a connection electrode between the first electrode of the eighth transistor and the first electrode of the third transistor, the third electrode portion serves as the first electrode of the third transistor; an angle between the first electrode portion and the second electrode portion is greater than or equal to 90 degrees and less than or equal to 120 degrees.

Optionally, the display substrate further includes a third transfer electrode; the third transfer electrode includes a fourth electrode portion, a fifth electrode portion and a sixth electrode portion; the second input circuit includes a first transistor and an eighth transistor; the first transistor is a transistor that inputs the second voltage signal provided by the second power line to the second node under the control of the potential of the third node; the driving circuit also includes a second output circuit, the second output circuit includes a second transistor; the second transistor is a transistor that outputs the second voltage signal provided by the second power line to the second driving signal output terminal under the control of the potential of the third node; the eighth transistor is a transistor that inputs the first voltage signal provided by the first power line to the second node under the control of the potential of the third node; the control circuit includes a sixth transistor and a ninth transistor, the sixth transistor is a transistor that operates under the control of a clock signal; the ninth transistor is a transistor that controls the connection between the third node and the first node under the control of the second voltage signal provided by the second power line; the first transistor and the second transistor are first type of transistors, the eighth transistor and the ninth transistor are second type of transistors; the fourth electrode portion is configured to electrically connect a bottom gate electrode of the first transistor and the gate electrode of the eighth transistor; and/or, the fourth electrode portion is configured to electrically connect a bottom gate electrode of the second transistor and the gate electrode of the eighth transistor; the fifth electrode portion is configured to electrically connect the fourth electrode portion, the first electrode of the ninth transistor and a top gate electrode of the first transistor; and/or the fifth electrode portion is configured to electrically connect the fourth electrode portion, a first electrode of the ninth transistor, and a top gate electrode of the second transistor; the sixth electrode portion is configured to electrically connect the first electrode of the ninth transistor and the second electrode of the sixth transistor.

Optionally, an angle between the fourth electrode portion and the fifth electrode portion is greater than or equal to 90 degrees and less than 130 degrees.

Optionally, the fifth electrode portion is perpendicular or parallel to the sixth electrode portion.

Optionally, the first output circuit further includes a first capacitor, a first electrode plate of the first capacitor is electrically connected to the first node, and a second electrode plate of the first capacitor is electrically connected to the first driving signal output terminal; the display substrate also includes a first shielding portion; the first electrode plate of the first capacitor is arranged between the base substrate and the second electrode plate of the first capacitor; the first shielding portion is arranged on a side of the second electrode plate of the first capacitor away from the base substrate.

Optionally, the display substrate further includes a second shielding portion; wherein the second input circuit includes a first transistor; the second shielding portion is arranged on a side of the active layer of the first transistor away from the base substrate; an orthographic projection area of the second shielding portion on the power line is larger than an orthographic projection area of the active layer of the first transistor on the power line.

An embodiment of the present disclosure provides a display substrate, including a shift register arranged on a base substrate, wherein the shift register includes a plurality of stages of driving circuits, the driving circuit includes a first input circuit, a second input circuit, a first output circuit, a control circuit and a second output circuit; the first output circuit is configured to provide a first scanning driving signal to the first driving signal output terminal under the control of a potential of a first node and a potential of a second node; the first input circuit is configured to input a signal to the third node under the control of the clock signal; the second input circuit is configured to input a signal provided by the power line to the second node under the control of the potential of the third node; the control circuit is configured to control the potential of the third node and the potential of the first node; the second output circuit is configured to output a second scanning driving signal through a second driving signal output terminal under the control of the potential of the third node; the second input circuit includes a first transistor; the second output circuit includes a second transistor; the driving circuit is configured to provide a scanning driving signal for a display area; a gate electrode of the first transistor is electrically connected to the third node, a first electrode of the first transistor is electrically connected to the second power line, and a second electrode of the first transistor is electrically connected to the second node; a gate electrode of the second transistor is electrically connected to the third node, a first electrode of the second transistor is electrically connected to the second power line, a second electrode of the second transistor is electrically connected to the second driving signal output terminal; the first transistor and the second transistor are N-type transistors; a ratio of an area of an oxide active layer of the second transistor to an area of an oxide active layer of the first transistor is greater than or equal to 8.74.

Optionally, the fourth transistor is a transistor included in the second output circuit that outputs a third voltage signal; the fourth transistor is a P-type transistor; an active layer of the fourth transistor is a low-temperature polysilicon active layer; a ratio of the area of the oxide active layer of the second transistor to the area of the active layer of the fourth transistor is greater than or equal to 1.4.

Optionally, the power line includes a first power line and a third power line; the second input circuit is configured to input the first voltage signal provided by the first power line to the second node under the control of the potential of the third node; the second output circuit is electrically connected to the third power line, and is configured to provide the third voltage signal provided by the third power line to the second driving signal output terminal under the control of the potential of the third node; a voltage value of the third voltage signal is greater than or equal to a voltage value of the first voltage signal.

Optionally, the voltage value of the third voltage signal is greater than or equal to 1.4 times the voltage value of the first voltage signal.

Optionally, the gate electrode of the first transistor includes a first gate electrode and a second gate electrode, the gate electrode of the second transistor includes a first gate electrode and a second gate electrode, and the first gate electrode is a bottom gate electrode, the second gate electrode is a top gate electrode; the display substrate includes a first gate metal layer, a second gate metal layer and a third gate metal layer stacked along a side away from the base substrate; the bottom gate electrode is included in the first gate metal layer, and the top gate electrode is included in the second gate metal layer; or the bottom gate electrode is included in the second gate metal layer, and the top gate electrode is included in the third gate metal layer; or, the bottom gate electrode is included in the first gate metal layer, and the top gate electrode is included in the third gate metal layer.

Optionally, the first gate electrode of the first transistor and the first gate electrode of the second transistor have an integrated structure, and the second gate electrode of the first transistor and the second gate electrode of the second transistor have an integrated structure; the display substrate also includes a first source-drain metal layer and a second source-drain metal layer arranged on a side of the third gate metal layer away from the base substrate; the first source-drain metal layer is arranged between the third gate metal layer and the second source-drain metal layer; the first gate electrode of the first transistor and the second gate electrode of the first transistor are electrically connected to each other through a connection electrode, and the connection electrode is included in the first source-drain metal layer or the second source-drain metal layer.

An embodiment of the present disclosure provides a display substrate, comprising a shift register arranged on a base substrate, wherein the shift register includes a plurality of stages of driving circuits; the driving circuit includes a first input circuit, a second input circuit, a first output circuit and a control circuit; the first output circuit is configured to provide a first scanning driving signal to a first driving signal output terminal under the control of a potential of a first node and a potential of a second node; the first input circuit is configured to input a signal to a third node under the control of a clock signal; the second input circuit is configured to input a signal provided by a power line to the second node under the control of a potential of the third node; the control circuit is configured to control the potential of the third node and the potential of the first node.

Optionally, the power line includes a first power line and a second power line; the first input circuit is electrically connected to an input voltage terminal, a first clock signal line and the third node respectively, and is configured to write an input voltage provided by the input voltage terminal into the third node under the control of a first clock signal provided by a first clock signal line; the second input circuit is electrically connected to the third node, the second power line, the second node and the first power line respectively, and is configured to write the first voltage signal provided by the first power line into the second node under the control of the potential of the third node, and write the second voltage signal provided by the second power line into the second node; the first output circuit is electrically connected to the second node, the first node, the first power line, a second clock signal line and a first driving signal output terminal respectively, and is configured to output the first voltage signal provided by the first power line to the first driving signal output terminal under the control of the potential of the second node, and output the second clock signal provided by the second clock signal line to the first driving signal output terminal under the control of the potential of the first node; the control circuit is electrically connected to the second node, the first power line, the second clock signal line, the third node, the first node and the second power line respectively, and is configured to write the first voltage signal provided by the first power line into the third node under the control of the potential of the second node and the second clock signal provided by the second clock signal line, and control to connect the third node and the first node under the control of the second voltage signal provided by the second power line.

Optionally, the display substrate further includes a second output circuit; wherein the second output circuit is electrically connected to the third node, the second driving signal output terminal, the third power line and the second power line respectively, and is configured to output the third voltage signal provided by the third power line to the second driving signal output terminal under the control of the potential of the third node, and output the second voltage signal provided by the second power line to the second driving signal output terminal.

Optionally, the second output circuit is further electrically connected to the first control terminal, and the output terminal of the second output circuit is electrically connected to the second driving signal output terminal, the second output circuit is configured to control to output the third voltage signal to the second driving signal output terminal under the control of the first control signal provided by the first control terminal, and output the second voltage signal to the second driving signal output terminal under the control of the potential of the third node and the first control signal.

Optionally, the display substrate further includes a voltage stabilizing circuit; wherein the output terminal of the second output circuit is electrically connected to the second driving signal output terminal through the voltage stabilizing circuit; an input terminal of the voltage stabilizing circuit is electrically connected to the output terminal of the second output circuit, and an output terminal of the voltage stabilizing circuit is electrically connected to the second driving signal output terminal, the voltage stabilizing circuit is configured to stabilize the signal outputted by the second output circuit to obtain and output a second scanning driving signal through the second driving signal output terminal.

Optionally, the display substrate further includes a first energy storage circuit and a second energy storage circuit; wherein a first terminal of the first energy storage circuit is electrically connected to the output terminal of the second output circuit, and a second terminal of the first energy storage circuit is electrically connected to the second driving signal output terminal; a first terminal of the second energy storage circuit is electrically connected to the output terminal of the second output circuit, and a second terminal of the second energy storage circuit is electrically connected to the second driving signal output terminal; the first energy storage circuit and the second energy storage circuit are used to store electrical energy.

Optionally, the first input circuit includes a seventh transistor; the second input circuit includes a first transistor and an eighth transistor; the first output circuit includes a third transistor, a fifth transistor and a first capacitor; the control circuit includes a sixth transistor, a ninth transistor and a tenth transistor; a gate electrode of the first transistor is electrically connected to the third node, a first electrode of the first transistor is electrically connected to the second power line, and a second electrode of the first transistor is electrically connected to the second node; a gate electrode of the eighth transistor is electrically connected to the third node, a first electrode of the eighth transistor is electrically connected to the first power line, and a second electrode of the eighth transistor is electrically connected to the second node; a gate electrode of the seventh transistor is electrically connected to the first clock signal line, a first electrode of the seventh transistor is electrically connected to the input voltage terminal, and a second electrode of the seventh transistor is electrically connected to the third node; a gate electrode of the third transistor is electrically connected to the second node, a first electrode of the third transistor is electrically connected to the first power line, and a second electrode of the third transistor is electrically connected to the first driving signal output terminal; a gate electrode of the fifth transistor is electrically connected to the first node, a first electrode of the fifth transistor is electrically connected to the first driving signal output terminal, and a second electrode of the fifth transistor is electrically connected to the second clock signal line; a first electrode plate of the first capacitor is electrically connected to the first node, and a second electrode plate of the first capacitor is electrically connected to the first driving signal output terminal; a gate electrode of the sixth transistor is electrically connected to the second clock signal line, a first electrode of the sixth transistor is electrically connected to a second electrode of the tenth transistor, and a second electrode of the sixth transistor is electrically connected to the third node; a gate electrode of the tenth transistor is electrically connected to the second node, and a first electrode of the tenth transistor is electrically connected to the first power line; a gate electrode of the ninth transistor is electrically connected to the second power line, a first electrode of the ninth transistor is electrically connected to the third node, and a second electrode of the ninth transistor is electrically connected to the first node.

Optionally, the second output circuit includes a second transistor and a fourth transistor; a gate electrode of the second transistor is electrically connected to the third node, and a first electrode of the second transistor is electrically connected to the second power line, and a second electrode of the second transistor is electrically connected to the second driving signal output terminal; a gate electrode of the fourth transistor is electrically connected to the third node, a first electrode of the fourth transistor is electrically connected to the third power line, and a second electrode of the fourth transistor is electrically connected to the second driving signal output terminal.

Optionally, the second output circuit includes a second transistor, a fourth transistor, an eleventh transistor, and a twelfth transistor; a gate electrode of the second transistor is electrically connected to the third node, a first electrode of the second transistor is electrically connected to a second electrode of the twelfth transistor, and a second electrode of the second transistor is electrically connected to the second driving signal output terminal; a gate electrode of the fourth transistor is electrically connected to the third node, a first electrode of the fourth transistor is electrically connected to the third power line, and a second electrode of the fourth transistor is electrically connected to the second driving signal output terminal; a gate electrode of the eleventh transistor is electrically connected to the first control terminal, a first electrode of the eleventh transistor is electrically connected to the third power line, and a second electrode of the eleventh transistor is electrically connected to the second driving signal output terminal; a gate electrode of the twelfth transistor is electrically connected to the first control terminal, and a first electrode of the twelfth transistor is electrically connected to the second power line.

Optionally, the voltage stabilizing circuit includes a thirteenth transistor and a fourteenth transistor; a gate electrode of the thirteenth transistor is electrically connected to the output terminal of the second output circuit, a first electrode of the thirteenth transistor is electrically connected to the second power line, and a second electrode of the thirteenth transistor electrically connected to the second driving signal output terminal; a gate electrode of the fourteenth transistor is electrically connected to the output terminal of the second output circuit, a first electrode of the fourteenth transistor is electrically connected to the third power line, and a second electrode of the fourteenth transistor is electrically connected to the second driving signal output terminal.

Optionally, the first energy storage circuit includes a second capacitor, the second energy storage circuit includes a third capacitor; a first terminal of the second capacitor is electrically connected to the output terminal of the second output circuit, a second terminal of the second capacitor is electrically connected to the second driving signal output terminal; a first terminal of the third capacitor is electrically connected to the output terminal of the second output circuit, and a second terminal of the third capacitor is electrically connected to the second driving signal output terminal.

An embodiment of the present disclosure provides a display device, including the display substrate.

Optionally, the display device further includes a timing controller, a scanning driver and a data driver; wherein the timing controller is electrically connected to the scanning driver and the data driver respectively, and is configured to provide corresponding control signals to the scanning driver and the data driver respectively; the scanning driver is electrically connected to a plurality of rows of scanning lines, and is configured to provide corresponding scanning signals to the plurality of rows of scanning lines; the data driver is electrically connected to a plurality of columns of data lines, and is configured to provide corresponding data signals to the plurality of columns of data lines.

DETAILED DESCRIPTION

Figure 1:
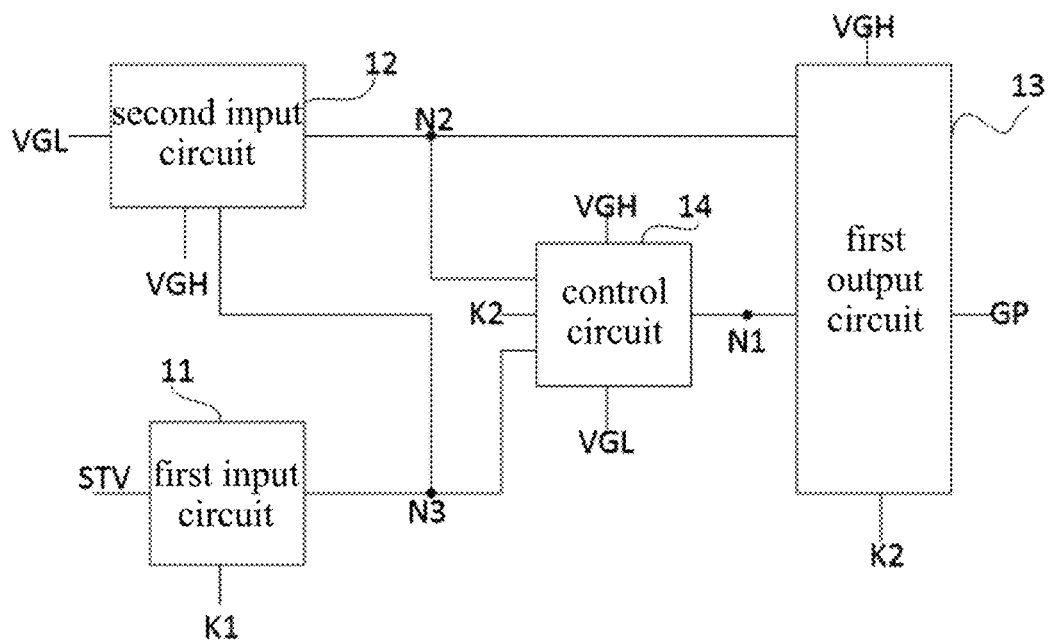
FIG. 1 is a structural diagram of a driving circuit included in a display substrate according to at least one embodiment of the present disclosure.

The following will clearly and completely describe the technical solutions in the embodiments of the present disclosure with reference to the accompanying drawings. Obviously, the embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

The display substrate according to the embodiment of the present disclosure includes a shift register arranged on a base substrate, and the shift register includes a plurality of stages of driving circuits;

The driving circuit includes a first input circuit, a second input circuit, a first output circuit and a control circuit;

The first output circuit is configured to provide a first scanning driving signal to a first driving signal output terminal under the control of a potential of a first node and a potential of a second node;

The first input circuit is configured to input a signal to a third node under the control of a clock signal;

The second input circuit is configured to input a signal provided by a power line to the second node under the control of a potential of the third node;

The control circuit is configured to control the potential of the third node.

In at least one embodiment of the present disclosure, the power line includes a first power line and a second power line;

The first input circuit is electrically connected to an input voltage terminal, a first clock signal line and the third node respectively, and is configured to write an input voltage provided by the input voltage terminal into the third node under the control of a first clock signal provided by a first clock signal line.

The second input circuit is electrically connected to the third node, the second power line, the second node and the first power line respectively, and is configured to write the first voltage signal provided by the first power line into the second node under the control of the potential of the third node, and write the second voltage signal provided by the second power line into the second node;

The first output circuit is electrically connected to the second node, the first node, the first power line, a second clock signal line and a first driving signal output terminal respectively, and is configured to output the first voltage signal provided by the first power line to the first driving signal output terminal under the control of the potential of the second node, and output the second clock signal provided by the second clock signal line to the first driving signal output terminal under the control of the potential of the first node;

The control circuit is electrically connected to the second node, the first power line, the second clock signal line, the third node, the first node and the second power line respectively, and is configured to write the first voltage signal provided by the first power line into the third node under the control of the potential of the second node and the second clock signal provided by the second clock signal line, and control to connect the third node and the first node under the control of the second voltage signal provided by the second power line.

When the driving circuit according to at least one embodiment of the present disclosure is working, the first input circuit controls to write the input voltage into the third node under the control of the first clock signal, and the second input circuit controls the potential of the second node under the control of the potential of the third node, the control circuit controls to connect the third node and the first power line under the control of the potential of the second node and the second clock signal, and control to connect the third node and the first node under the control of the second voltage signal, and the first output circuit controls the first driving signal output terminal to output the first scanning driving signal under the control of the potential of the first node and the potential of the second node.

As shown in FIG. 1, in at least one embodiment of the present disclosure, the driving circuit includes a first input circuit 11, a second input circuit 12, a first output circuit 13 and a control circuit 14;

The first input circuit 11 is electrically connected to the input voltage terminal STV, the first clock signal line K1 and the third node N3 respectively, and is configured to write the input voltage provided by the input voltage terminal STV into the third node N3 under the control of the first clock signal provided by the first clock signal line K1;

The second input circuit 12 is electrically connected to the third node N3, the second power line VGL, the second node N2 and the first power line VGH respectively, and is configured to control to write the first voltage signal provided by the first power line VGH into the second node N2 under the control of the potential of the third node N3, and write the second voltage signal provided by the second power line VGL into the second node N2;

The first output circuit 13 is electrically connected to the second node N2, the first node N1, the first power line VGH, the second clock signal line K2 and the first driving signal output terminal GP respectively, and is configured to output the first voltage signal provided by the first power line VGH to the first driving signal output terminal GP under the control of the potential of the second node N2, and output the second clock signal provided by the second clock signal line K2 to the first driving signal output terminal GP under the control of the potential of the first node N1;

The control circuit 14 is connected to the second node N2, the first power line VGH, the second clock signal line K2, the third node N3, the first node N1 and the second power line VGL respectively, is configured to control to write the first voltage signal provided by the first power line VGH into the third node N3 under the control of the potential of the second node N2 and the second clock signal provided by the second clock signal line K2, and control to connect the third node N3 and the first node N1 under the control of the second voltage signal provided by the second power line VGL.

In at least one embodiment of the present disclosure, the first voltage signal may be a first high voltage signal, and the second voltage signal may be a low voltage signal, but is not limited thereto.

Figure 2:
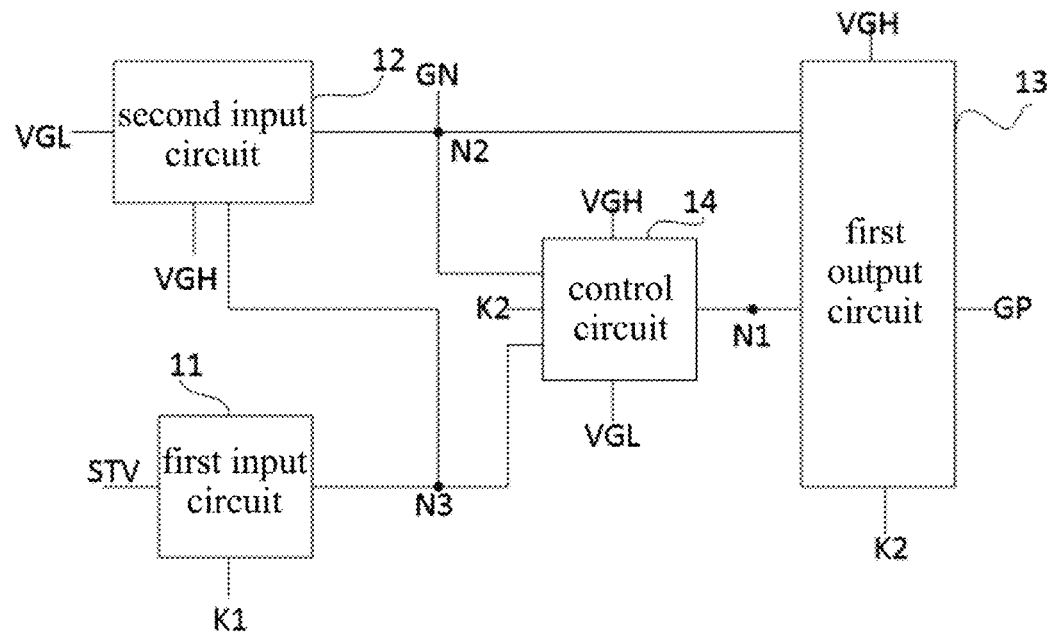
FIG. 2 is a structural diagram of the driving circuit according to at least one embodiment of the present disclosure.

In at least one embodiment of the driving circuit shown in FIG. 2, the second node N2 may also be a second driving signal output terminal GN, and the second driving signal output terminal GN may be used to provide an N-type scanning driving signal, the first driving signal output terminal can be used to provide a P-type scanning driving signal.

In at least one embodiment of the present disclosure, the N-type scanning driving signal is a scanning driving signal used to turn on an N-type transistor, and the P-type scanning driving signal is a scanning driving signal used to turn on a P-type transistor.

In at least one embodiment of the present disclosure, the driving circuit can output two scanning driving signals simultaneously.

Figure 3:
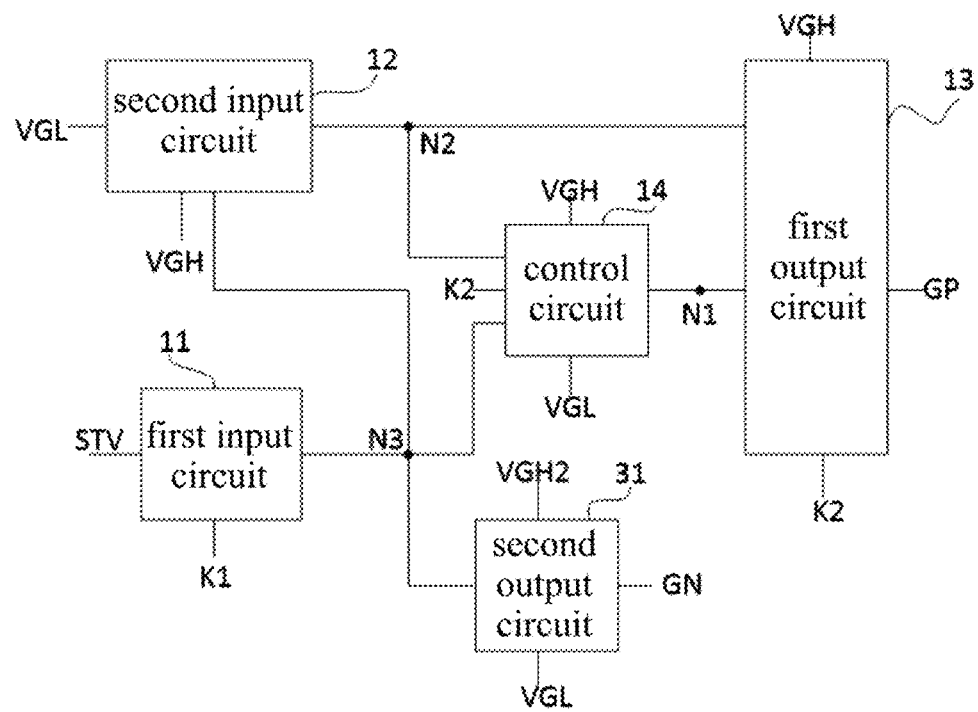
FIG. 3 is a structural diagram of the driving circuit according to at least one embodiment of the present disclosure.

As shown in FIG. 3, based on at least one embodiment of the driving circuit shown in FIG. 1, at least one embodiment of the driving circuit further includes a second output circuit 31;

The second output circuit 31 is electrically connected to the third node N3, the second driving signal output terminal GN, the third power line VGH2 and the second power line VGL respectively, and is configured to output the third voltage signal provided by the third power line VGH2 to the second driving signal output terminal GN under the control of the potential of the third node N3, and output the second voltage signal provided by the second power line VGL to the second driving signal output terminal GN.

In at least one embodiment of the present disclosure, the third voltage signal may be a second high voltage signal.

When at least one embodiment of the driving circuit shown in FIG. 3 is working, the P-type scanning driving signal can be provided through the first driving signal output terminal GP, and the N-type scanning driving signal can be provided through the second driving signal output terminal GN.

In at least one embodiment of the present disclosure, the second output circuit may also be electrically connected to the first control terminal, and the output terminal of the second output circuit is electrically connected to the second driving signal output terminal, the second output circuit is configured to control to output the third voltage signal to the second driving signal output terminal under the control of the first control signal provided by the first control terminal, and output the second voltage signal to the second driving signal output terminal under the control of the potential of the third node and the first control signal.

In specific implementation, the first control terminal can be electrically connected to the first driving signal output terminal of the adjacent previous stage of driving circuit, and the second output circuit can control to connect the second driving signal output terminal of the current stage of driving circuit and the third power line when the adjacent previous stage of driving circuit outputs an effective first scanning driving signal, and control to disconnect the second driving signal output terminal of the current stage of driving circuit from the second power line.

Figure 4:
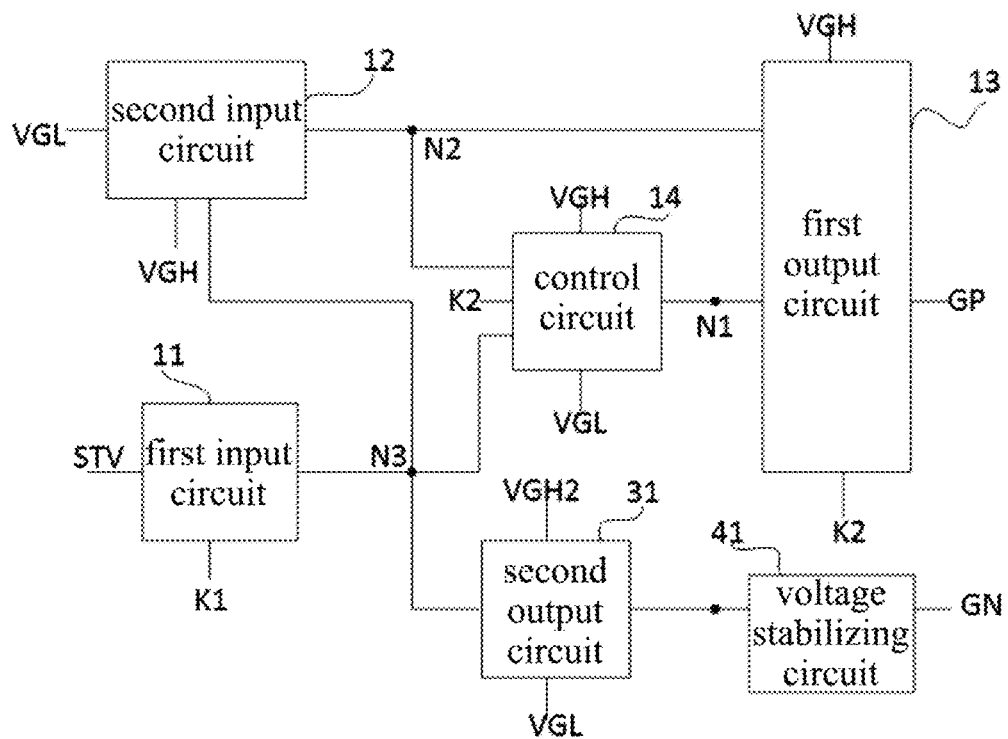
FIG. 4 is a structural diagram of the driving circuit according to at least one embodiment of the present disclosure.

As shown in FIG. 4, based on at least one embodiment of the driving circuit shown in FIG. 3, at least one embodiment of the driving circuit further includes a voltage stabilizing circuit 41;

The output terminal of the second output circuit 31 is electrically connected to the second driving signal output terminal GN through the voltage stabilizing circuit 41;

The input terminal of the voltage stabilizing circuit 41 is electrically connected to the output terminal of the second output circuit 31, and the output terminal of the voltage stabilizing circuit 41 is electrically connected to the second driving signal output terminal GN. The voltage stabilizing circuit 41 is used to stabilize the signal outputted by the second output circuit 31 to obtain and output a second scanning driving signal through the second driving signal output terminal GN.

When at least one embodiment of the driving circuit shown in FIG. 4 is operating, the voltage stabilizing circuit 41 stabilizes the voltage of the signal outputted by the second output circuit 31 to obtain a second scanning driving signal.

Figure 5:
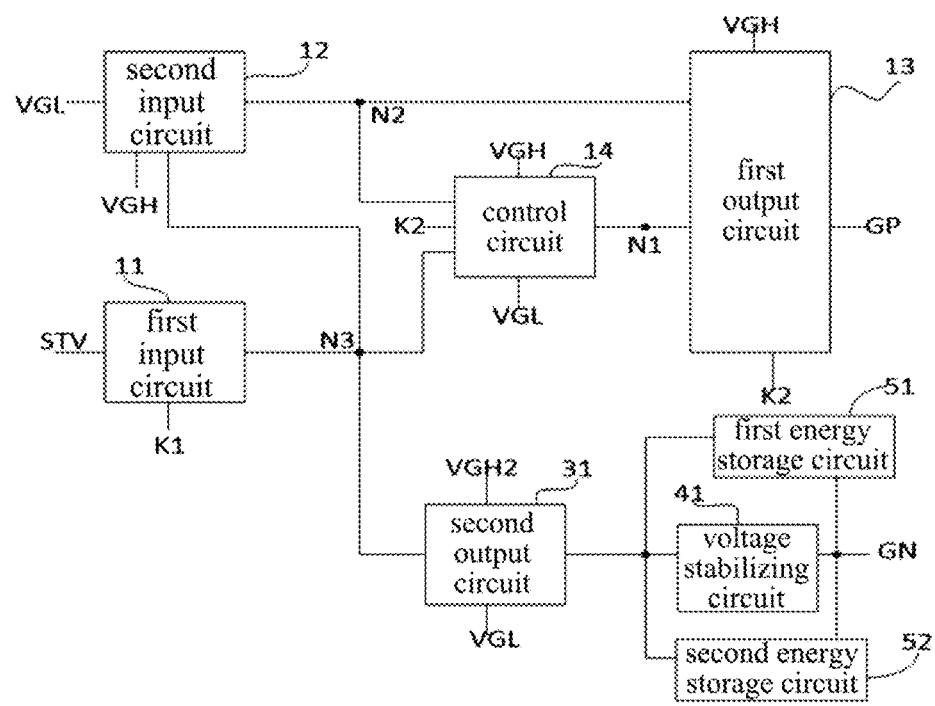
FIG. 5 is a structural diagram of the driving circuit according to at least one embodiment of the present disclosure.

As shown in FIG. 5, based on at least one embodiment of the driving circuit shown in FIG. 4, at least one embodiment of the driving circuit further includes a first energy storage circuit 51 and a second energy storage circuit 52;

The first terminal of the first energy storage circuit 51 is electrically connected to the output terminal of the second output circuit 31, and the second terminal of the first energy storage circuit 51 is electrically connected to the second driving signal output terminal GN;

The first terminal of the second energy storage circuit 52 is electrically connected to the output terminal of the second output circuit 31, and the second terminal of the second energy storage circuit 52 is electrically connected to the second driving signal output terminal GN;

The first energy storage circuit 51 and the second energy storage circuit 52 are used to store electrical energy.

Optionally, the first input circuit includes a seventh transistor; the second input circuit includes a first transistor and an eighth transistor; the first output circuit includes a third transistor, a fifth transistor and a first capacitor; the control circuit includes a sixth transistor, a ninth transistor and a tenth transistor;

a gate electrode of the first transistor is electrically connected to the third node, a first electrode of the first transistor is electrically connected to the second power line, and a second electrode of the first transistor is electrically connected to the second node;

a gate electrode of the eighth transistor is electrically connected to the third node, a first electrode of the eighth transistor is electrically connected to the first power line, and a second electrode of the eighth transistor is electrically connected to the second node;

a gate electrode of the seventh transistor is electrically connected to the first clock signal line, a first electrode of the seventh transistor is electrically connected to the input voltage terminal, and a second electrode of the seventh transistor is electrically connected to the third node;

a gate electrode of the third transistor is electrically connected to the second node, a first electrode of the third transistor is electrically connected to the first power line, and a second electrode of the third transistor is electrically connected to the first driving signal output terminal;

a gate electrode of the fifth transistor is electrically connected to the first node, a first electrode of the fifth transistor is electrically connected to the first driving signal output terminal, and a second electrode of the fifth transistor is electrically connected to the second clock signal line;

a first electrode plate of the first capacitor is electrically connected to the first node, and a second electrode plate of the first capacitor is electrically connected to the first driving signal output terminal;

a gate electrode of the sixth transistor is electrically connected to the second clock signal line, a first electrode of the sixth transistor is electrically connected to a second electrode of the tenth transistor, and a second electrode of the sixth transistor electrically connected to the third node;

a gate electrode of the tenth transistor is electrically connected to the second node, and a first electrode of the tenth transistor is electrically connected to the first power line;

a gate electrode of the ninth transistor is electrically connected to the second power line, a first electrode of the ninth transistor is electrically connected to the third node, and a second electrode of the ninth transistor is electrically connected to the first node.

Optionally, the second output circuit includes a second transistor and a fourth transistor; a gate electrode of the second transistor is electrically connected to the third node, and a first electrode of the second transistor is electrically connected to the second power line, and a second electrode of the second transistor is electrically connected to the second driving signal output terminal;

a gate electrode of the fourth transistor is electrically connected to the third node, a first electrode of the fourth transistor is electrically connected to the third power line, and a second electrode of the fourth transistor is electrically connected to the second driving signal output terminal.

Optionally, the second output circuit includes a second transistor, a fourth transistor, an eleventh transistor and a twelfth transistor;

a gate electrode of the second transistor is electrically connected to the third node, a first electrode of the second transistor is electrically connected to a second electrode of the twelfth transistor, and a second electrode of the second transistor is electrically connected to the second driving signal output terminal;

a gate electrode of the fourth transistor is electrically connected to the third node, a first electrode of the fourth transistor is electrically connected to the third power line, and a second electrode of the fourth transistor is electrically connected to the second driving signal output terminal; a gate electrode of the eleventh transistor is electrically connected to the first control terminal, a first electrode of the eleventh transistor is electrically connected to the third power line, and a second electrode of the eleventh transistor is electrically connected to the second driving signal output terminal;

a gate electrode of the twelfth transistor is electrically connected to the first control terminal, and a first electrode of the twelfth transistor is electrically connected to the second power line.

Optionally, the voltage stabilizing circuit includes a thirteenth transistor and a fourteenth transistor;

a gate electrode of the thirteenth transistor is electrically connected to the output terminal of the second output circuit, a first electrode of the thirteenth transistor is electrically connected to the second power line, and a second electrode of the thirteenth transistor electrically connected to the second driving signal output terminal;

a gate electrode of the fourteenth transistor is electrically connected to the output terminal of the second output circuit, a first electrode of the fourteenth transistor is electrically connected to the third power line, and a second electrode of the fourteenth transistor is electrically connected to the second driving signal output terminal.

Optionally, the first energy storage circuit includes a second capacitor, the second energy storage circuit includes a third capacitor; a first terminal of the second capacitor is electrically connected to the output terminal of the second output circuit, a second terminal of the second capacitor is electrically connected to the second driving signal output terminal;

a first terminal of the third capacitor is electrically connected to the output terminal of the second output circuit, and a second terminal of the third capacitor is electrically connected to the second driving signal output terminal.

Figure 6:
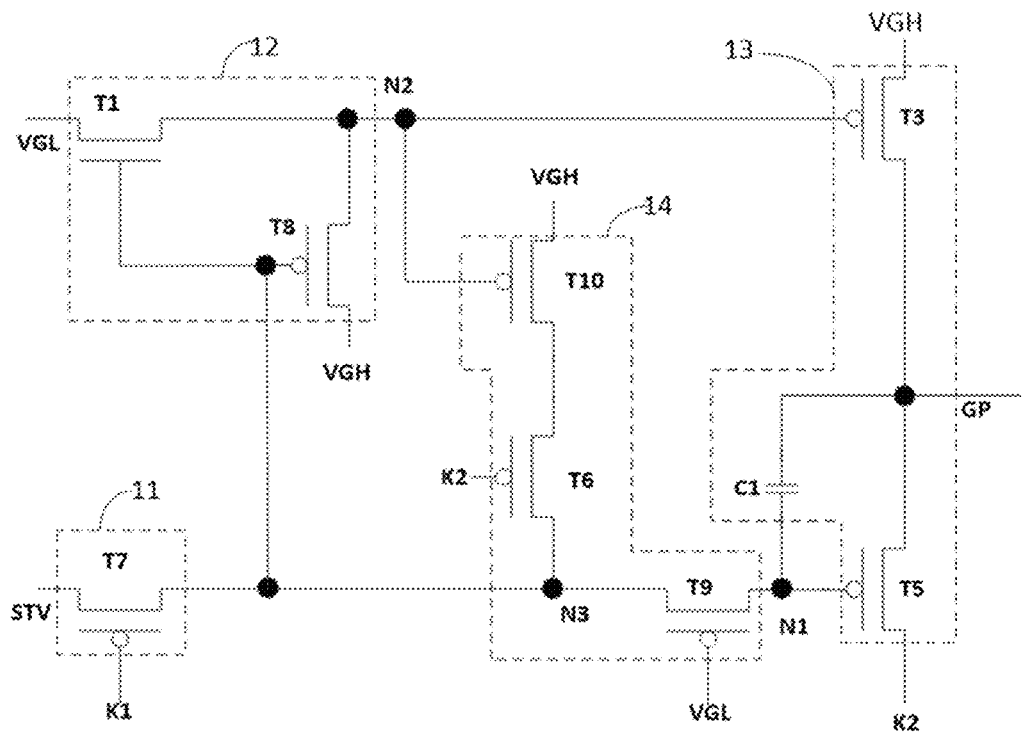
FIG. 6 is a circuit diagram of the driving circuit according to at least one embodiment of the present disclosure.

As shown in FIG. 6, in at least one embodiment of the driving circuit shown in FIG. 1, the first input circuit 11 includes a seventh transistor T7; the second input circuit 12 includes a first transistor T1 and an eighth transistor T8; the first output circuit 13 includes a third transistor T3, a fifth transistor T5 and a first capacitor C1; the control circuit 14 includes a sixth transistor T6, a ninth transistor T9 and a tenth transistor T10;

The gate electrode of the first transistor T1 is electrically connected to the third node N3, the source electrode of the first transistor T1 is electrically connected to the second power line VGL, and the drain electrode of the first transistor T1 is electrically connected to the second node N2;

The gate electrode of the eighth transistor T8 is electrically connected to the third node N3, the source electrode of the eighth transistor T8 is electrically connected to the first power line VGH, and the drain electrode of the eighth transistor T8 is electrically connected to the second node N2;

The gate electrode of the seventh transistor T7 is electrically connected to the first clock signal line K1, the source electrode of the seventh transistor T7 is electrically connected to the input voltage terminal STV, and the drain electrode of the seventh transistor T7 is electrically connected to the third node N3;

The gate electrode of the third transistor T3 is electrically connected to the second node N2, the source electrode of the third transistor T3 is electrically connected to the first power line VGH, and the drain electrode of the third transistor T3 is electrically connected to the first driving signal output terminal GP;

The gate electrode of the fifth transistor T5 is electrically connected to the first node N1, the source electrode of the fifth transistor T5 is electrically connected to the first driving signal output terminal GP, and the drain electrode of the fifth transistor T5 is electrically connected to the second clock signal line K2;

The first electrode plate of the first capacitor C1 is electrically connected to the first node N1, and the second electrode plate of the first capacitor C1 is electrically connected to the first driving signal output terminal GP;

The gate electrode of the sixth transistor T6 is electrically connected to the second clock signal line K2, and the source electrode of the sixth transistor T6 is electrically connected to the drain electrode of the tenth transistor T10, the drain electrode of the sixth transistor T6 is electrically connected to the third node N3;

The gate electrode of the tenth transistor T10 is electrically connected to the second node N2, and the source electrode of the tenth transistor T10 is electrically connected to the first power line VGH;

The gate electrode of the ninth transistor T9 is electrically connected to the second power line VGL, the source electrode of the ninth transistor T9 is electrically connected to the third node N3, and the drain electrode of the ninth transistor T9 is electrically connected to the first node N1.

In at least one embodiment of the driving circuit shown in FIG. 6, T1 is an N-type transistor, and transistors other than T1 are P-type transistors.

In at least one embodiment of the present disclosure, in order to keep the potential of the second node more stably at a low potential that enables T3 to turn on, T1 can be set as an N-type transistor.

Figure 7:
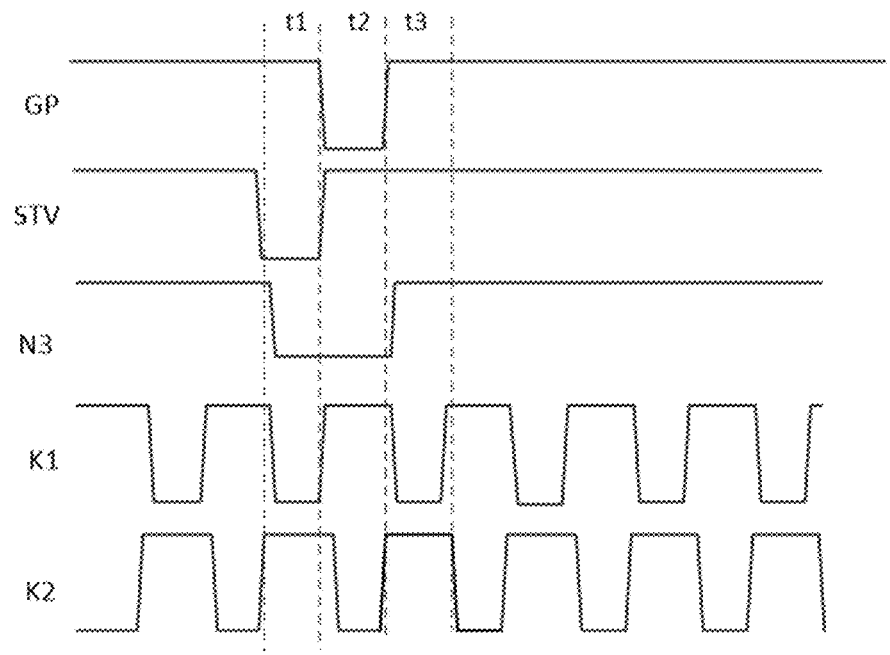
FIG. 7 is a working timing diagram of the driving circuit shown in FIG. 6 according to at least one embodiment of the present disclosure.

As shown in FIG. 7, when at least one embodiment of the driving circuit shown in FIG. 6 of the present disclosure is working, the driving period includes an input phase t1, an output phase t2 and a reset phase t3 that are set successively;

In the input phase t1, K1 provides a low voltage signal, K2 provides a high voltage signal, STV provides a low voltage signal, T7 is turned on to change the potential of N3 to a low voltage, T8 is turned on to pull up the potential of N2, T3 is turned off; T9 is turned on, the potential of N1 is a low voltage signal, T5 is turned on, GP outputs a high voltage signal;

In the output phase t2, K1 provides a high voltage signal, K2 provides a low voltage signal, STV provides a high voltage signal, T7 is turned off, the potential of N2 is maintained at a high voltage, T10 is turned off, T6 is turned on, and the potential of N3 is maintained at a low voltage. T5 is turned on, T3 is turned off, and GP outputs a low voltage signal;

In the reset phase t3, K1 provides a low voltage signal, K2 provides a high voltage signal, STV provides a high voltage signal, T7 is turned on to make the potential of N3 a high voltage, T1 is turned on to pull down the potential of N2, and T10 is turned on, T6 is turned off, T9 is turned on, the potential of N1 is a high voltage, T3 is turned on, T5 is turned off, and GP outputs a high voltage signal.

Figure 8:
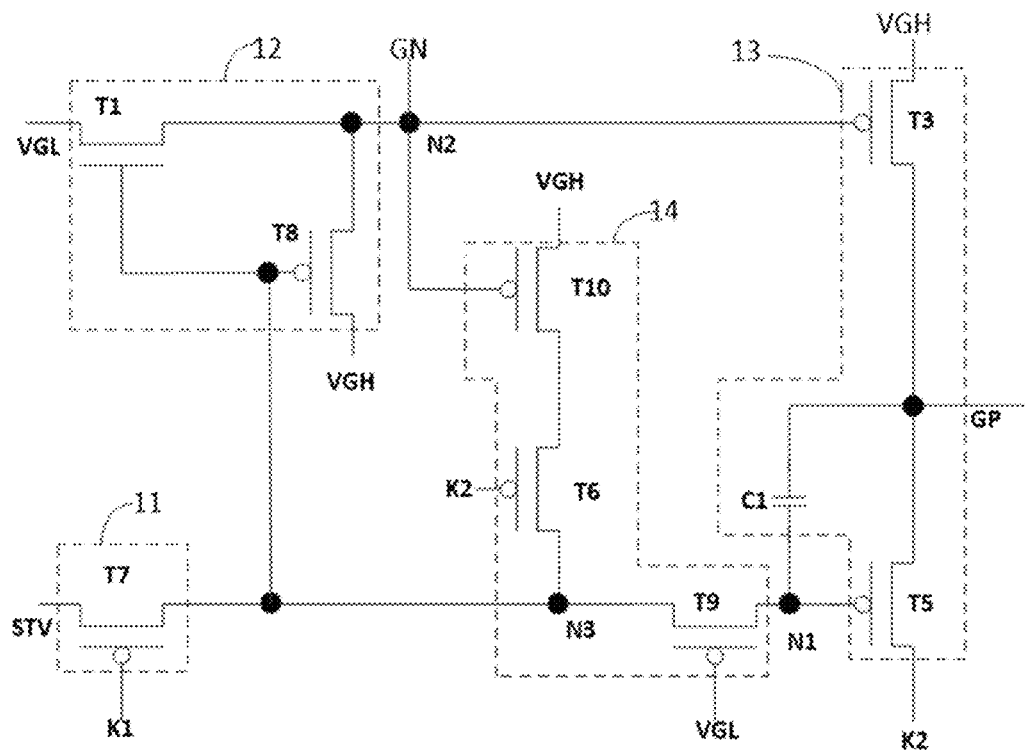
FIG. 8 is a circuit diagram of the driving circuit according to at least one embodiment of the present disclosure.

The difference between at least one embodiment of the driving circuit shown in FIG. 8 and at least one embodiment of the driving circuit shown in FIG. 6 is as follows: the second node N2 is set as the second driving signal output terminal GN, and the second driving signal output terminal GN is used to output the N-type scanning driving signal.

The differences between at least one embodiment of the driving circuit shown in FIG. 9 and at least one embodiment of the driving circuit shown in FIG. 6 are as follows: the driving circuit further includes a second output circuit 31;

The second output circuit 31 includes a second transistor T2 and a fourth transistor T4;

The gate electrode of the second transistor T2 is electrically connected to the third node N3, the source electrode of the second transistor T2 is electrically connected to the second power line VGL, and the drain electrode of the second transistor T2 is electrically connected to the second driving signal output terminal GN;

The gate electrode of the fourth transistor T4 is electrically connected to the third node N3, the source electrode of the fourth transistor T4 is electrically connected to the third power line VGH2, and the drain electrode of the fourth transistor T4 is electrically connected to the second driving signal output terminal GN.

Figure 9:
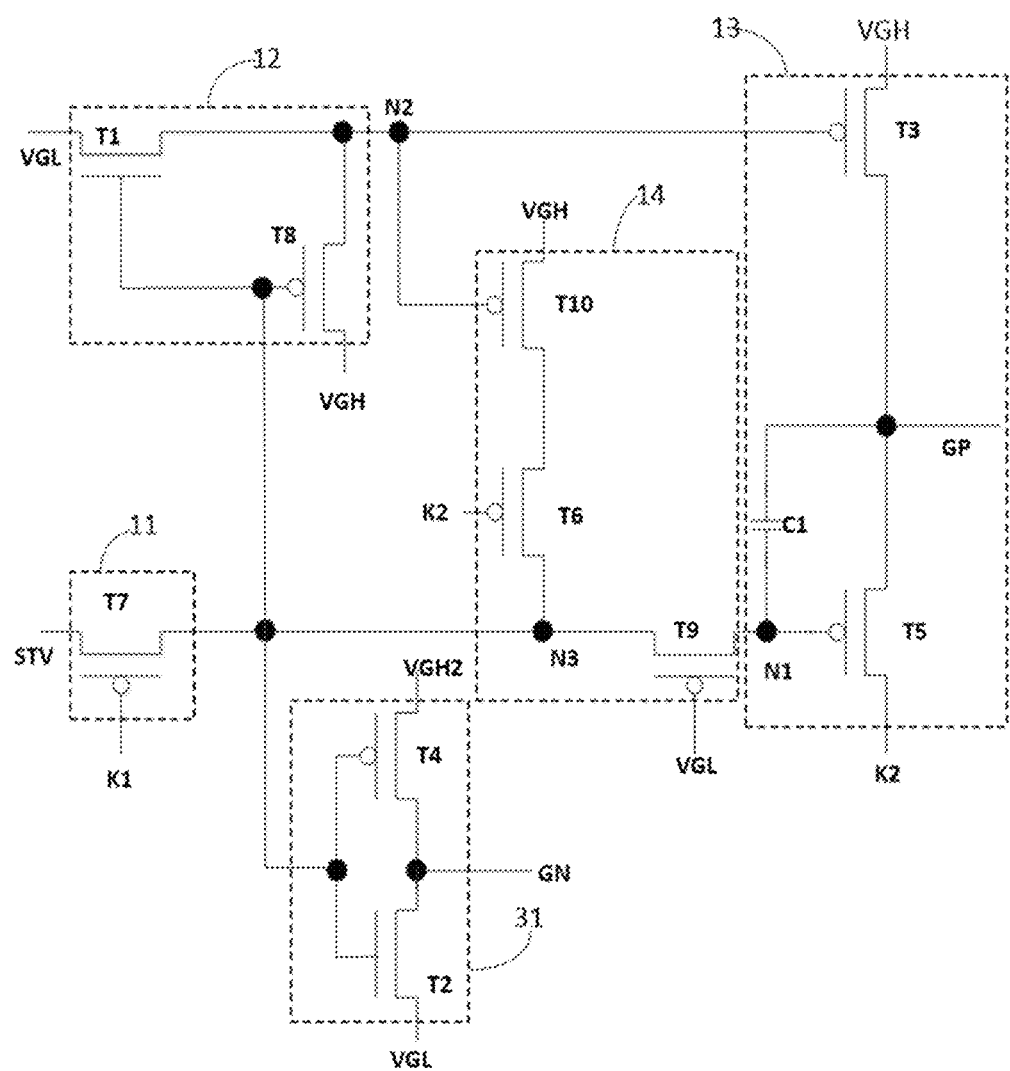
FIG. 9 is a circuit diagram of the driving circuit according to at least one embodiment of the present disclosure.

In at least one embodiment of the driving circuit shown in FIGS. 9, T1 and T2 are N-type transistors, and other transistors are P-type transistors, but are not limited to this.

Figure 10:
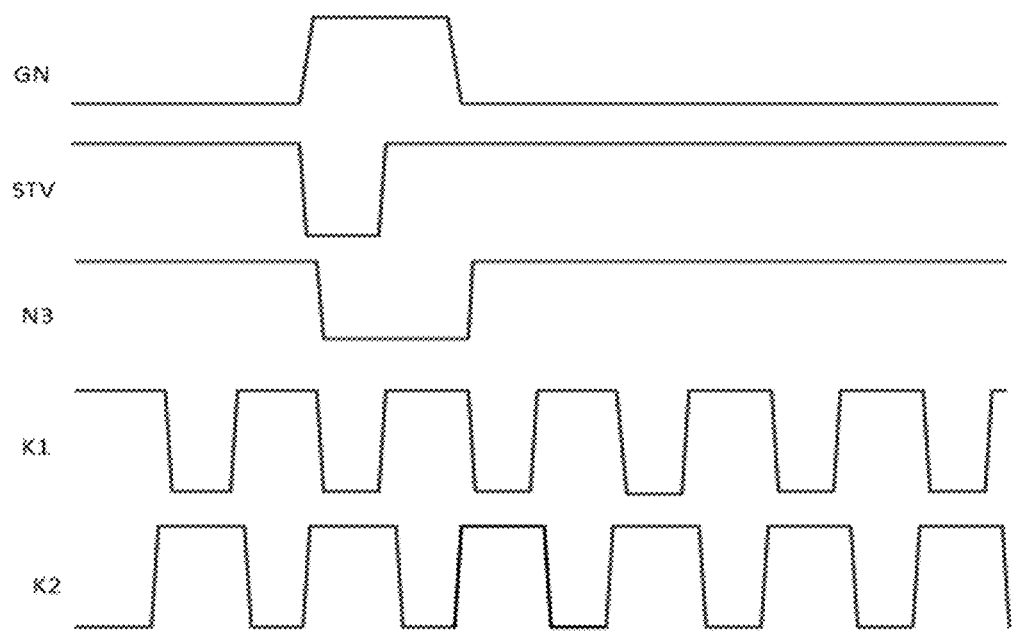
FIG. 10 is a working timing diagram of the driving circuit shown in FIG. 9 according to at least one embodiment of the present disclosure.

FIG. 10 is a working timing diagram of the driving circuit shown in FIG. 9.

Figure 11:
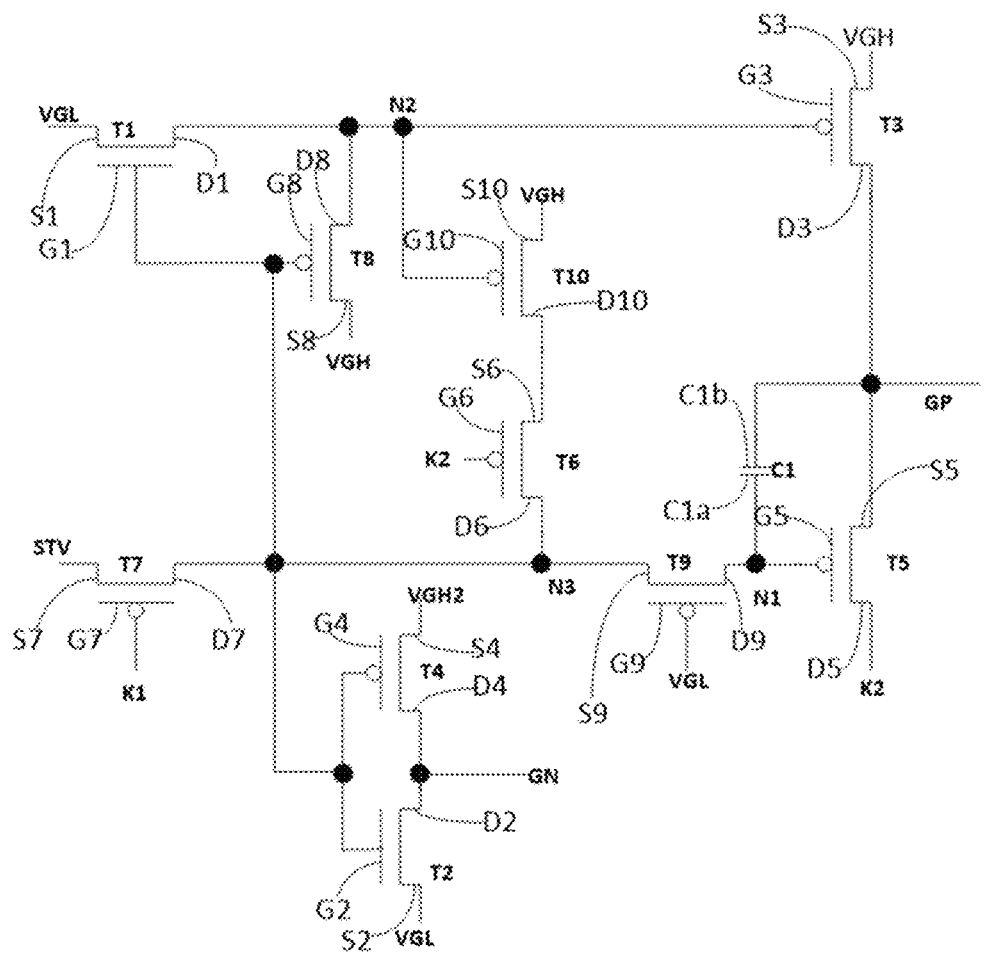
FIG. 11 is a circuit diagram of the driving circuit according to at least one embodiment of the present disclosure.

As shown in FIG. 11, in at least one embodiment of the driving circuit shown in FIG. 3, the first input circuit includes a seventh transistor T7; the second input circuit includes a first transistor T1 and an eighth transistor T8; the first output circuit includes a third transistor T3, a fifth transistor T5, and a first capacitor C1; the control circuit includes a sixth transistor T6, a ninth transistor T9, and a tenth transistor T10;

The gate electrode G1 of the first transistor T1 is electrically connected to the third node N3, the first electrode S1 of the first transistor T1 is electrically connected to the second power line VGL, and the second electrode D1 of the first transistor T1 is electrically connected to the second node N2;

The gate electrode G8 of the eighth transistor T8 is electrically connected to the third node N3. The first electrode S8 of the eighth transistor T8 is electrically connected to the first power line VGH. The second electrode D8 of the eighth transistor T8 is electrically connected to the second node N2;

The gate electrode G7 of the seventh transistor T7 is electrically connected to the first clock signal line K1, the first electrode S7 of the seventh transistor T7 is electrically connected to the input voltage terminal STV, and the second electrode D7 of the seventh transistor T7 is electrically connected to the third node N3;

The gate electrode G3 of the third transistor T3 is electrically connected to the second node N2, the first electrode S3 of the third transistor T3 is electrically connected to the first power line VGH, and the second electrode D3 of the third transistor T3 is electrically connected to the first driving signal output terminal GP;

The gate electrode G5 of the fifth transistor T5 is electrically connected to the first node N1, and the first electrode S5 of the fifth transistor T5 is electrically connected to the first driving signal output terminal GP. The second electrode D5 of the fifth transistor T5 is electrically connected to the second clock signal line K2;

The first electrode plate C1a of the first capacitor C1 is electrically connected to the first node N1, and the second electrode plate C1b of the first capacitor C1 is electrically connected to the first driving signal output terminal GP;

The gate electrode G6 of the sixth transistor T6 is electrically connected to the second clock signal line K2, and the first electrode S6 of the sixth transistor T6 is electrically connected to the second electrode D10 of the tenth transistor T10. The second electrode D6 of the sixth transistor T6 is electrically connected to the third node N3;

The gate electrode G10 of the tenth transistor T10 is electrically connected to the second node N2, and the first electrode S10 of the tenth transistor T10 is electrically connected to the first power line VGH;

The gate electrode G9 of the ninth transistor T9 is electrically connected to the second power line VGL, the first electrode S9 of the ninth transistor T9 is electrically connected to the third node N3, and the second electrode D9 of the ninth transistor T9 is electrically connected to the first node N1;

The second output circuit includes a second transistor T2 and a fourth transistor T4;

The gate electrode G2 of the second transistor T2 is electrically connected to the third node N3. The first electrode S2 of the second transistor T2 is electrically connected to the second power line VGL. The second electrode D2 of the second transistor T2 is electrically connected to the second driving signal output terminal GN;

The gate electrode G4 of the fourth transistor T4 is electrically connected to the third node N3. The first electrode S4 of the fourth transistor T4 is electrically connected to the third power line VGH2. The second electrode D4 of the fourth transistor T4 is electrically connected to the second driving signal output terminal GN.

In at least one embodiment of the driving circuit shown in FIGS. 11, T1 and T2 are N-type transistors, and other transistors are P-type transistors, but are not limited to this.

The difference between at least one embodiment of the driving circuit shown in FIG. 12 and at least one embodiment of the driving circuit shown in FIG. 9 is as follows: the second output circuit 31 includes a second transistor T2, a fourth transistor T4, an eleventh transistor T11 and a twelfth transistor T12;

The gate electrode of the second transistor T2 is electrically connected to the third node N3, the source electrode of the second transistor T2 is electrically connected to the drain electrode of the twelfth transistor T12, and the drain electrode of the second transistor T2 is electrically connected to the second driving signal output terminal GN;

The gate electrode of the fourth transistor T4 is electrically connected to the third node N3, the source electrode of the fourth transistor T4 is electrically connected to the third power line VGH2, and the drain electrode of the fourth transistor T4 is electrically connected to the second driving signal output terminal GN;

The gate electrode of the eleventh transistor T11 is electrically connected to the first control terminal, and the first control terminal is electrically connected to the first driving signal output terminal GP (n-1) of the adjacent previous stage of driving circuit, the source electrode of the eleventh transistor T11 is electrically connected to the third power line VGH2, and the drain electrode of the eleventh transistor T11 is electrically connected to the second driving signal output terminal GN;

The gate electrode of the twelfth transistor T12 is electrically connected to the first driving signal output terminal GP (n-1) of the adjacent previous stage of driving circuit, and the source electrode of the twelfth transistor T12 is electrically connected to the second power line VGL.

Figure 12:
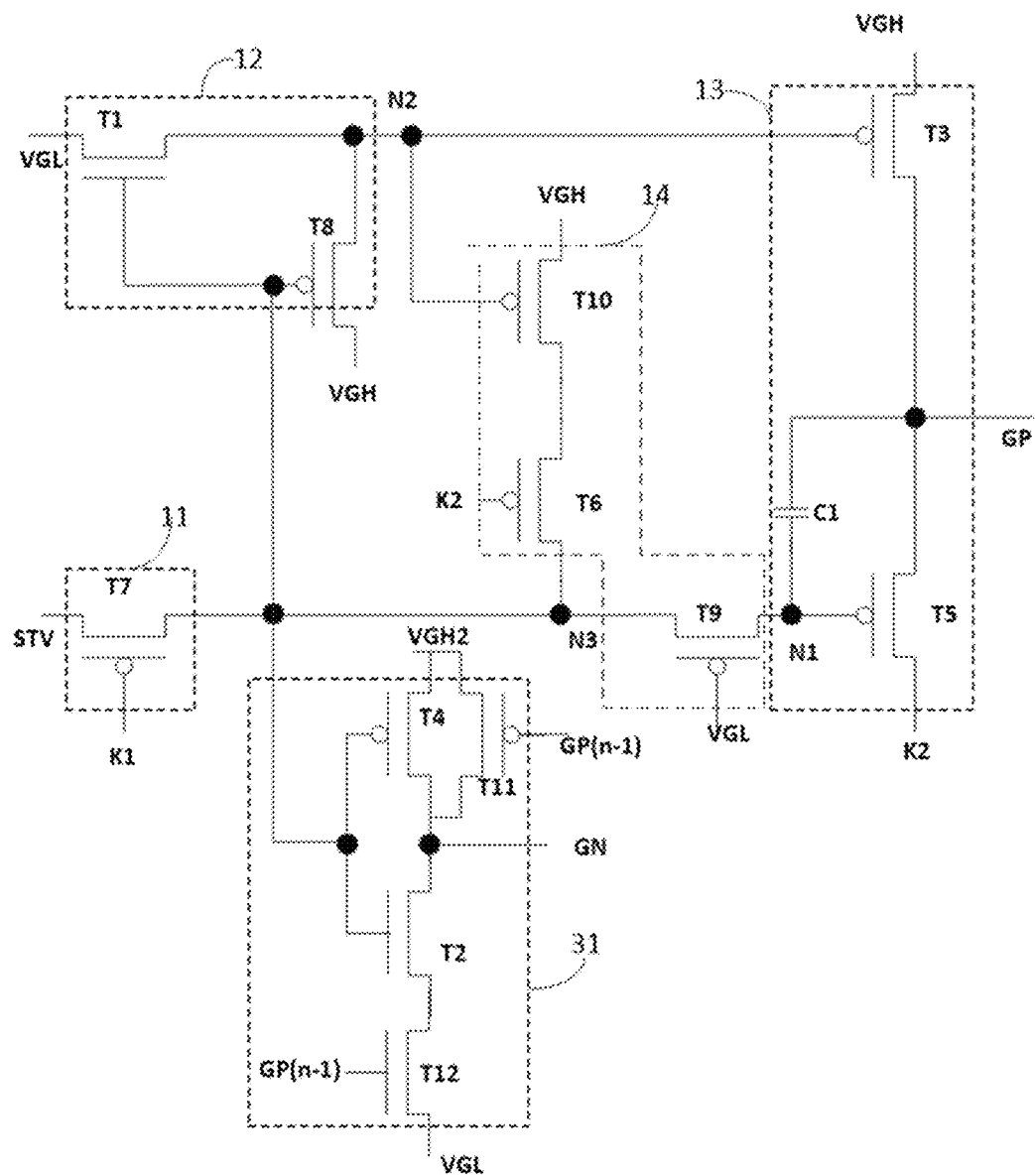
FIG. 12 is a circuit diagram of the driving circuit according to at least one embodiment of the present disclosure.

In at least one embodiment of the driving circuit shown in FIGS. 12, T2, T1 and T12 are N-type transistors, and other transistors are P-type transistors, but are not limited to this.

Figure 13:
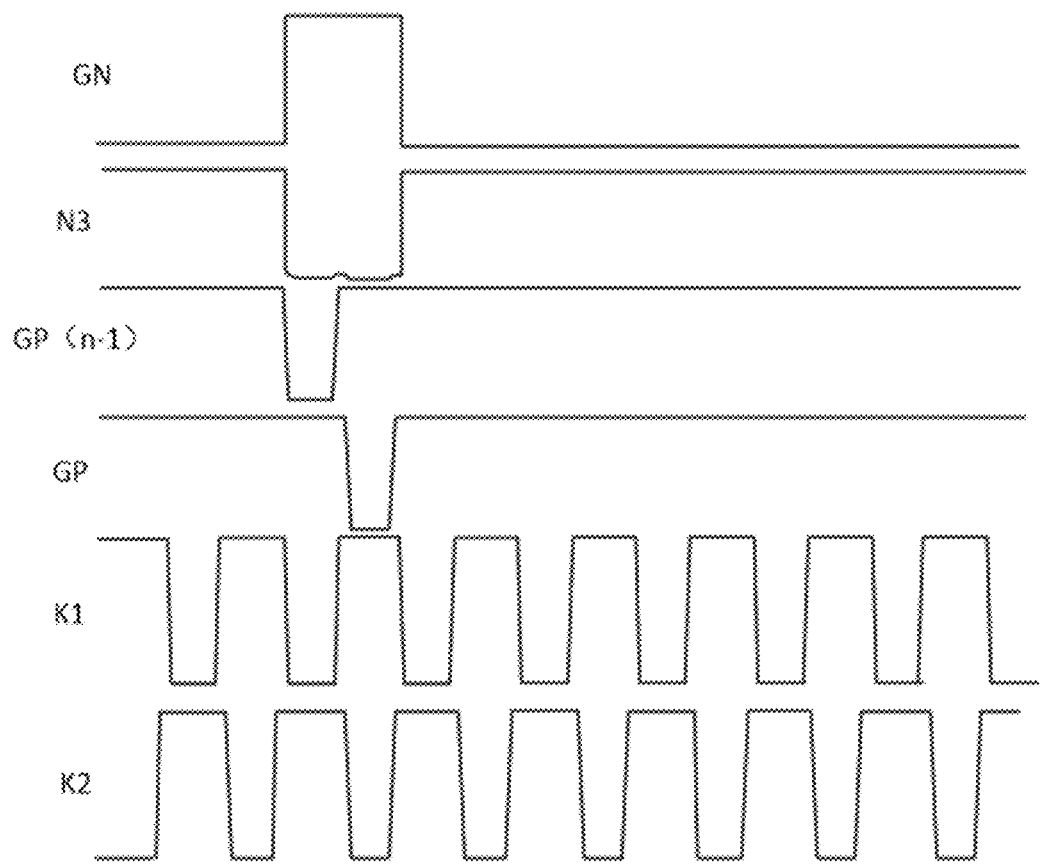
FIG. 13 is a working timing diagram of the driving circuit shown in FIG. 12.

FIG. 13 is a working timing diagram of the driving circuit shown in FIG. 12.

The differences between at least one embodiment of the driving circuit shown in FIG. 14 and at least one embodiment of the driving circuit shown in FIG. 12 are as follows: at least one embodiment of the driving circuit shown in FIG. 14 further includes a voltage stabilizing circuit 41; the drain electrode of the second transistor T2, the drain electrode of the fourth transistor T4 and the drain electrode of the eleventh transistor T11 are all electrically connected to the second driving signal output terminal GN through the voltage stabilizing circuit 41;

The voltage stabilizing circuit 41 includes a thirteenth transistor T13 and a fourteenth transistor T14; the gate electrode of the thirteenth transistor T13 is electrically connected to the drain electrode of the second transistor T2, and the source electrode of the thirteenth transistor T13 is electrically connected to the second power line VGL, and the drain electrode of the thirteenth transistor T13 is electrically connected to the second driving signal output terminal GN;

The gate electrode of the fourteenth transistor T14 is electrically connected to the drain electrode of the second transistor T2, and the source electrode of the fourteenth transistor T14 is electrically connected to the third power line VGH2. The drain electrode of T14 is electrically connected to the second driving signal output terminal GN.

Figure 14:
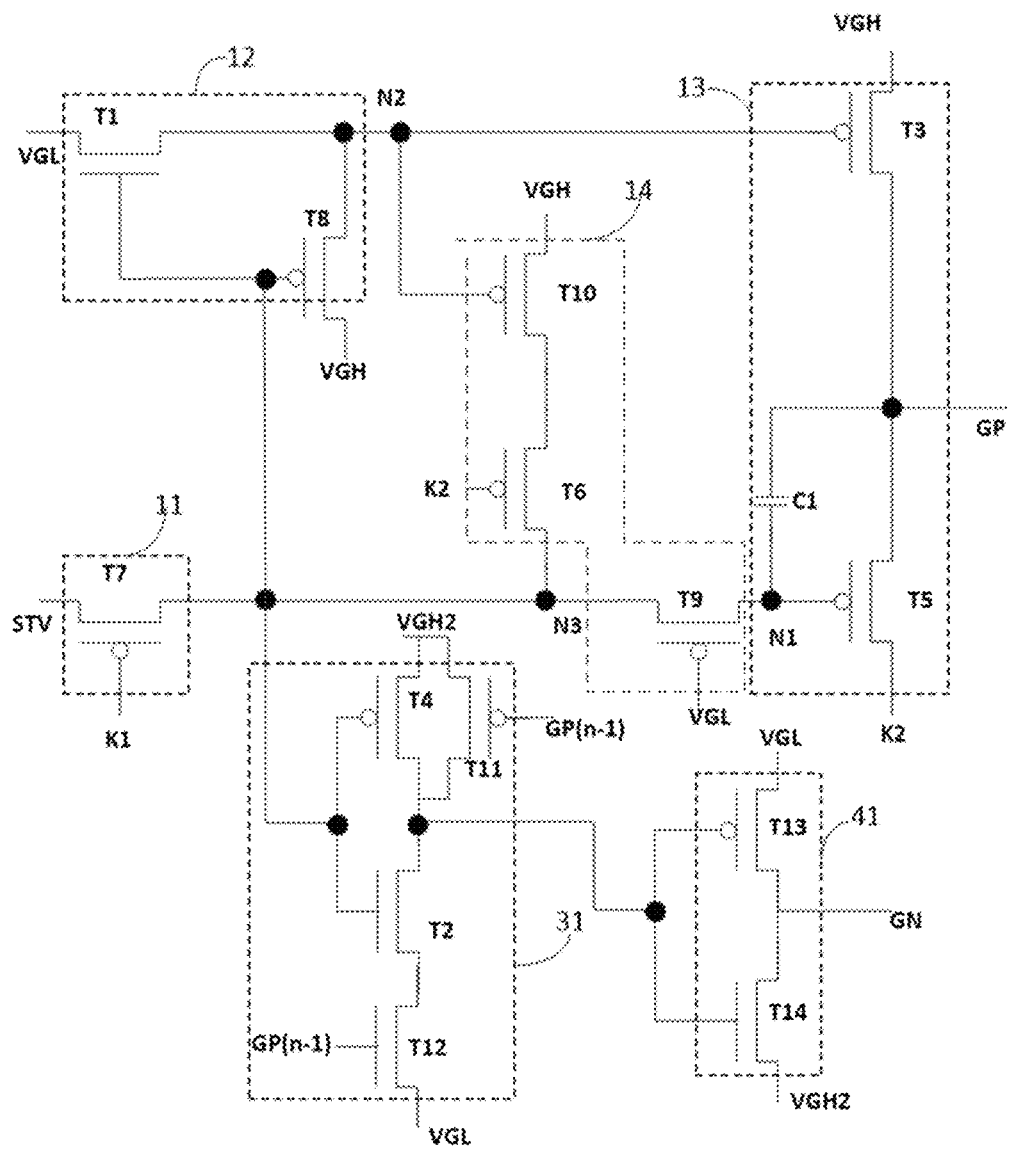
FIG. 14 is a circuit diagram of the driving circuit according to at least one embodiment of the present disclosure.

In at least one embodiment shown in FIG. 14, T13 is a P-type transistor, and T14 is an N-type transistor.

The difference between at least one embodiment of the driving circuit shown in FIG. 15 and at least one embodiment of the driving circuit shown in FIG. 14 is as follows: at least one embodiment of the driving circuit shown in FIG. 15 also includes a second capacitor C2 and a third capacitor C3;

The first terminal of the second capacitor C2 is electrically connected to the drain electrode of the second transistor T2, and the second terminal of the second capacitor C2 is electrically connected to the second driving signal output terminal GN;

The first terminal of the third capacitor C3 is electrically connected to the drain electrode of the second transistor T2, and the second terminal of the third capacitor C3 is electrically connected to the second driving signal output terminal GN.

Figure 15:
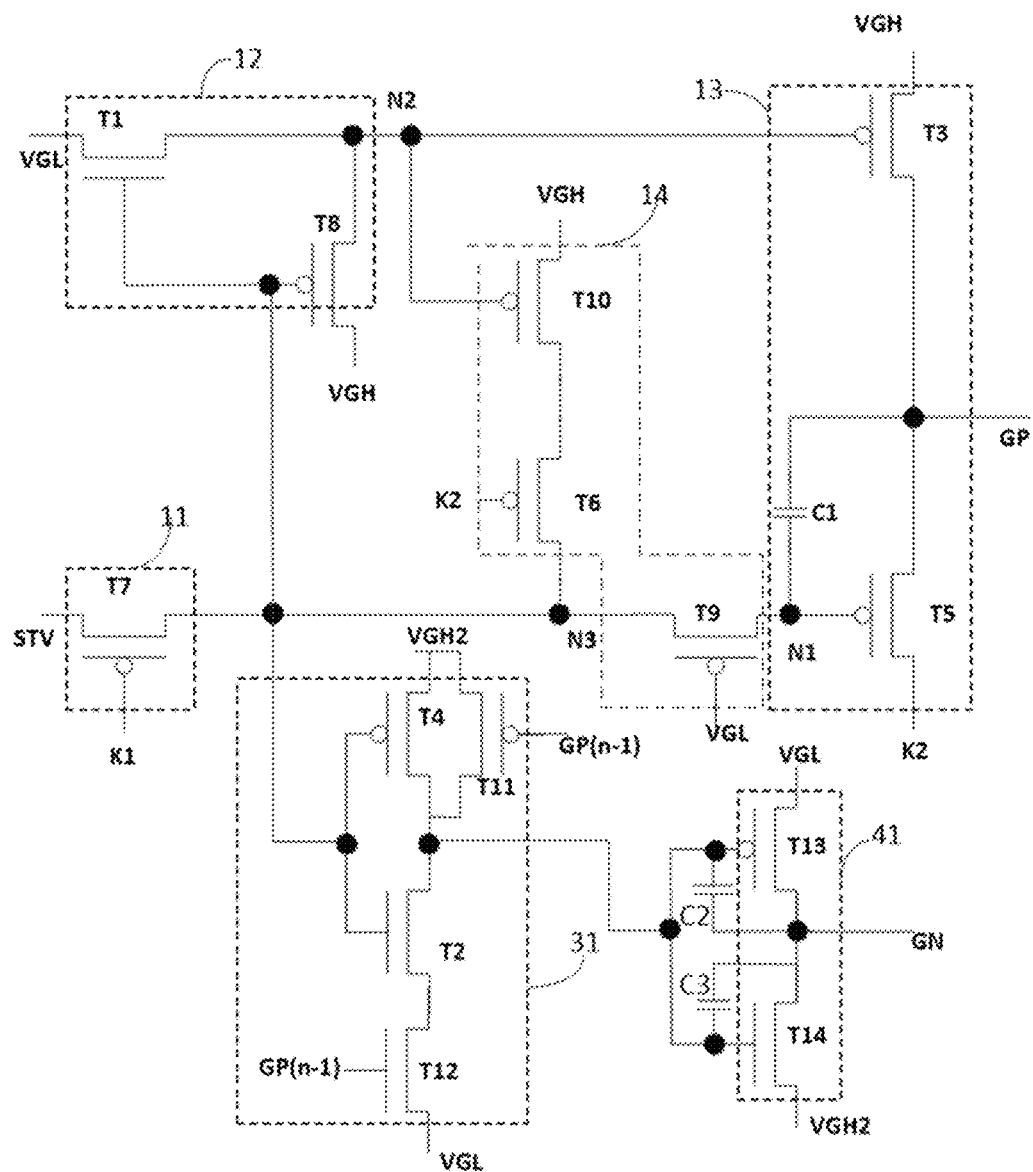
FIG. 15 is a circuit diagram of the driving circuit according to at least one embodiment of the present disclosure.
Figure 16:
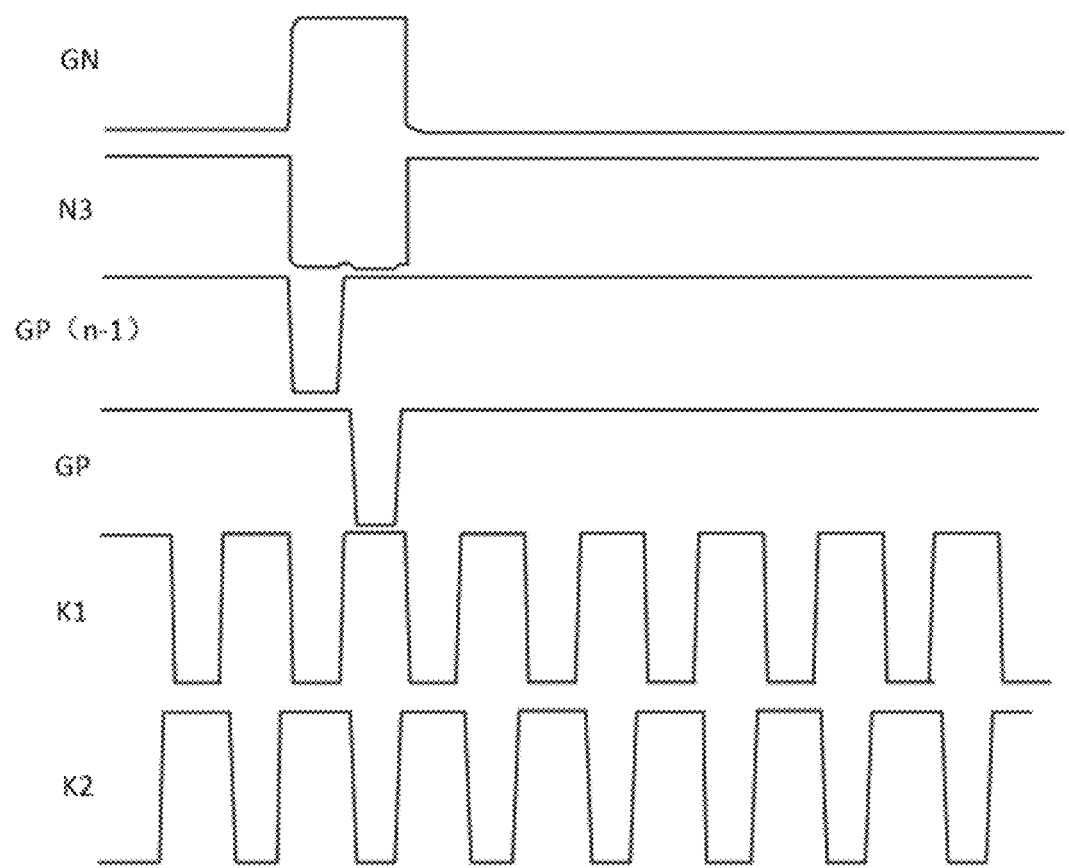
FIG. 16 is an working timing diagram of the driving circuit shown in FIG. 15.

FIG. 16 is a working timing diagram of the driving circuit shown in FIG. 15.

The display substrate according to the embodiment of the present disclosure includes a shift register arranged on the base substrate. The shift register includes a plurality of stages of driving circuit. The driving circuit includes a first input circuit, a second input circuit, a first output circuit and a control circuit; the first output circuit is configured to provide a first scanning driving signal to the first driving signal output terminal under the control of the potential of the first node and the potential of the second node; the first input circuit is configured to input a signal to the third node under the control of the clock signal; the second input circuit is configured to input the signal provided by the power line to the second node under the control of the potential of the third node; the control circuit is configured to control the potential of the third node and the potential of the first node;

A plurality of stages of the driving circuit are provided in the driving circuit area of the base substrate; wherein a stage of driving circuit area includes a first area and a second area, and the first area is provided with a first type of transistor included in the driving circuit, a second type of transistor included in the driving circuit is provided in the second area;
   one side of the first area is a side of the power line away from the second area, and the other side of the first area is a side close to the second area of an active layer of the first type of transistor close to the second area;
   One side of the second area is a side of the power line away from the first area, and the other side of the second area is the side close to the second area of the active layer of the first type of transistor close to the second area.

Figure 17:
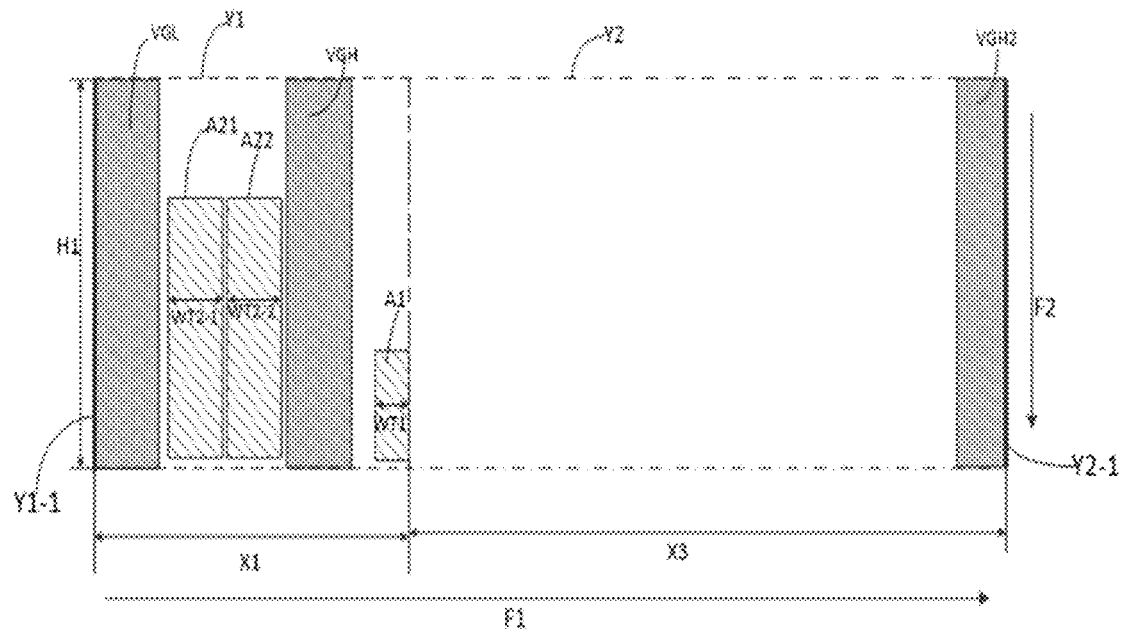
FIG. 17 is a partial layout diagram of the driving circuit shown in FIG. 9.

In at least one embodiment of the present disclosure, as shown in FIG. 17, the power lines may include a first power line VGH, a second power line VGL, and a third power line VGH2;

One side Y1-1 of the first area Y1 may be the side of the second power line VGL away from the second area Y2;

One side Y2-1 of the second area Y2 may be a side of the third power line VGH2 away from the first area Y1.

Optionally, the first type of transistor may be an N-type transistor, and the second type of transistor may be a P-type transistor, but is not limited thereto.

In the embodiment of the present disclosure, in order to facilitate the manufacturing process and achieve low parasitic capacitance and wiring resistance, or in order to shorten the length of some connecting lines, N-type transistors are placed in one area and P-type transistors are placed in another area.

In at least one embodiment of the present disclosure, the driving circuit area is an area where a plurality of stages of driving circuit is provided, and a stage of driving circuit area may be an area where a stag of driving circuit is provided; but it is not limited to this.

FIG. 17 is a partial layout diagram of the driving circuit shown in FIG. 9, in which the line labeled VGH is the first power line, the line labeled VGL is the second power line, the line labeled VGH2 is the third power line, and the line labeled A21 is the first active layer pattern of the second transistor T2, the one labeled A22 is the second active layer pattern of the second transistor T2, and the one labeled A1 is the active layer of the first transistor T1.

In FIG. 17, the first power line VGH, the second power line VGL and the third power line VGH2 may be included in the first source-drain metal layer, and A21, A22 and A1 may be included in the second semiconductor layer; the second semiconductor layer may be made of oxides, for example the second semiconductor layer may be made of Indium Gallium Zinc Oxide (IGZO).

In FIG. 17, the area labeled Y1 is the first area, the area labeled Y2 is the second area, and the left side of the first area Y1 is the side of the second power line VGL away from the second area Y2, the right side of the first area Y1 is the side of the active layer A1 of the first transistor T1 close to the second area Y2;

The first type of transistor on the side close to the second region is a first transistor T1. The first transistor T1 is an N-type transistor arranged in the first area Y1 and closest to the second area Y2.

In at least one embodiment of the present disclosure, the first type of transistor on the side close to the second area may be: the first type transistor arranged in the first area and closest to the second area.

In FIG. 17, the right side of the second area Y2 is the side of the third power line VGH2 away from the first area Y1, and the left side of the second area Y2 is the side of the active layer A1 of the first transistor T1 close to the second area Y2.

Optionally, the power line includes a second power line; the second input circuit is used to input the second voltage signal provided by the second power line to the third node under the control of the potential of the third node.

$$X1/X3 \geq 0.52;$$

Wherein, X1 is the width of the first area in the first direction, and X3 is the width of the second area in the first direction;

The first direction is a direction intersecting the extension direction of the second power line.

In at least one embodiment of the present disclosure, the first direction may be a horizontal direction, and the extending direction of the first power line may be a vertical direction, but is not limited thereto.

In FIG. 17, the one labeled X1 is the width of the first area Y1 in the first direction, the one labeled X3 is the width of the second area Y2 in the first direction, in order to achieve a narrow bezel, X1/X3 is greater than or equal to 0.52, but is not limited to this.

Optionally, the power line includes a first power line; the second input circuit is used to input the first voltage signal provided by the first power line into the second node under the control of the potential of the third node;

$$X1/X3 \geq 0.21;$$

Wherein, X1 is the width of the first area in the first direction, and X3 is the width of the second area in the first direction;

The first direction is a direction intersecting the extending direction of the first power line.

Figure 18:
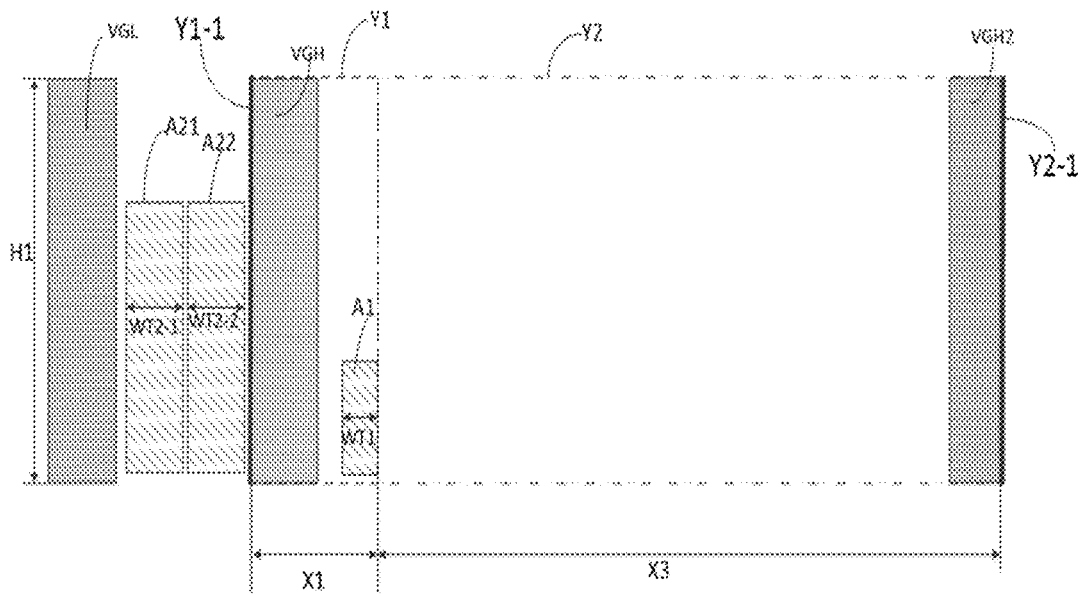
FIG. 18 is a partial layout diagram of the driving circuit shown in FIG. 9.

FIG. 18 is a partial layout diagram of the driving circuit shown in FIG. 9, in which the line labeled VGH is the first power line, the line labeled VGL is the second power line, the line labeled VGH2 is the third power line, and the one labeled A21 is the first active layer pattern of the second transistor T2, the one labeled A22 is the second active layer pattern of the second transistor T2, and the one labeled A1 is the active layer of the first transistor T1.

In FIG. 18, the first power line VGH, the second power line VGL and the third power line VGH2 may be included in the first source-drain metal layer, and A21, A22 and A1 may be included in the second semiconductor layer; the second semiconductor layer may be made of oxides, for example the second semiconductor layer may be made of Indium Gallium Zinc Oxide (IGZO).

In FIG. 18, the area labeled Y1 is the first area, the area labeled Y2 is the second area, and the left side of the first area Y1 is the side of the first power line VGH away from the second area Y2, the right side of the first area Y1 is the side of the active layer A1 of the first transistor close to the second area Y2;

The first transistor is an N-type transistor arranged in the first area Y1 and closest to the N-type transistor in the second area Y2.

In FIG. 18, the right side of the second area Y2 is the side of the third power line VGH2 away from the first area Y1, and the left side of the second area Y2 is the side of the active layer A1 of the first transistor T1 close to the second area Y2.

In FIG. 18, the one labeled X1 is the width of the first area Y1 in the first direction, the one labeled X3 is the width of the second area Y2 in the first direction, in order to achieve a narrow bezel, X1/X3 is greater than or equal to 0.21, but is not limited to this.

In FIG. 18, the one labeled Y1-1 is one side of the first area Y1, and the one labeled Y2-1 is one side of the second area Y2.

FIGS. 17 and 18 show the range of the first area Y1 and the range of the second area Y2. The boundary in the first direction is clear. In the second direction, the boundary is the height of a stage of driving circuit. The height of the stage of driving circuit will be explained later.

In at least one embodiment of the present disclosure, the second direction may be the extension direction of each power line, but is not limited to this.

As shown in FIG. 17, the one labeled F1 can be the first direction, and the one labeled F2 can be the second direction.

In at least one embodiment of the present disclosure, the first type of transistor is an N-type transistor, and the second type of transistor is a P-type transistor;

The distance between at least one of the N-type transistors and the second power line is smaller than the distance between the P-type transistor and the second power line.

As shown in at least one embodiment corresponding to FIG. 27, FIG. 38, FIG. 48 and FIG. 59, the distance between the second transistor and the second power line VGL is smaller than the distance between each P-type transistor (the P-type transistor may be a third between the three transistors T3, the fourth transistor T4, the fifth transistor T5, the sixth transistor T6, the seventh transistor T7, the eighth transistor T8, the ninth transistor T9, and the tenth transistor T10) and the second power line VGL.

In specific implementation, since the second power line VGL is arranged on the side of the second transistor away from each of the P-type transistors, the distance between the second transistor and the second power line VGL is smaller than the distance between the P-type transistor and the second power line VGL.

Optionally, the second input circuit includes a first transistor; a gate electrode of the first transistor is electrically connected to the third node, and a first electrode of the first transistor is electrically connected to the second power line, a second electrode of the first transistor is electrically connected to the second node; the first transistor is a first type of transistor;

$$WT1/X1 \geq 0.258;$$

Wherein, WT1 is the width of the active layer of the first transistor along the first direction.

In FIG. 18, the one labeled WT1 is the width of the active layer A1 of the first transistor T1 in the first direction, and X1 is the width of the first area Y1 in the first direction; the ratio of WT1 to X1 can be greater than or equal to 0.258, but not limited to this.

In FIG. 18, the one labeled WT2-1 is the width of the first active layer pattern A21 of the second transistor along the first direction, and the one labeled WT2-2 is the width of the second active layer pattern A22 of the second transistor in the first direction.

In at least one embodiment of the present disclosure, the driving circuit further includes a second output circuit, and the second output circuit is configured to control the second driving signal output terminal to output the second scanning driving signal under the control of the potential of the third node; the second output circuit includes a second transistor; the gate electrode of the second transistor is electrically connected to the third node, and the first electrode of the second transistor is electrically connected to the second power line, the second electrode of the second transistor is electrically connected to the second driving signal output terminal; the second transistor is a first type of transistor;

$$WT2/X1 \geq 0.33;$$

WT2 is the width of the active layer of the second transistor along the first direction, and X1 is the width of the first area in the first direction.

In FIG. 17, the one labeled A21 is the first active layer pattern of the second transistor T2, the one labeled A22 is the second active layer pattern of the second transistor T2; the one labeled WT2-1 is the width of A21 along the first direction, the one labeled WT2-2 is the width of A22 along the first direction. The active layer of the second transistor T2 includes the first active layer pattern A21 of the second transistor T2 and the second active layer A22 of the second transistor T2, the width WT2 of the active layer of the second transistor T2 along the first direction is the sum of WT2-1 and WT2-2. The ratio between WT2 and X1 can be designed to be greater than or equal to 0.33, but not limited to this.

Optionally, the second input circuit includes a first transistor; a gate electrode of the first transistor is electrically connected to the third node, and a first electrode of the first transistor is electrically connected to the second power line, a second electrode of the first transistor is electrically connected to the second node; the driving circuit also includes a second output circuit, the second output circuit is used to control the second driving signal output terminal to output a second scanning driving signal under the control of the potential of the third node; the second output circuit includes a second transistor; the gate electrode of the second transistor is electrically connected to the third node, and the first electrode of the second transistor is electrically connected to the second power line, and the second electrode of the second transistor is electrically connected to the second driving signal output terminal; both the first transistor and the second transistor are first type of transistors;

$$WT2/WT1 \geq 3.25;$$

The width of the active layer of the first transistor along the first direction is WT1, and WT2 is the width of the active layer of the second transistor along the first direction.

In at least one embodiment of the present disclosure, the ratio between the width WT2 of the active layer of the second transistor along the first direction and the width WT1 of the active layer of the first transistor along the first direction may be designed to be greater than or equal to 3.25, but is not limited to this.

In at least one embodiment of the present disclosure, the display substrate further includes a clock signal line group arranged in the driving circuit area, and the clock signal line group is configured to provide the clock signal;

The active layer of at least one first type of transistor is located between the clock signal line group and the power line in the first direction;

An overlapping area between the orthographic projection of the active layer of at least one first type of transistor on the base substrate and the orthographic projection of the power line on the base substrate is less than or equal to 5/6 of the area of the active layer of at least one first type of transistor.

Figure 48:
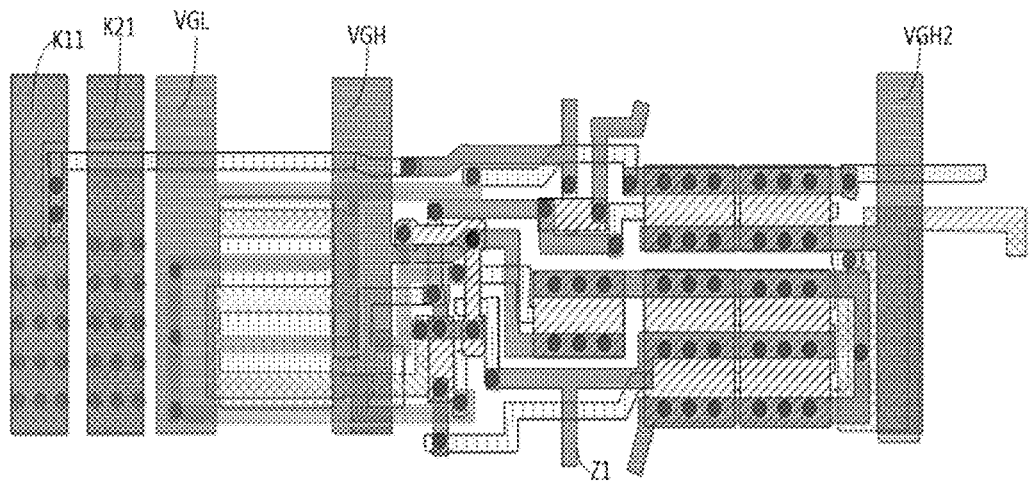
FIG. 48 is a layout diagram of a stage of driving circuit in a display substrate according to at least one embodiment of the present disclosure.
Figure 59:
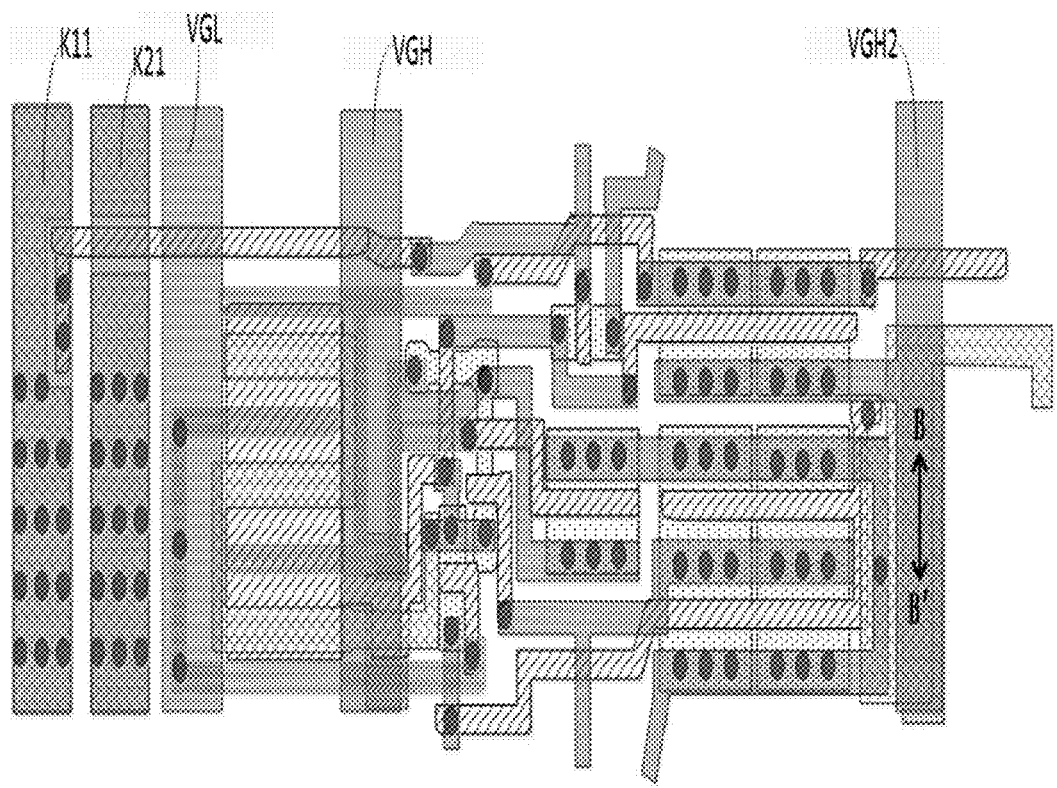
FIG. 59 is a layout diagram of a stage of driving circuit in a display substrate according to at least one embodiment of the present disclosure.

In at least one embodiment of the display substrate shown in FIG. 48 and at least one embodiment of the display substrate shown in FIG. 59, the active layer of the second transistor T2 is located between the clock signal line group and the first power supply VGH in the first direction, the clock signal line group includes a first clock signal line and a second clock signal line;

The overlapping area between the orthographic projection of the active layer A1 of the first transistor T1 on the base substrate and the orthographic projection of the first power line VGH on the base substrate is less than or equal to five-sixths of the area of the active layer A1 of the first transistor T1.

Optionally, the ratio of the length of the active layer of at least one first type of transistor along the second direction to the height of the driving circuit is less than or equal to 0.75.

As shown in FIG. 17, the ratio between the length of the active layer A1 of the first transistor along the second direction and the height H1 of the first area Y1 in the second direction is less than or equal to 0.75, and the height H1 of the first area Y1 in the second direction may be the height of the driving circuit.

In at least one embodiment of the present disclosure, the second direction may be a vertical direction, but is not limited thereto.

In at least one embodiment of the present disclosure, the display substrate further includes a first active layer arranged in the second area; the first active layer includes a first active portion, two second active portions, and two third active portions; the display substrate further includes a second output circuit;

The first active portion serves as an active layer of a third transistor, the two second active portions serve as an active layer of a fourth transistor, and the two third active portions serve as the active layer of the fifth transistor;

The third transistor is a transistor included in the first output circuit that outputs a first voltage signal, the fifth transistor is a transistor included in the first output circuit that outputs a clock signal, and the fourth transistor is a transistor included in the second output circuit that outputs a third voltage signal;

The channel area of the nth transistor is ARn, $ARn \geq 2^{(n-1)}i$, where n is equal to 1, 2 or 3, and i is the unit channel area.

In at least one embodiment of the present disclosure, when n is equal to 1, the channel area AR1 of the first transistor may be greater than or equal to i; when n is equal to 2, the channel area AR2 of the second transistor may be greater than or equal to 2i; when n is equal to 3, the channel area AR3 of the third transistor may be greater than or equal to 4i.

Figure 19:
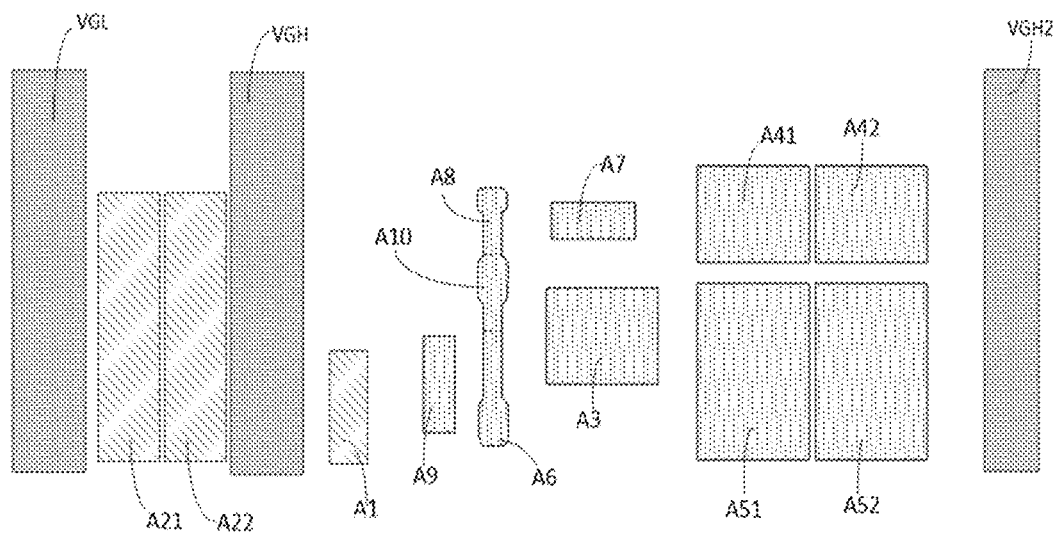
FIG. 19 is a partial layout diagram of the driving circuit shown in FIG. 9.

In FIG. 19, A3 is the first active portion, A41 is the first second active portion, A42 is the second second active portion, and A51 is the first third active portion, A52 is the second third active portion; A8 is the active layer of the eighth transistor T8, and A10 is the active layer of the tenth transistor T10, A6 is the active layer of the sixth transistor T6, A7 is the active layer of the seventh transistor T7, A9 is the active layer of the ninth transistor T9, and A8, A10 and A6 are continuous with each other.

A3 serves as the active layer of the third transistor T3, A41 and A42 serve as the active layer of the fourth transistor T4, and A51 and A52 serve as the active layer of the fifth transistor T5.

In at least one embodiment shown in FIGS. 19, A3, A41, A42, A51, A52, A8, A10, A6, A7 and A9 are included in the first semiconductor layer, and the first semiconductor layer may be a low-temperature polysilicon semiconductor layer, but not limited to this.

Optionally, the area P1 of the first active portion is p, the sum P2 of the areas of the two second active portions is greater than or equal to 2p and less than or equal to 3p; the sum P3 of the areas of the two third active portions is greater than or equal to 3p and less than or equal to 4p.

In at least one embodiment shown in FIG. 19, the area P1 of A3 is p, the sum of the area of A41 and the area of A42 is P2, the sum of the area of A51 and the area of A52 is P3, and P2 can be greater than or equal to 2p and less than and equal to 3p, P3 can be greater than or equal to 3p and less than or equal to 4p.

Figure 20:
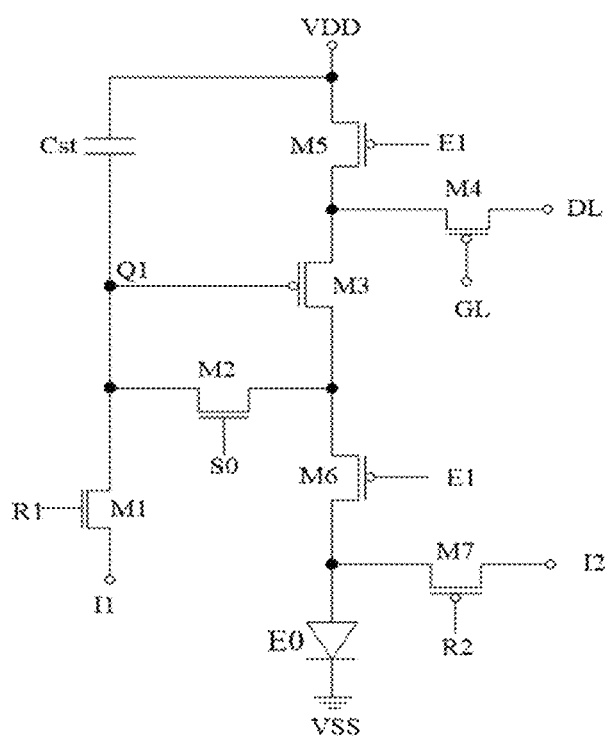
FIG. 20 is a circuit diagram of a pixel circuit according to at least one embodiment of the present disclosure.
Figure 21:
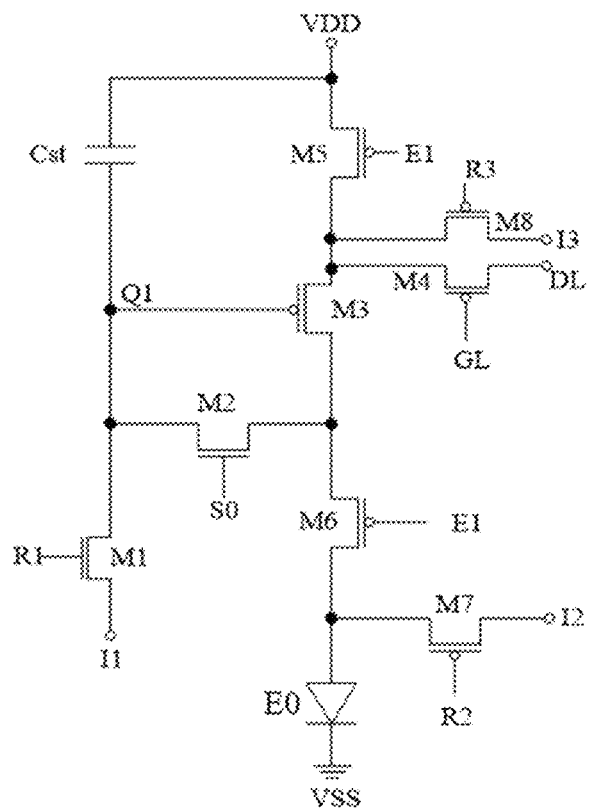
FIG. 21 is a circuit diagram of a pixel circuit according to at least one embodiment of the present disclosure.
Figure 22:
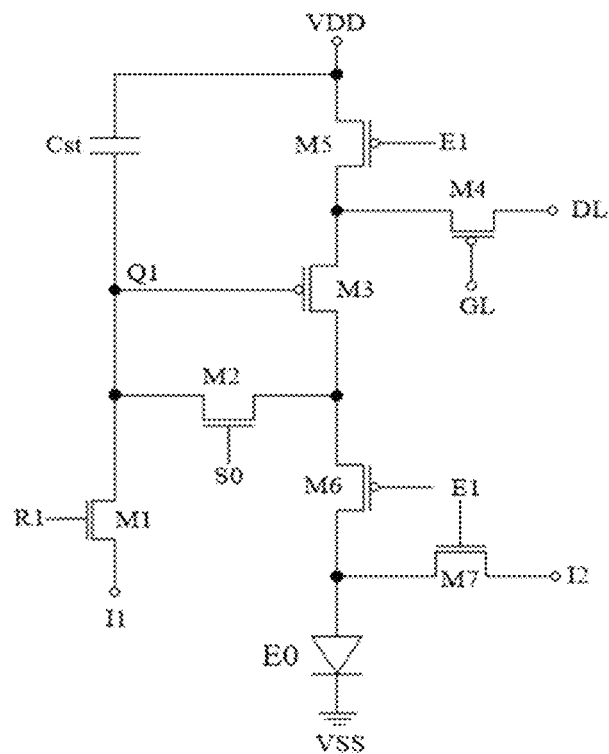
FIG. 22 is a circuit diagram of a pixel circuit according to at least one embodiment of the present disclosure.

FIG. 20 is a circuit diagram of the pixel circuit, FIG. 21 is a circuit diagram of the pixel circuit, and FIG. 22 is a circuit diagram of the pixel circuit. In FIGS. 20, 21 and 22, the pixel circuit may be a low temperature polycrystalline oxide (LTPO) pixel circuit.

In FIG. 20, M1 is the first reset transistor, M2 is the threshold compensation transistor, M3 is the driving transistor, M4 is the data writing-in transistor, and M5 is the first light emitting control transistor, the one labeled M6 is the second light-emitting control transistor, the one labeled M7 is the second reset transistor, the one labeled Cst is the storage capacitor; the one labeled E0 is the organic light-emitting diode;

The one labeled VDD is the high-voltage terminal, the one labeled E1 is the light-emitting control line, the one labeled GL is the scanning line, the one labeled R1 is the first reset control terminal, the one labeled R2 is the second reset control terminal, the one labeled DL is the data line, the one labeled S0 is the compensation control terminal, the one labeled I1 is the first initial voltage terminal, and the one labeled I2 is the second initial voltage terminal.

The first driving signal output terminal GP in the driving circuit is used to provide a signal to the gate electrode of the data writing-in transistor M4, and the second driving signal output terminal GN in the driving circuit is used to provide a signal to the gate electrode of the threshold compensation transistor M2 and the gate electrode of the first reset transistor M1.

In at least one embodiment shown in FIGS. 20, M1 and M2 are N-type transistors, and M3, M4, M5, M6 and M7 may all be P-type transistors.

In FIG. 21, M1 is the first reset transistor, M2 is the threshold compensation transistor, M3 is the driving transistor, M4 is the data writing-in transistor, and M5 is the first light emitting control transistor, the one labeled M6 is the second light-emitting control transistor, the one labeled M7 is the second reset transistor, the one labeled M8 is the third reset transistor, the one labeled Cst is the storage capacitor; the one labeled E0 is the organic light-emitting diode;

The one labeled VDD is the high voltage terminal, the one labeled E1 is the light-emitting control line, the one labeled GL is the scanning line, the one labeled R1 is the first reset control terminal, the one labeled R2 is the second reset control terminal, the one labeled DL is the data line, the one labeled S0 is the compensation control terminal, the one labeled I1 is the first initial voltage terminal, the one labeled I2 is the second initial voltage terminal, the one labeled I3 is the third initial voltage terminal, the one labeled R3 is the third reset control terminal.

The first driving signal output terminal GP in the driving circuit is used to provide a signal to the gate electrode of the data writing-in transistor M4, and the second driving signal output terminal GN in the driving circuit is used to provide a signal to the gate electrode of the threshold compensation transistor M2 and the gate electrode of the first reset transistor M1.

In at least one embodiment shown in FIG. 21, M1 and M2 are N-type transistors, and M3, M4, M5, M6, M7 and M8 may all be P-type transistors.

In FIG. 22, M1 is the first reset transistor, M2 is the threshold compensation transistor, M3 is the driving transistor, M4 is the data writing-in transistor, and M5 is the first light emitting control transistor, the one labeled M6 is the second light-emitting control transistor, the one labeled M7 is the second reset transistor, the one labeled Cst is the storage capacitor; the one labeled E0 is the organic light-emitting diode;

The one labeled VDD is the high voltage terminal, the one labeled E1 is the light-emitting control line, the one labeled GL is the scanning line, the one labeled R1 is the first reset control terminal, the one labeled DL is the data line, and the one labeled S0 is the compensation control terminal, the one labeled I1 is the first initial voltage terminal, and the one labeled I2 is the second initial voltage terminal.

The first driving signal output terminal GP in the driving circuit is used to provide a signal to the gate electrode of the data writing-in transistor M4, and the second driving signal output terminal GN in the driving circuit is used to provide a signal to the gate electrode of the threshold compensation transistor M2 and the gate electrode of the first reset transistor M1.

The difference between at least one embodiment of the pixel circuit shown in FIG. 22 and at least one embodiment of the pixel circuit shown in FIG. 20 is that M7 is an N-type transistor, and the gate electrode of M7 is electrically connected to the light-emitting control line E1.

In at least one embodiment shown in FIGS. 22, M1, M2, and M7 are N-type transistors, and M3, M4, M5, and M6 may all be P-type transistors.

In FIGS. 20, 21 and 22, the first control node labeled Q1 is electrically connected to the gate electrode of the driving transistor M3.

During the data writing-in process of the pixel circuit, the data signal is written into the gate electrode of the driving transistor M3 through M4, M3 and M2 that are turned on. During this process, the time that the potential of the gate electrode of M4 continues to be low voltage is significantly shorter than the time that the potential of the gate electrode of M2 continues to be high voltage. In other words, the duration of data writing-in is determined by the time that the potential of the scanning signal provided by the scanning line GL is maintained at a low voltage, the scanning signal needs to have a shorter rising edge and a shorter falling edge. That is to say, the duration of data writing-in is determined by the time that the potential of the first scanning driving signal provided by the first driving signal output terminal GP is maintained at a low voltage, and the potential of the first scanning driving signal is raised to end the data writing-in process. In the I-V curve (current-voltage curve), the larger the voltage V is, the more obvious the tail is. For example, after the voltage V is greater than 5V, the current leakage is also larger, and the rising edge of the first scanning driving signal needs to be smaller. Therefore, the first voltage signal output by the third transistor T3 (the first voltage signal is a signal provided by the first power line VGH) is smaller. Even if the third voltage signal output by the fourth transistor T4 (the third voltage signal is the signal provided by the third power line VGH2) has a falling edge, it does not matter because the high potential is maintained for a long time. Moreover, the larger the third voltage signal output by the third transistor T3 is, the more conducive it is to fully turn on the threshold compensation transistor M2, which is conducive to fast writing-in of data signals. The same is true for the signal provided by the second driving signal output terminal GN to the gate electrode of the first reset transistor M1. The larger the third voltage signal output by the third transistor T3 is, the more conductive it is to write the first initial voltage provided by the first initial voltage terminal into the first control node Q1 quickly. In at least one embodiment of the present disclosure, the voltage value of the third voltage signal provided by the third power line VGH2 may be greater than the voltage value of the first voltage signal provided by the first power line VGH. For example, the voltage value of the third voltage signal provided by the third power line VGH2 may be greater than or equal to 1.4 times the voltage value of the first voltage signal provided by the first power line VGH.

In at least one embodiment of the present disclosure, the voltage value of the first voltage signal provided by the first power line VGH may be 5V, and the voltage value of the third voltage signal provided by the third power line VGH2 may be 7V or 7.5 V or 8V, but not limited to this.

In at least one embodiment of the present disclosure, the display substrate may include a first semiconductor layer, a first gate metal layer, a second semiconductor layer, a second gate metal layer, and a third gate metal layer;

The bottom gate electrode of the N-type transistor and the top gate electrode of the P-type transistor can be made of the first gate metal layer. The gate electrode of the N-type transistor has a structure of top gate electrode and the bottom gate electrode. Since the oxide transistor will have a threshold voltage drift after long-term use, the structure of the top gate electrode and the bottom gate electrode can stabilize the threshold voltage, especially when driven at low frequency, and can effectively prevent current leakage.

Optionally, the first semiconductor layer may be a low-temperature polysilicon semiconductor layer, and the second semiconductor layer may be an oxide semiconductor layer, but is not limited thereto.

In specific implementation, when the gate electrode of the N-type transistor needs to be closer to the oxide semiconductor layer, the bottom gate electrode of the N-type transistor can also be made of the second gate metal layer.

In at least one embodiment of the present disclosure, the bottom gate electrode of the N-type transistor may be included in the first gate metal layer, and the top gate electrode of the N-type transistor may be included in the third gate metal layer; or, the bottom gate electrode of the N-type transistor may be included in the second gate metal layer, and the top gate electrode of the N-type transistor may be included in the third gate metal layer; or, the bottom gate electrode of the N-type transistor may be included in the first gate metal layer, and the top gate electrode of the N-type transistor may be included in the second gate metal layer; but it is not limited to this.

Figure 23:
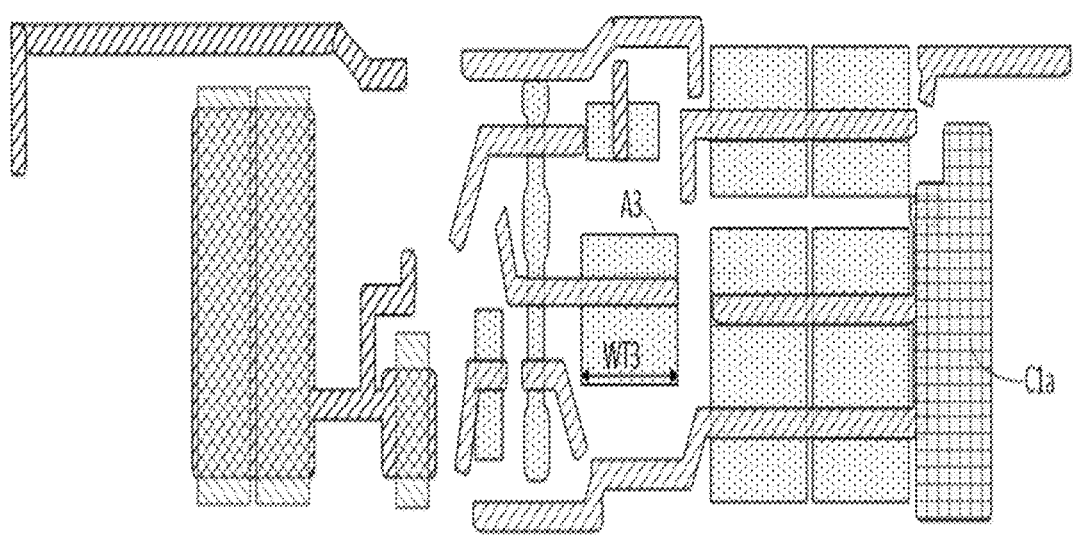
FIG. 23 is a schematic diagram of the first semiconductor layer, the second semiconductor layer, the first gate metal layer and the second gate metal layer in the layout of the driving circuit in the display substrate according to at least one embodiment of the present disclosure.

FIG. 23 is a schematic diagram of the first semiconductor layer, the second semiconductor layer, the first gate metal layer and the second gate metal layer in the layout of the driving circuit in at least one embodiment of the display substrate.

In at least one embodiment of the present disclosure, the first semiconductor layer, the first gate metal layer, the second semiconductor layer and the second gate metal layer may be sequentially arranged along a direction away from the base substrate. Alternatively, the first semiconductor layer, the first gate metal layer, the second gate metal layer and the second semiconductor layer may be stacked in sequence in a direction away from the base substrate.

In FIG. 23, the one labeled C1a is the first electrode plate of the first capacitor C1, and the first electrode plate C1a of C1 is included in the second gate metal layer.

Figure 24:
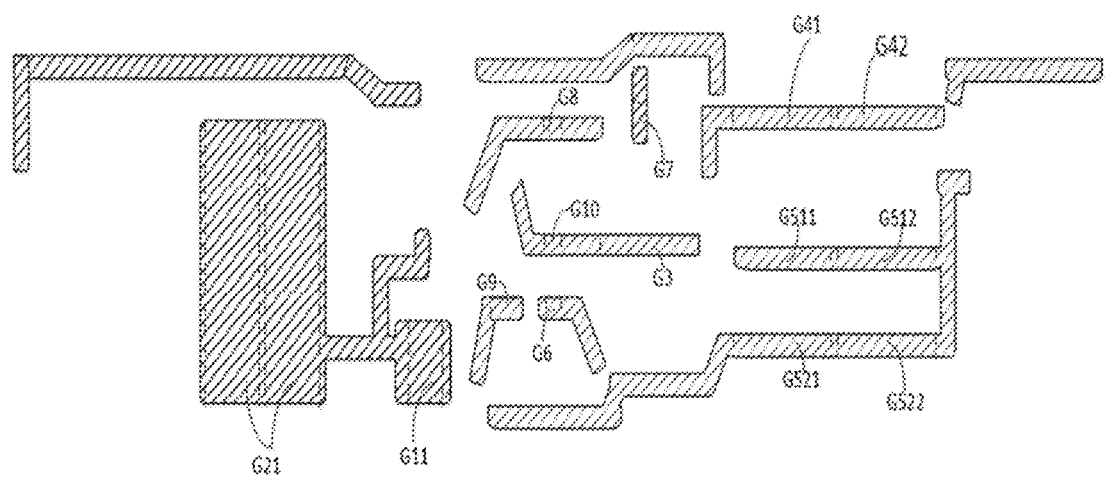
FIG. 24 is a layout diagram of the first gate metal layer in FIG. 23.

FIG. 24 is a layout diagram of the first gate metal layer in FIG. 23.

In FIG. 24, the one labeled G21 is the bottom gate electrode of T2, and the one labeled G11 is the bottom gate electrode of T1. G21 and G11 are formed integrally. Compared with the gate electrode of the P-type transistor, the gate area of T1 and the gate area of T2 are large, the middle part of the active layer of T1 and the middle part of the active layer of T2 are fully covered. Since the oxide is sensitive to light, the bottom gate electrode G21 of T2 and the bottom gate electrode G11 of T1 are not only used as gate electrodes, also used to block light.

In FIG. 24, the one labeled G41 is the first gate pattern of T4, the one labeled G42 is the second gate pattern of T4, the one labeled G511 is the first gate pattern of T5, and the one labeled G512 is the first gate pattern of T5, the one labeled G521 is the third gate pattern of T5, and the one labeled G522 is the fourth gate pattern of T5; G41 and G42 are integrally formed, and G5111, G512, G521 and G522 are integrally formed;

The one labeled G21 is the bottom gate electrode of T2, the one labeled G11 is the bottom gate electrode of T1, the one labeled G3 is the gate electrode of T3, the one labeled G6 is the gate electrode of T6, the one labeled G7 is the gate electrode of T7, the one labeled G8 is the gate electrode of T8, the one labeled G9 is the gate electrode of T9, and the one labeled G10 is the gate electrode of T10.

Figure 25:
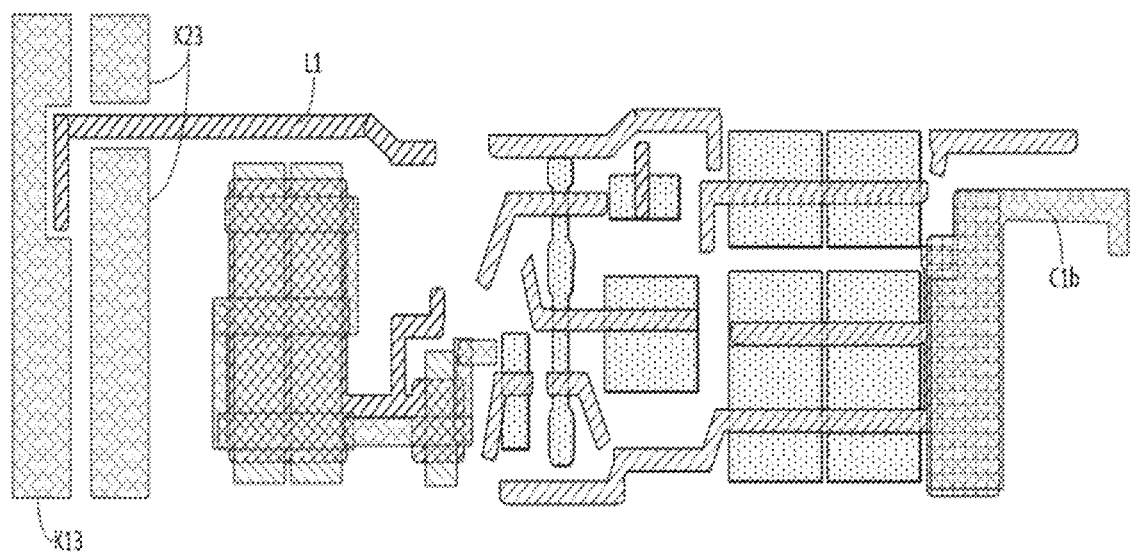
FIG. 25 is a schematic layout diagram of adding a third gate metal layer on the basis of FIG. 23.

FIG. 25 is a schematic layout diagram of adding a third gate metal layer based on FIG. 23.

In FIG. 25, the one labeled C1b is the second electrode plate of the first capacitor C1, the one labeled K13 is the third clock signal line portion included in the first clock signal line, the one labeled K23 is the third clock signal line portion included in the second clock signal line.

Figure 27:
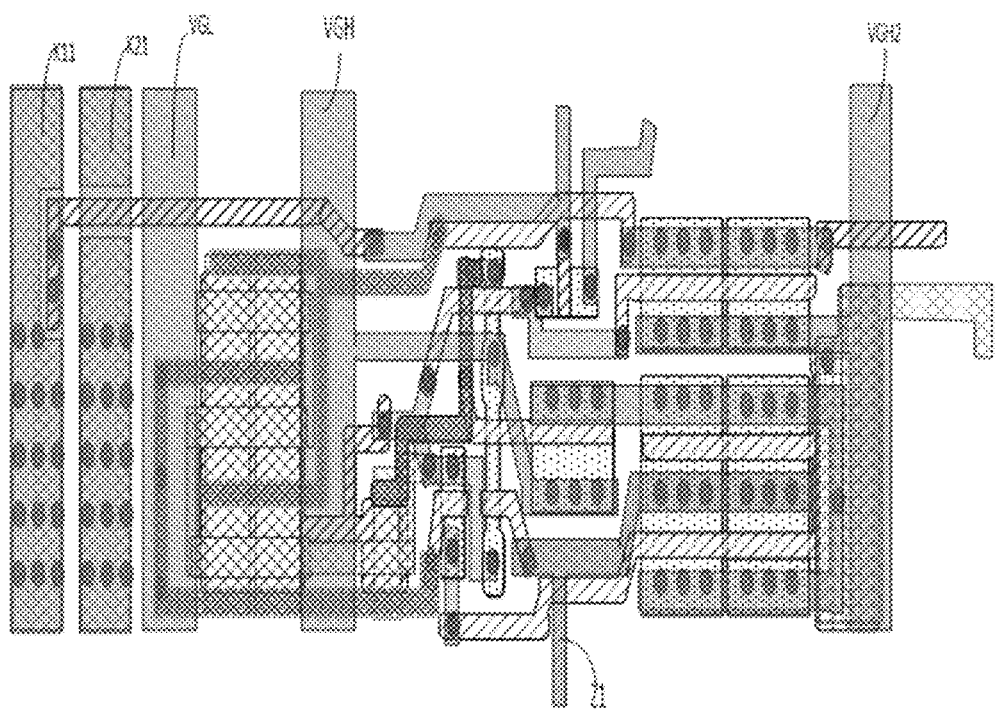
FIG. 27 is a layout diagram of a stage of driving circuit in a display substrate according to at least one embodiment of the present disclosure.
Figure 32:
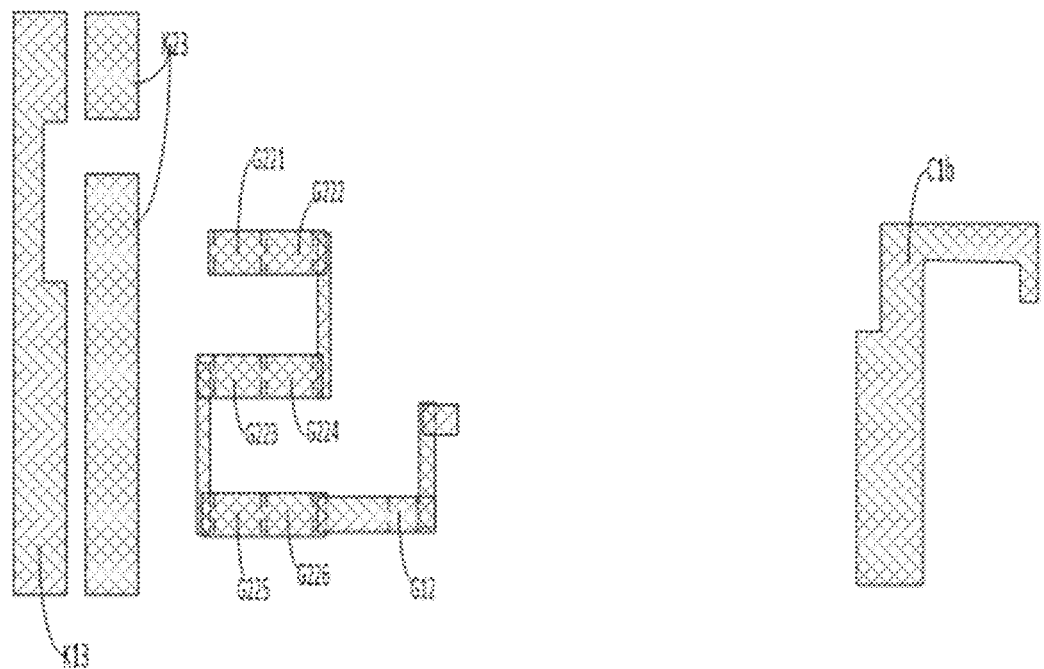
FIG. 32 is a layout diagram of the third gate metal layer in FIG. 27.

FIG. 32 is a layout diagram of the third gate metal layer in FIG. 27. In FIG. 32, the one labeled G12 is the top gate electrode of T1, and the one labeled C1b is the second electrode plate of the first capacitor C1.

As shown in FIG. 32, the first gate pattern included in the top gate electrode of the second transistor T2 is labeled as G221, the second gate pattern included in the top gate electrode of the second transistor T2 is labeled as G222, and the third gate pattern included in the top gate electrode of the second transistor T2 is labeled as G223, the fourth gate pattern included in the top gate electrode of the second transistor T2 is labeled as G224, the fifth gate pattern included in the top gate electrode of the second transistor T2 is labeled as G225, and the sixth gate pattern included in the top gate electrode of the second transistor T2 is labeled G226.

As shown in FIGS. 32, G221, G222, G223, G224, G225, G226 and G12 can be formed integrally.

In FIG. 32, the one labeled K13 is the third clock signal line portion included in the first clock signal line, and the one labeled K23 is the third clock signal line portion included in the second clock signal line.

Figure 26:
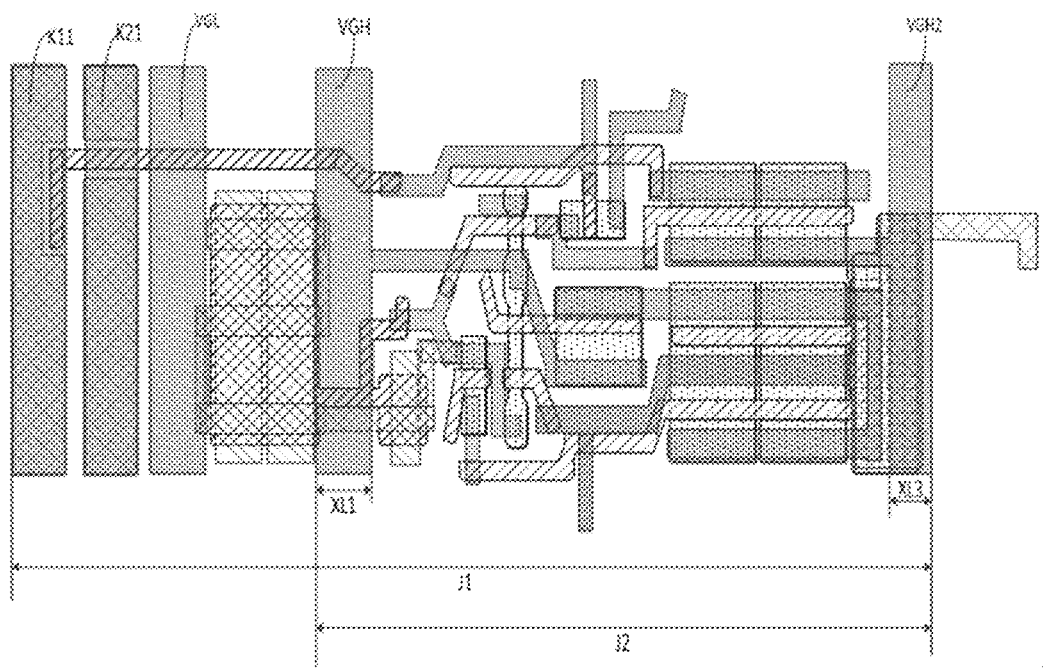
FIG. 26 is a schematic layout diagram of adding a first source-drain metal layer on the basis of FIG. 25.

FIG. 26 is a schematic layout diagram of adding a first source-drain metal layer on the basis of FIG. 25.

As shown in FIG. 26, the one labeled VGH is the first power line, the one labeled VGL is the second power line, and the one labeled VGH2 is the third power line.

Figure 33:
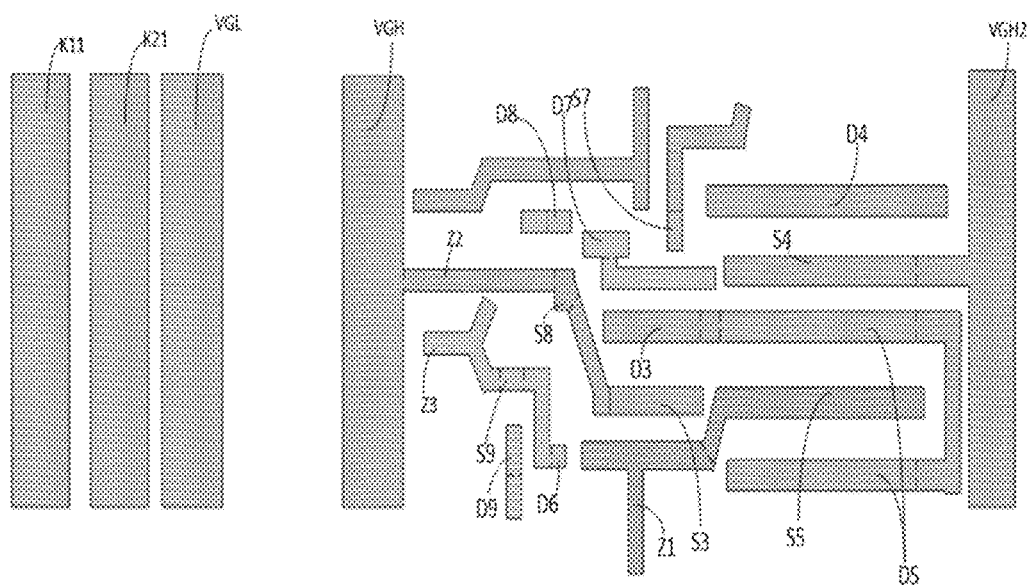
FIG. 33 is a layout diagram of the first source-drain metal layer in FIG. 27.

FIG. 33 is a layout diagram of the first source-drain metal layer in FIG. 27. In FIG. 33, the one labeled VGH is the first power line, the one labeled VGL is the second power line, the one labeled VGH2 is the third power line, and the one labeled K11 is the first clock signal line portion included in the first clock signal line. The one labeled K21 is the first clock signal line portion included in the second clock signal line.

As shown in FIGS. 26 and 33, the first source-drain metal layer is used to form the first power line VGH, the second power line VGL, the third power line VGH2, K11, K21, the transfer electrode and the source electrode and the drain electrode of the transistor. As can be seen from FIG. 26, the first clock signal line is made of the third gate metal layer and the first source-drain metal layer. The second clock signal line is made of the third gate metal layer and the first source-drain metal layer. The first clock signal line portion is connected to the third clock signal line portion through via holes. Since the resistance is inversely proportional to the area, two metal layers are used to make the clock signal line, which can significantly increase the area and significantly reduce the resistance.

Figure 28:
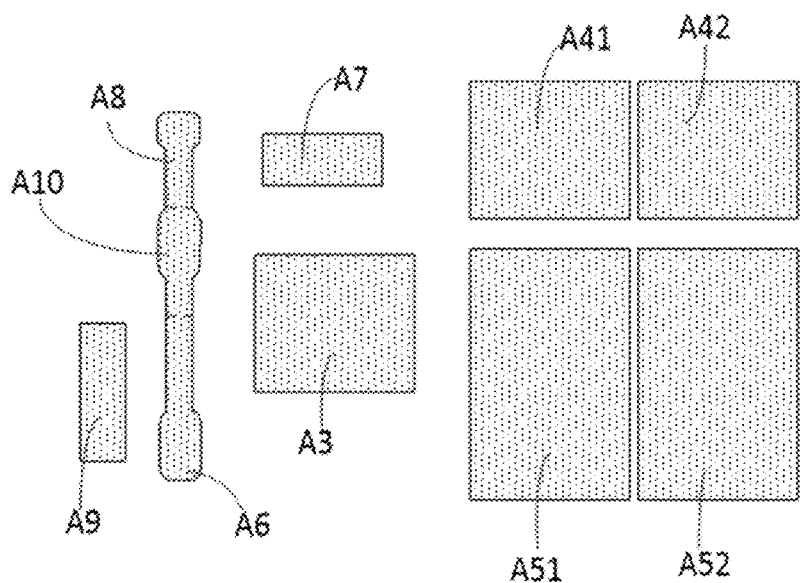
FIG. 28 is a layout diagram of the first semiconductor layer in FIG. 27.
Figure 29:
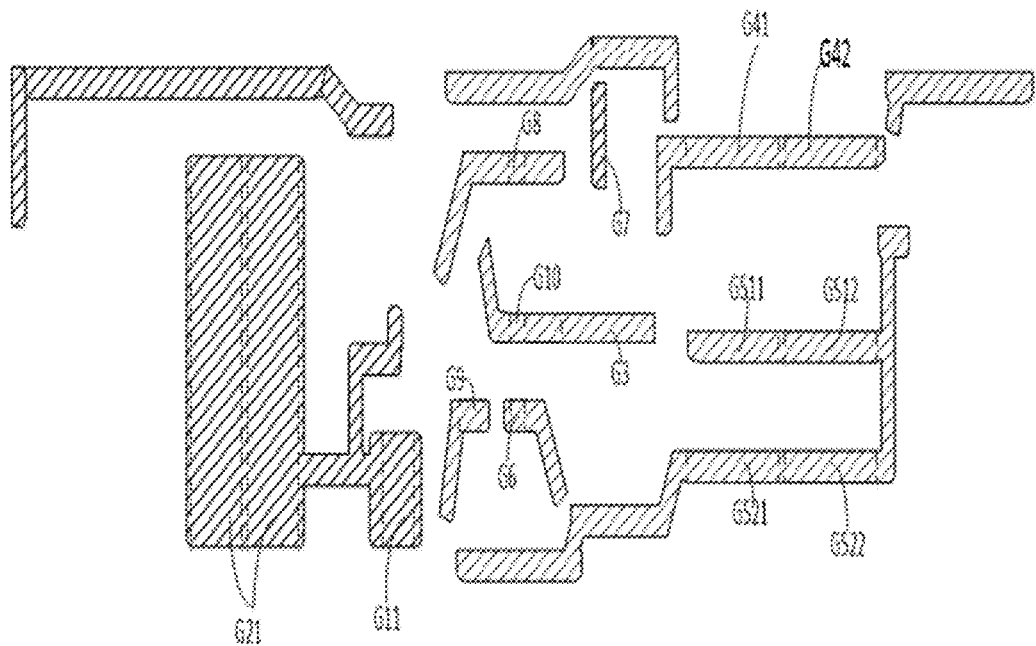
FIG. 29 is a layout diagram of the first gate metal layer in FIG. 27.
Figure 30:
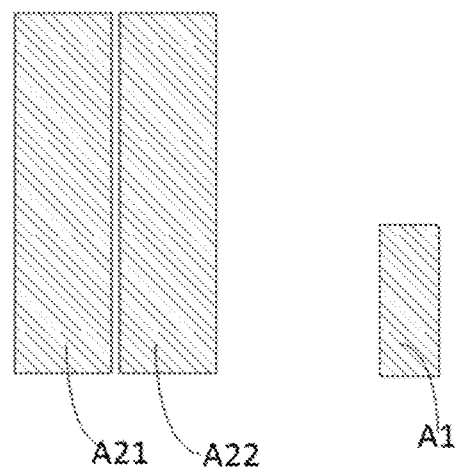
FIG. 30 is a layout diagram of the second semiconductor layer in FIG. 27.
Figure 31:
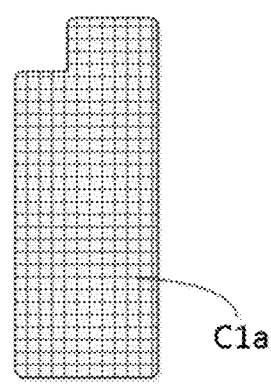
FIG. 31 is a layout diagram of the second gate metal layer in FIG. 27.
Figure 34:
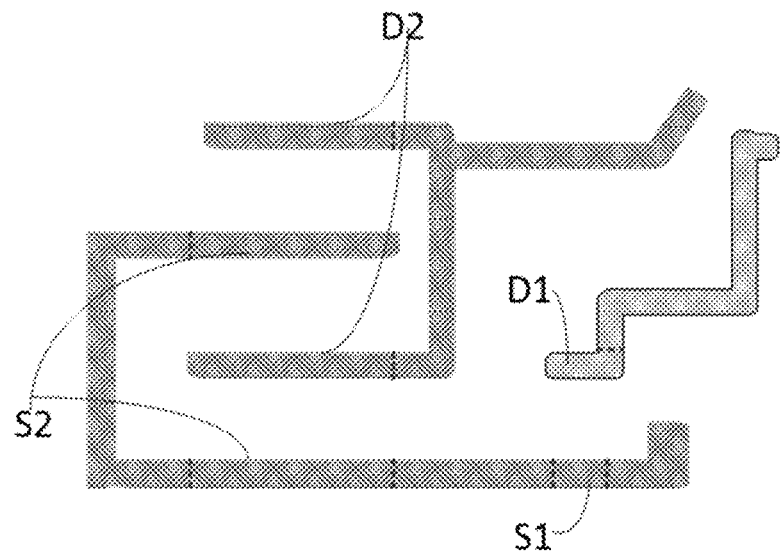
FIG. 34 is a layout diagram of the second source-drain metal layer in FIG. 27.

FIG. 27 is a schematic diagram of adding a second source-drain metal layer and via holes based on the layout diagram shown in FIG. 26. FIG. 28 is a layout diagram of the first semiconductor layer in FIG. 27, FIG. 29 is a layout diagram of the first gate metal layer in FIG. 27, FIG. 30 is a layout diagram of the second semiconductor layer in FIG. 27, and FIG. 31 is the layout diagram of the second gate metal layer in FIG. 27, FIG. 32 is the layout diagram of the third gate metal layer in FIG. 27, FIG. 33 is the layout diagram of the first source-drain metal layer in FIG. 27, FIG. 34 is the layout diagram of the second source-drain metal layer in FIG. 27.

In at least one embodiment of the present disclosure, the display substrate further includes a clock signal line arranged in the driving circuit area; the clock signal line is configured to provide a clock signal; the first electrode of the fourth transistor is electrically connected to the third power line;

The ratio between the first distance and the length of the active layer of the third transistor in the first direction is less than or equal to 10.78;

The first distance is the distance between the side of the clock signal line away from the display area and the side of the third power line close to the display area.

During specific implementation, the ratio of the first distance to the length of the active layer of the third transistor in the first direction may be set to less than or equal to 10.78 to facilitate the realization of a narrow frame.

As shown in FIG. 26, the distance between the side of the first clock signal line portion K11 included in the first clock signal line away from the display area and the side of the third power line VGH2 close to the display area is the first distance J1; as shown in FIG. 23, the length of the active layer A3 of the third transistor T3 along the first direction is WT3;

The ratio between the first distance J1 and WT3 is less than or equal to 10.78.

In at least one embodiment of the present disclosure, the display substrate further includes a clock signal line arranged in the driving circuit area; the clock signal line is configured to provide a clock signal; the first electrode of the fourth transistor is electrically connected to the third power line; the ratio between the line width of the first power line and the first distance is greater than or equal to 0.060; the line width of the first power line is the length of the first power line along the first direction, the first distance is the distance between the side of the clock signal line away from the display area and the side of the third power line close to the display area.

During specific implementation, the ratio of the line width of the first power line to the first distance may be set to be greater than or equal to 0.060, so as to facilitate the realization of a narrow frame.

As shown in FIG. 26, the distance between the side of the first clock signal line portion K11 included in the first clock signal line away from the display area and the side of the third power line VGH2 close to the display area is the first distance J1; the one labeled XL1 is the line width of the first power line VGH, and the ratio between XL1 and the first distance J1 is greater than or equal to 0.060.

The display substrate according to at least one embodiment of the present disclosure further includes a clock signal line arranged in the driving circuit area; the clock signal line is configured to provide a clock signal; the first electrode of the fourth transistor is electrically connected to the third power line;

The ratio between the line width of the third power line and the first distance is less than or equal to 0.045; the line width of the third power line is the length of the third power line along the first direction, and the first distance is the distance between the side of the clock signal line away from the display area and the side of the third power line close to the display area.

During specific implementation, the ratio of the line width of the third power line to the first distance may be set to be greater than or equal to 0.045, so as to facilitate the realization of a narrow frame.

As shown in FIG. 26, the distance between the side of the first clock signal line portion K11 included in the first clock signal line away from the display area and the side of the third power line VGH2 close to the display area is the first distance J1; the one labeled XL3 is the line width of the third power line VGH2, and the ratio between XL3 and the first distance J1 is greater than or equal to 0.045.

The display substrate according to at least one embodiment of the present disclosure further includes a clock signal line group arranged in the driving circuit area; the clock signal line group includes at least one clock signal line, and the clock signal line is configured to provide a clock signal; the display substrate includes at least two power lines;

The clock signal line group is located between two of the at least two power lines; or, the clock signal line group is located on a side of the power line away from the display area.

In at least one embodiment of the present disclosure, the clock signal line group may be located between two power lines, or the clock signal line group may be located on a side of the power line away from the display area.

In at least one embodiment of the display substrate shown in FIG. 26, the display area may be arranged on a side of the third power line VGH2 away from the first power line VGH.

Figure 37:
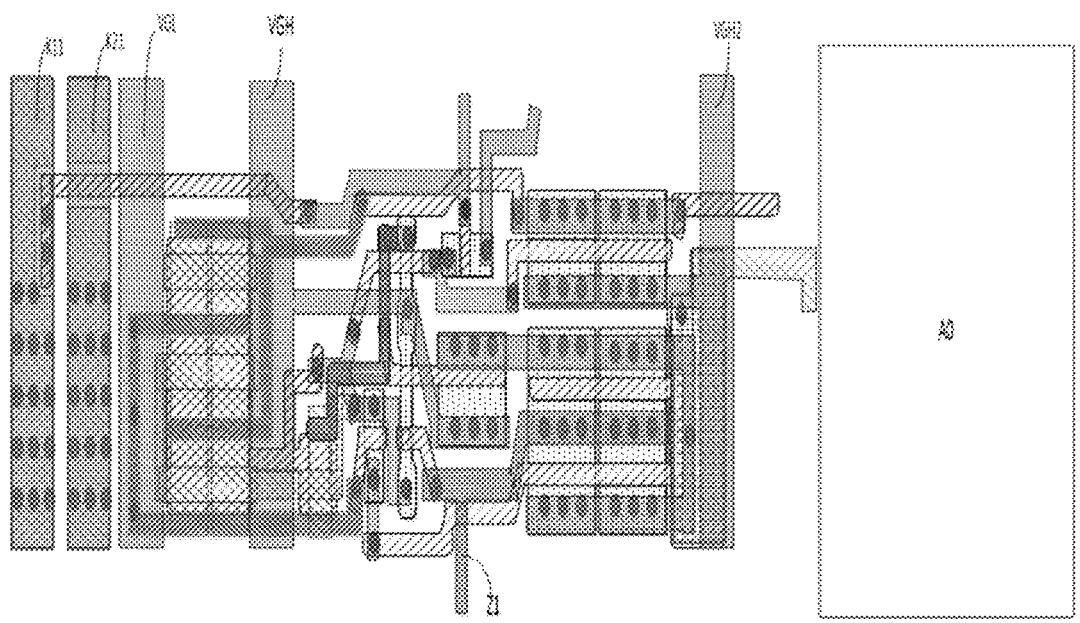
FIG. 37 is a schematic diagram of the positional relationship between the layout of the display substrate and the display area A0 shown in FIG. 27.

As shown in FIG. 37, the display area A0 is provided on the side of the third power line VGH2 away from the first power line VGH.

As shown in FIGS. 27 to 37, the first clock signal line portion K11 included in the first clock signal line and the third clock signal line portion K13 included in the first clock signal line are arranged on the second voltage line VGL away from the display area A0, the first clock signal line portion K21 included in the second clock signal line and the third clock signal line portion K23 included in the second clock signal line are arranged on the side of the second voltage line VGL away from the display area A0.

In at least one embodiment of the present disclosure, the display substrate includes a first power line and a third power line; the display substrate further includes a second output circuit; the second input circuit is configured to input the first voltage signal provided by the first power line to the second node under the control of the potential of the third node; the second output circuit is configured to input the third voltage signal provided by the third power line to the second driving signal output terminal under the control of the potential of the third node.

The ratio of the second distance to the length of the active layer of the third transistor in the first direction is less than or equal to 8.47;

The third transistor is a transistor included in the first output circuit that outputs a first voltage signal; the second distance is a distance between a side of the first power line away from the display area and a side of the third power line close to the display area.

During specific implementation, the ratio of the second distance to the length of the active layer of the third transistor in the first direction may be set to less than or equal to 8.47 to facilitate the realization of a narrow frame.

As shown in FIG. 26, the second distance J2 is the distance between the side of the first power line VGH away from the display area and the side of the third power line VGH2 close to the display area;

As shown in FIG. 23, the length of the active layer A3 of the third transistor T3 along the first direction is WT3;

The ratio between the second distance J2 and WT3 is less than or equal to 8.47.

In at least one embodiment of the present disclosure, the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node;

The ratio between the line width of the first power line and the second distance is greater than or equal to 0.077;

The line width of the first power line is the length of the first power line in the first direction; the second distance is the distance between the side of the first power line away from the display area and the side of the third power line close to the display area.

In specific implementation, the ratio of the line width of the first power line to the second distance may be set to be greater than or equal to 0.077, so as to facilitate the realization of a narrow frame.

As shown in FIG. 26, the second distance J2 is the distance between the side of the first power line VGH away from the display area and the side of the third power line VGH2 close to the display area; the one labeled XL1 is the line width of the first power line VGH, and the ratio between XL1 and the second distance J2 is greater than or equal to 0.077.

In at least one embodiment of the present disclosure, the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node.

The ratio between the line width of the third power line and the second distance is greater than or equal to 0.058;

The line width of the third power line is the length of the third power line in the first direction; the second distance is the distance between the side of the first power line away from the display area and the side of the third power line close to the display area.

In specific implementation, the ratio of the line width of the third power line to the second distance may be set to be greater than or equal to 0.058 to facilitate the realization of a narrow frame.

As shown in FIG. 26, the second distance J2 is the distance between the side of the first power line VGH away from the display area and the side of the third power line VGH2 close to the display area; the one labeled XL3 is the line width of the third power line VGH2, and the ratio between XL3 and the second distance J2 is greater than or equal to 0.058.

The display substrate according to at least one embodiment of the present disclosure includes a first source-drain metal layer and a second source-drain metal layer sequentially stacked in a direction away from the base substrate;

The clock signal line includes a first clock signal line portion arranged on the first source-drain metal layer or a second clock signal line portion arranged on the second source-drain metal layer.

In at least one embodiment of the present disclosure, the clock signal line may include a first clock signal line portion or a second clock signal line portion, the first clock signal line portion is arranged on the first source-drain metal layer, and the second clock signal line portion may be arranged on the second source-drain metal layer.

Optionally, the display substrate further includes a third gate metal layer arranged between the first source-drain metal layer and the base substrate;

The clock signal line further includes a third clock signal line portion arranged on the third gate metal layer;

The clock signal line includes the first clock signal line portion, and the third clock signal line portion and the first clock signal line portion are in direct contact or are electrically connected to each other through via holes; or, the clock signal line portion includes the second clock signal line portion, and the third clock signal line portion and the second clock signal line portion are in direct contact or are electrically connected to each other through a via hole.

Further, in the display substrate according to at least one embodiment of the present disclosure, the clock signal line portion may further include a third clock signal line portion, and the third clock signal line portion may be arranged on the third gate metal layer, the third clock signal line portion and the first clock signal line portion are in direct contact or are electrically connected to each other through via holes. Alternatively, the third clock signal line portion and the second clock signal line portion are in direct contact or are electrically connected to each other through via holes.

In at least one embodiment of the present disclosure, the clock signal line includes two clock signal line portions coupled to each other, and the two clock signal line portions are respectively arranged on different metal layers; one of the two clock signal line portions is continuous, and the other of the two clock signal line portions is discontinuous.

In specific implementation, the clock signal line may include two clock signal line portions coupled to each other and respectively arranged on different metal layers. One of the clock signal line portions may be continuous, and the other of the clock signal line portions may be discontinuous.

As shown in FIG. 25, the third clock signal line portion K23 included in the second clock signal line is discontinuous, and the first conductive connection portion L1 arranged on the first gate metal layer is provided between two portions of K23.

In at least one embodiment of the present disclosure, the third clock signal line portion K13 included in the first clock signal line can be disconnected by another conductive connection portion, so that the third clock signal line portion K13 included in the first clock signal line is not continuous.

As shown in FIG. 26, the first clock signal line portion K11 included in the first clock signal line and the first clock signal line portion K21 included in the second clock signal line are continuous.

Optionally, the display substrate includes a first transfer electrode;

The first electrode of the fifth transistor included in the current stage of driving circuit, the gate electrode of the sixth transistor included in the current stage of driving circuit, and the gate electrode of the seventh transistor included in the adjacent stage of driving circuit are connected to each other through the same first transfer electrode;

The fifth transistor is a transistor included in the first output circuit that outputs a clock signal, the sixth transistor is a transistor included in the control circuit that operates under the control of a clock signal, and the seventh transistor is the transistor included in the first input circuit that provides an input voltage to the third node.

As shown in FIGS. 27 to 34, the one labeled Z1 is the first transfer electrode; the first transfer electrode Z1 is used to electrically connect the first electrode S5 of the fifth transistor T5 and the gate electrode G6 of the sixth transistor T6, and, the first transfer electrode Z1 is used to electrically connect the gate electrode G6 of the sixth transistor T6 and the gate electrode of the seventh transistor T7 included in the adjacent next stage of driving circuit.

Figure 38:
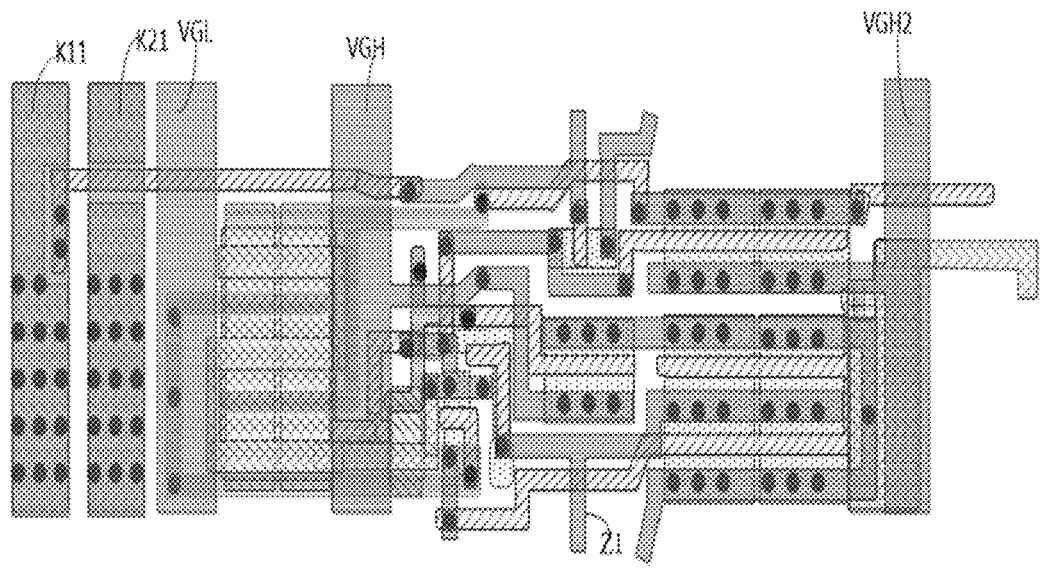
FIG. 38 is a layout diagram of a stage of driving circuit in a display substrate according to at least one embodiment of the present disclosure.

FIG. 38 is a layout diagram of at least one embodiment of the display substrate. FIG. 48 is a layout diagram of at least one embodiment of the display substrate. FIG. 59 is a layout diagram of at least one embodiment of the display substrate.

Figure 39:
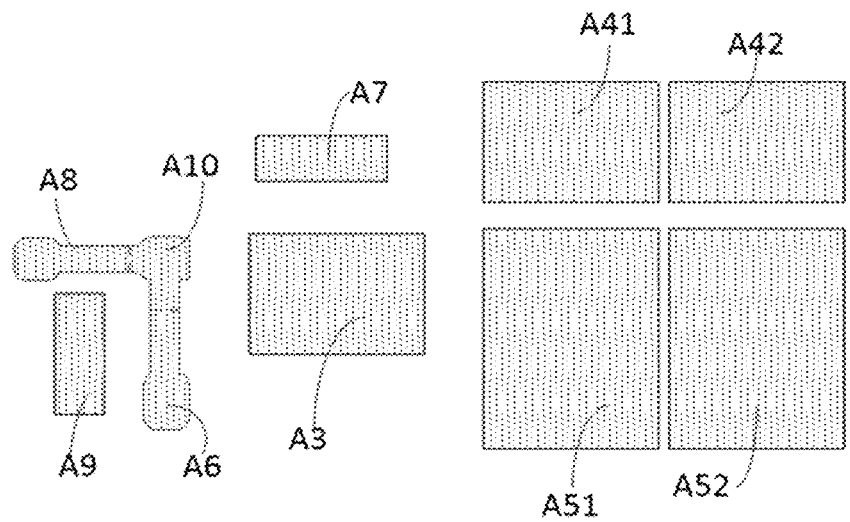
FIG. 39 is a layout diagram of the first semiconductor layer in FIG. 38.
Figure 40:
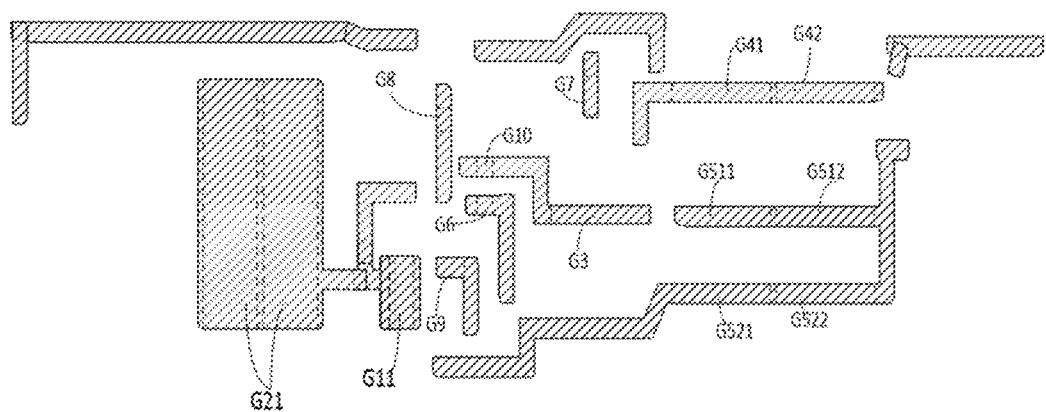
FIG. 40 is a layout diagram of the first gate metal layer in FIG. 38.
Figure 41:
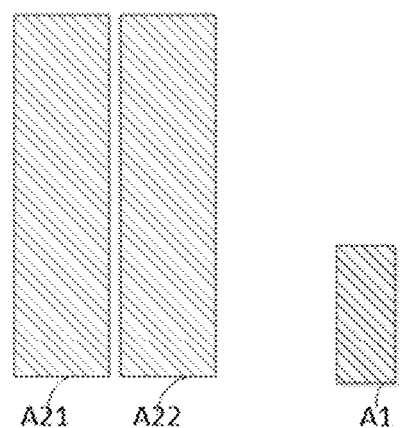
FIG. 41 is a layout diagram of the second semiconductor layer in FIG. 38.
Figure 42:
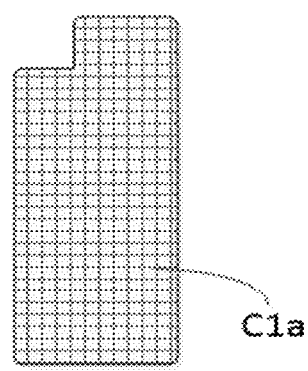
FIG. 42 is a layout diagram of the second gate metal layer in FIG. 38.
Figure 43:
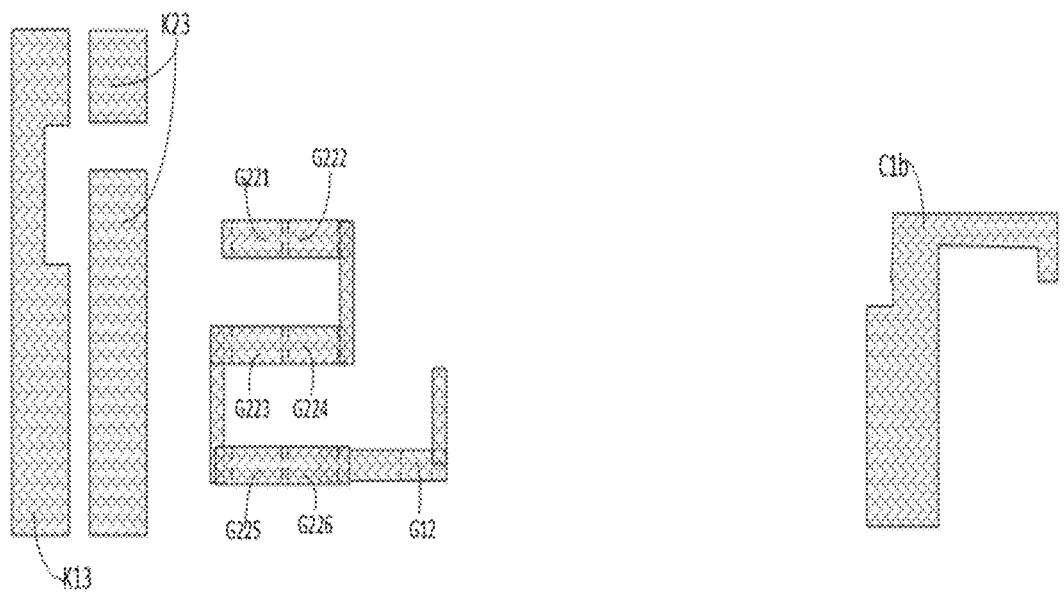
FIG. 43 is a layout diagram of the third gate metal layer in FIG. 38.
Figure 44:
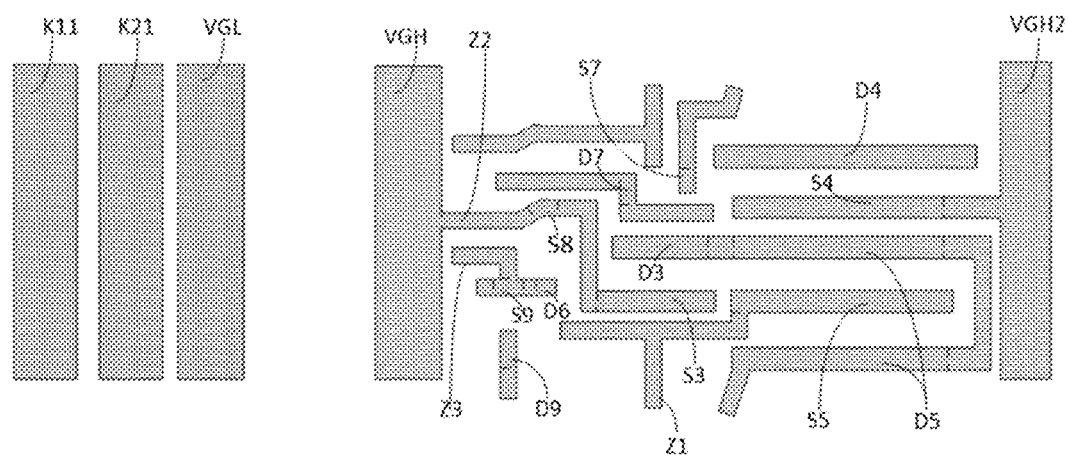
FIG. 44 is a layout diagram of the first source-drain metal layer in FIG. 38.
Figure 45:
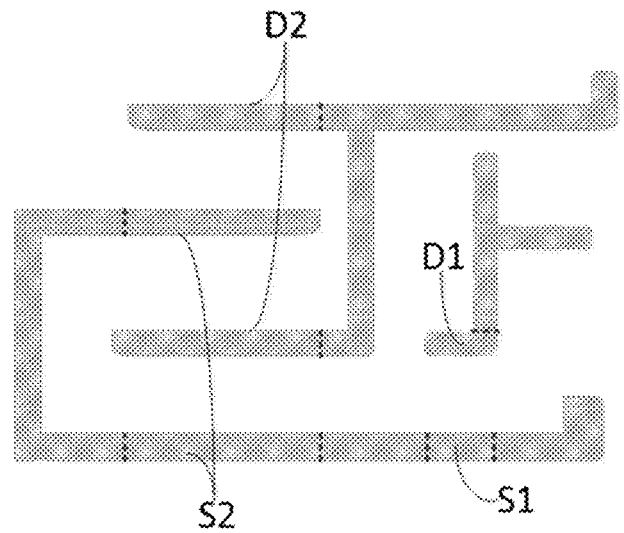
FIG. 45 is a layout diagram of the second source-drain metal layer in FIG. 38.

FIG. 39 is a layout diagram of the first semiconductor layer in FIG. 38, FIG. 40 is a layout diagram of the first gate metal layer in FIG. 38, FIG. 41 is a layout diagram of the second semiconductor layer in FIG. 38, and FIG. 42 is a layout diagram of the second gate metal layer in FIG. 38, FIG. 43 is the layout diagram of the third gate metal layer in FIG. 38, FIG. 44 is the layout diagram of the first source-drain metal layer in FIG. 38, FIG. 45 is the layout diagram of the second source-drain metal layer in FIG. 38.

Figure 49:
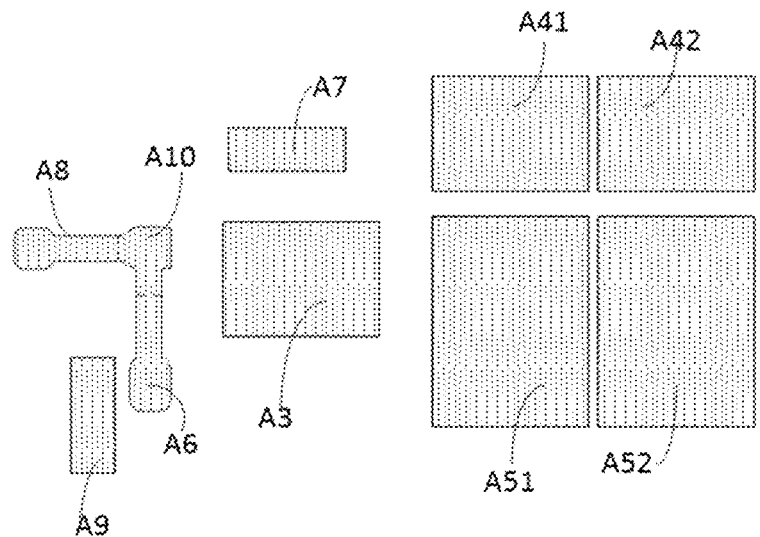
FIG. 49 is a layout diagram of the first semiconductor layer in FIG. 48.
Figure 50:
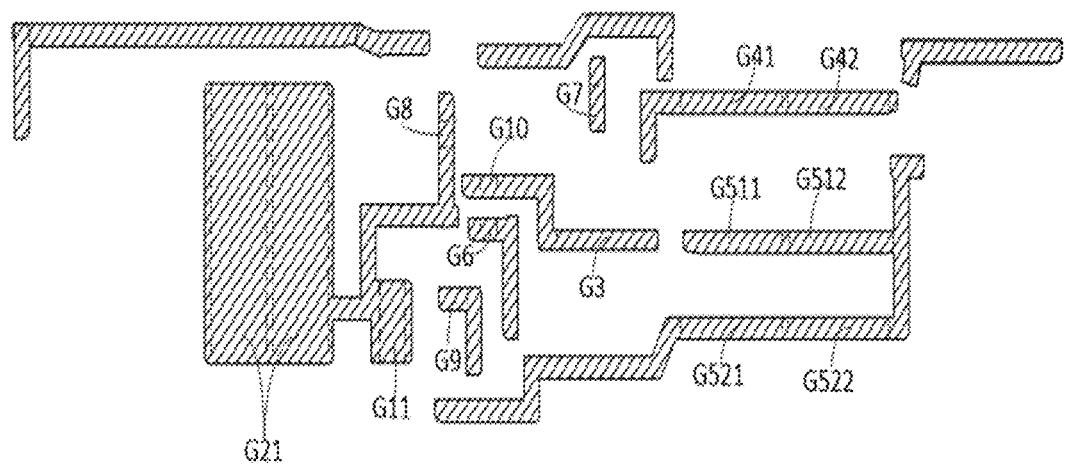
FIG. 50 is a layout diagram of the first gate metal layer in FIG. 48.
Figure 51:
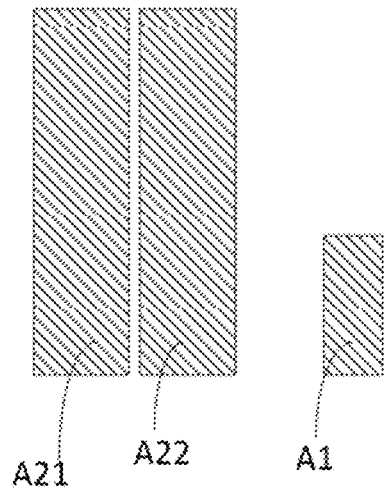
FIG. 51 is a layout diagram of the second semiconductor layer in FIG. 48.
Figure 52:
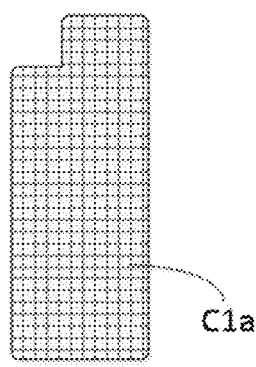
FIG. 52 is a layout diagram of the second gate metal layer in FIG. 48.
Figure 53:
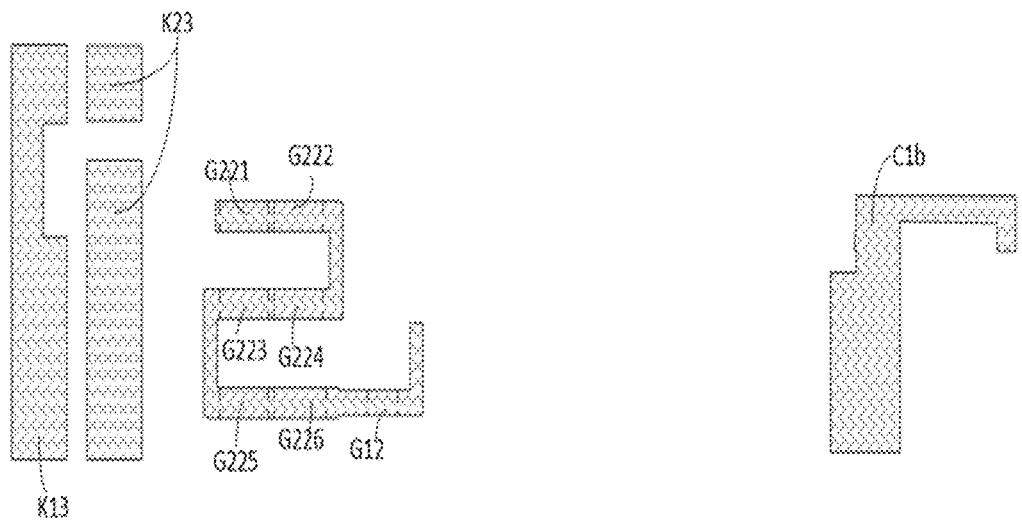
FIG. 53 is a layout diagram of the third gate metal layer in FIG. 48.
Figure 54:
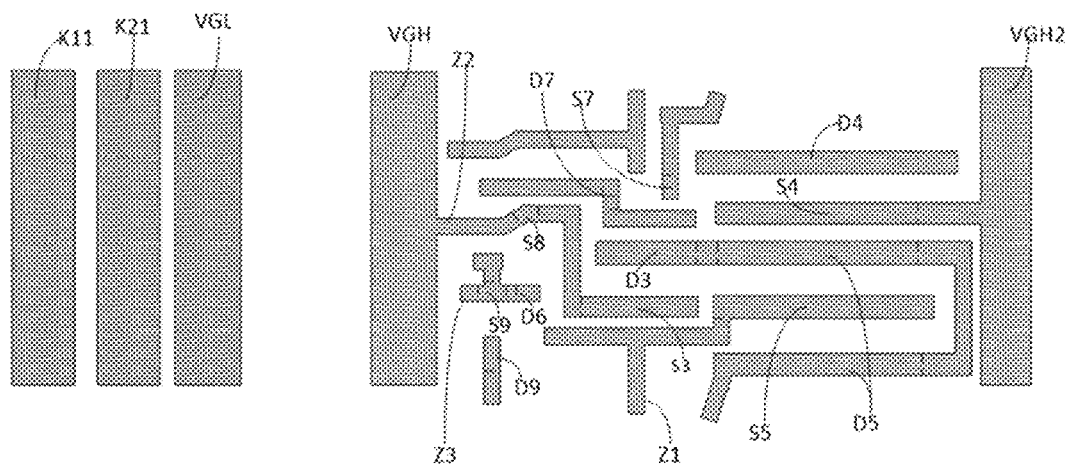
FIG. 54 is a layout diagram of the first source-drain metal layer in FIG. 48.
Figure 55:
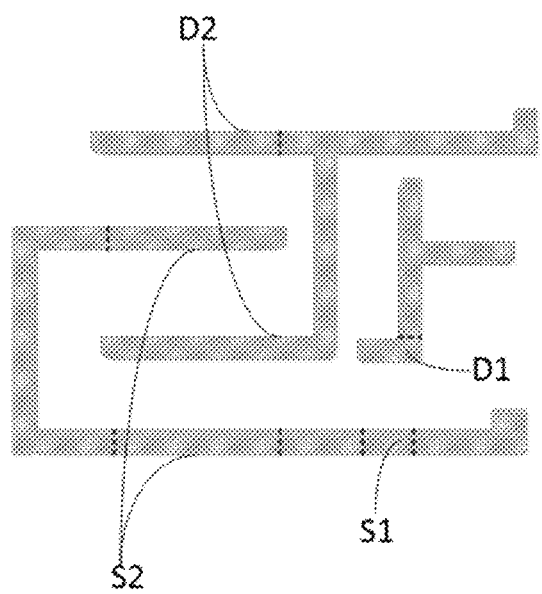
FIG. 55 is a layout diagram of the second source-drain metal layer in FIG. 48.
Figure 56:
FIG. 56 is a layout diagram of the shielding layer in FIG. 48.

FIG. 49 is a layout diagram of the first semiconductor layer in FIG. 48, FIG. 50 is a layout diagram of the first gate metal layer in FIG. 48, FIG. 51 is a layout diagram of the second semiconductor layer in FIG. 48, FIG. 52 is a layout diagram of the second gate metal layer in FIG. 48, FIG. 53 is the layout diagram of the third gate metal layer in FIG. 48, FIG. 54 is the layout diagram of the first source-drain metal layer in FIG. 48, FIG. 55 is the layout diagram of the second source-drain metal layer in FIG. 48, FIG. 56 is the layout diagram of the shielding layer in FIG. 48. The shielding layer may be arranged between the third gate metal layer and the first source-drain metal layer.

Figure 60:
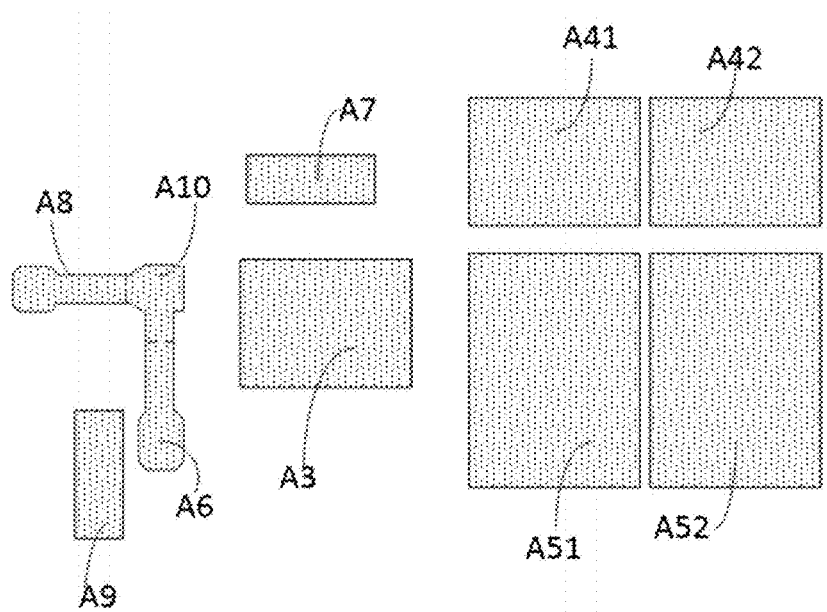
FIG. 60 is a layout diagram of the first semiconductor layer in FIG. 59.
Figure 61:
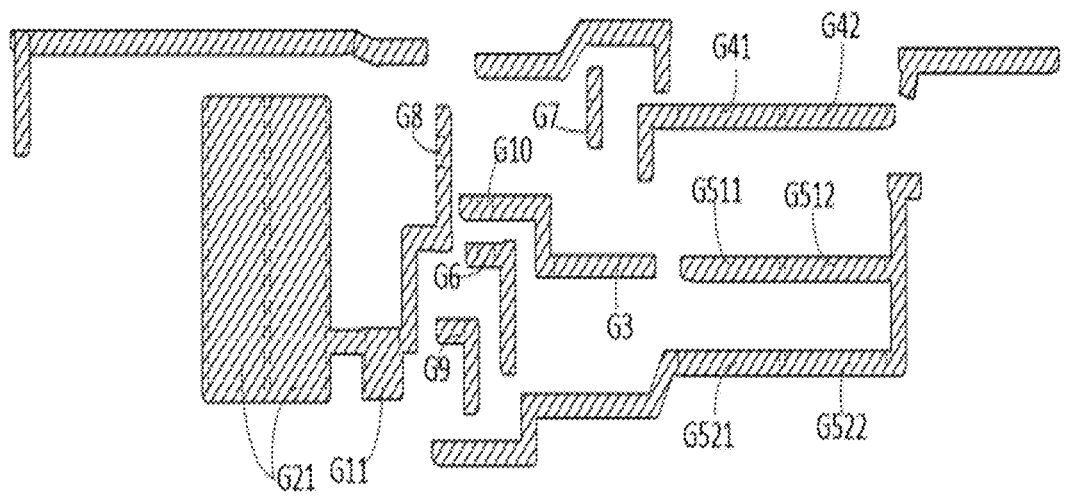
FIG. 61 is a layout diagram of the first gate metal layer in FIG. 59.
Figure 62:
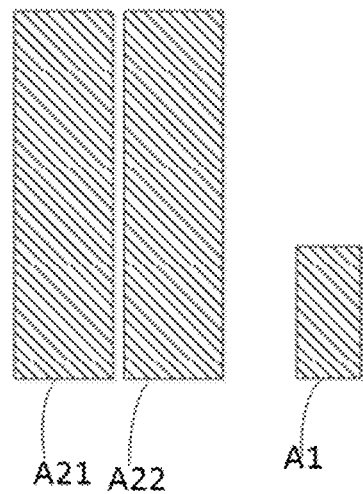
FIG. 62 is a layout diagram of the second semiconductor layer in FIG. 59.
Figure 63:
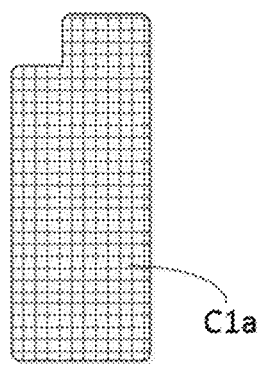
FIG. 63 is a layout diagram of the second gate metal layer in FIG. 59.
Figure 64:
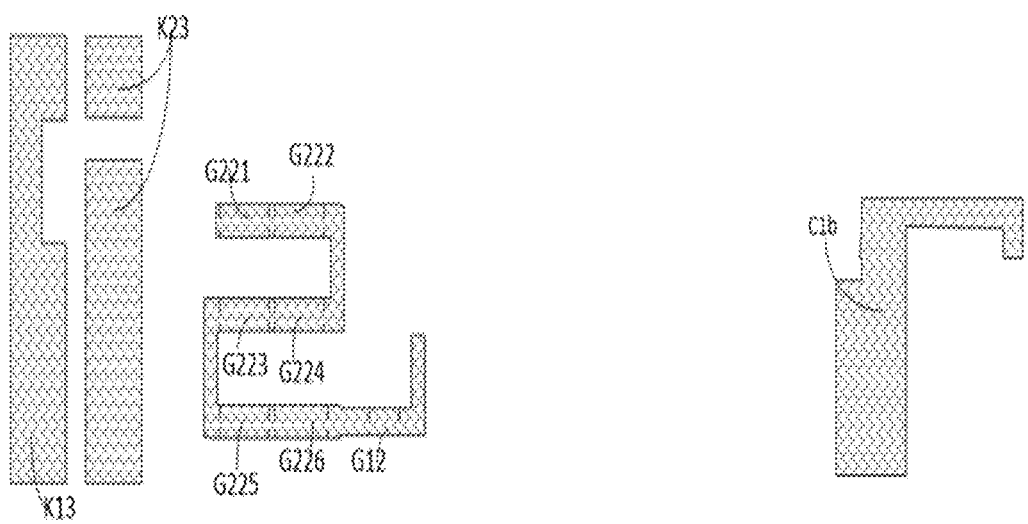
FIG. 64 is a layout diagram of the third gate metal layer in FIG. 59.
Figure 65:
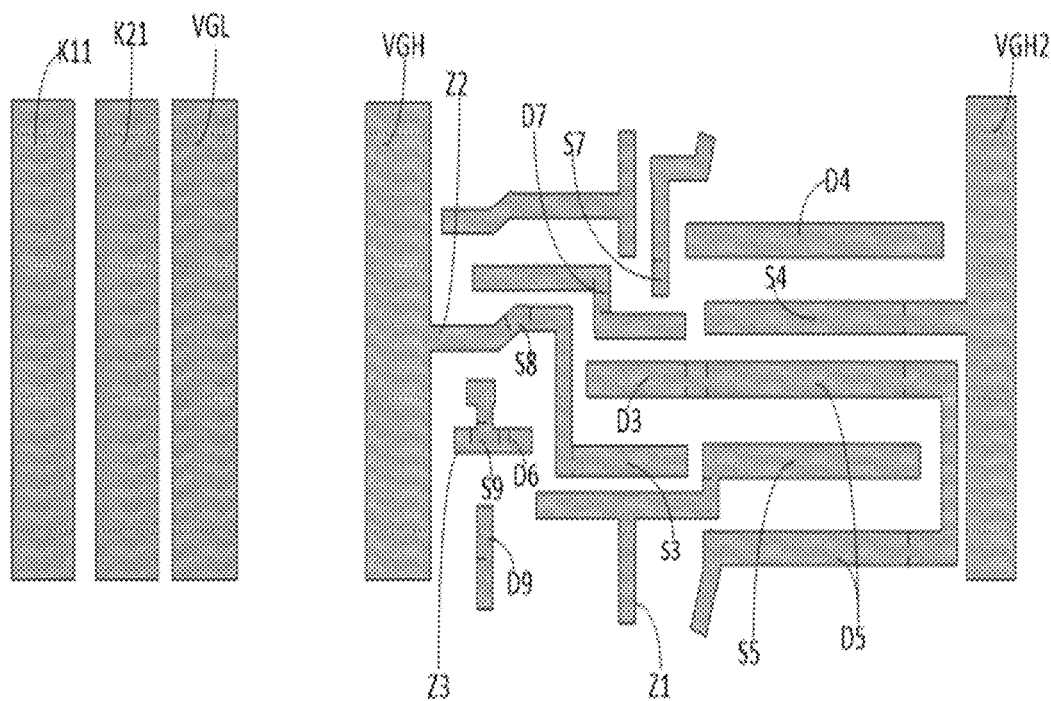
FIG. 65 is a layout diagram of the first source-drain metal layer in FIG. 59.
Figure 66:
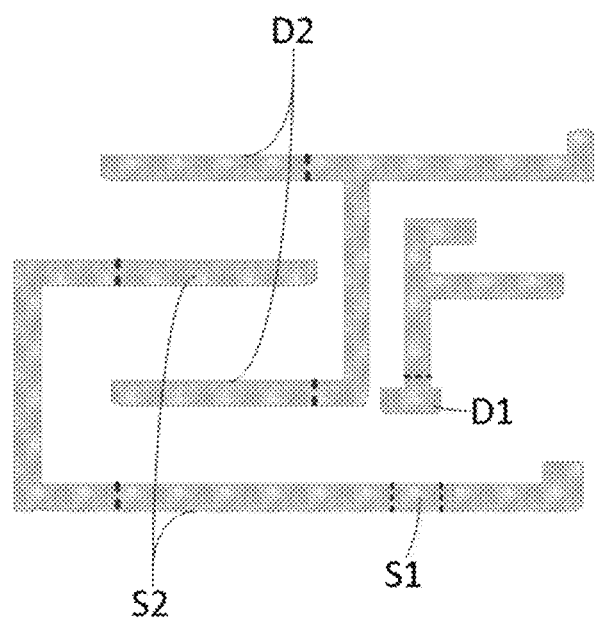
FIG. 66 is a layout diagram of the second source-drain metal layer in FIG. 59.
Figure 67:
FIG. 67 is a layout diagram of the shielding layer in FIG. 59.

FIG. 60 is a layout diagram of the first semiconductor layer in FIG. 59, FIG. 61 is a layout diagram of the first gate metal layer in FIG. 59, FIG. 62 is a layout diagram of the second semiconductor layer in FIG. 59, and FIG. 63 is a layout diagram of the second gate metal layer in FIG. 59, FIG. 64 is the layout diagram of the third gate metal layer in FIG. 59, FIG. 65 is the layout diagram of the first source-drain metal layer in FIG. 59, FIG. 66 is the layout diagram of the second source-drain metal layer in FIG. 59. FIG. 67 is a layout diagram of the shielding layer in FIG. 59. The shielding layer may be arranged between the third gate metal layer and the first source-drain metal layer.

In at least one embodiment of the present disclosure, the display substrate includes a first power line and a second power line; the display substrate further includes a second output circuit; the first input circuit includes a seventh transistor; and the second input circuit includes an eighth transistor; the seventh transistor is a transistor that provides an input voltage to the third node, and the eighth transistor inputs the first voltage signal provided by the first power line to a transistor at the second node under the control of the potential of the third node; the fourth transistor is a transistor included in the second output circuit that outputs a third voltage signal;

The extension direction of the active layer of the seventh transistor is the same as or perpendicular to the extension direction of the active layer of the eighth transistor;

In the same stage of driving circuit, the position of the first electrode of the seventh transistor in the second direction is lower than the position of the second electrode of the fourth transistor in the second direction.

In at least one embodiment of the present disclosure, the second direction may be a vertical direction, but is not limited thereto.

In at least one embodiment of the display substrate shown in FIGS. 27 to 34, the extension direction of the active layer A7 of T7 is perpendicular to the extension direction of the active layer A8 of T8;

In at least one embodiment of the display substrate shown in FIG. 38, at least one embodiment of the display substrate shown in FIG. 48, and at least one embodiment of the display substrate shown in FIG. 59, the extension direction of the active layer A7 of T7 is parallel to the extension direction of the active layer A8 of T8.

In at least one embodiment of the display substrate shown in FIG. 27, at least one embodiment of the display substrate shown in FIG. 38, at least one embodiment of the display substrate shown in FIG. 48, and at least one embodiment of the display substrate shown in FIG. 59, the position of the first electrode S7 of the seventh transistor T7 in the second direction is lower than the position of the second electrode D4 of the fourth transistor T4 in the second direction.

In at least one embodiment of the present disclosure, as shown in FIGS. 33, 44, 54 and 65, the position of the first electrode S7 of the seventh transistor T7 in the second direction is set lower than the position of the second electrode D4 of the fourth transistor T4 in the second direction (the second direction may be a vertical direction), so that the saved vertical space can be used to lay out the connection electrodes, which is conducive to reducing the vertical height of the driving circuit and achieving high PPI (Pixels Per Inch, pixel density).

In at least one embodiment of the present disclosure, the display substrate includes a first power line, the display substrate further includes a second transfer electrode, and the second transfer electrode and the first power line are an integral structure; the second input circuit includes an eighth transistor; the first output circuit includes a third transistor; the eighth transistor inputs the first voltage signal provided by the first power line to the second node under control of the potential of the third node; the third transistor is a transistor included in the first output circuit that outputs a first voltage signal;

The second transfer electrode includes a first electrode portion, a second electrode portion and a third electrode portion;

The first electrode portion is used as a connection electrode between the first power line and the first electrode of the eighth transistor, and the second electrode portion is a connection electrode between the first electrode of the eighth transistor and the first electrode of the third transistor, the third electrode portion is used as the first electrode of the third transistor;

The angle between the first electrode portion and the second electrode portion is greater than or equal to 90 degrees and less than or equal to 120 degrees.

Figure 35:
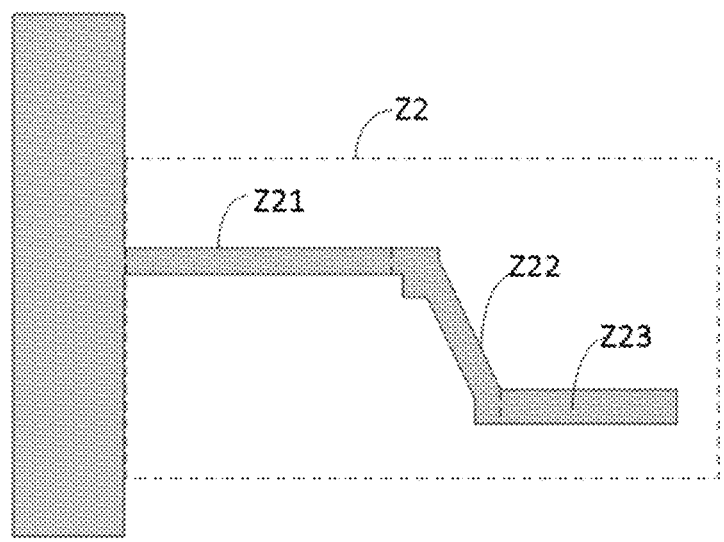
FIG. 35 is a structural diagram of the second transfer electrode in FIG. 33.
Figure 46:
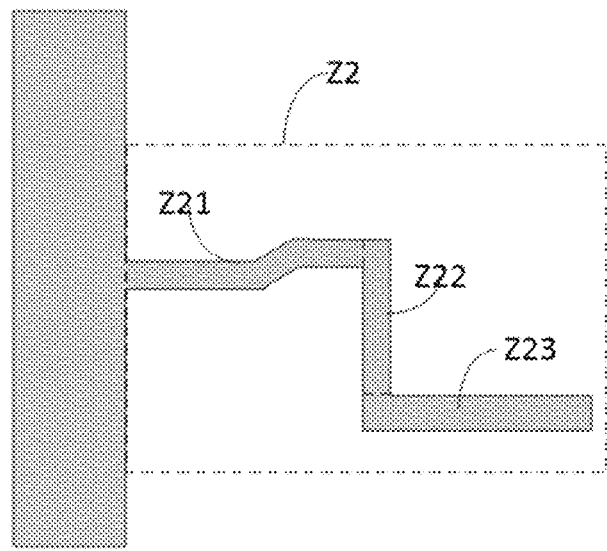
FIG. 46 is a structural diagram of the second transfer electrode Z2 in FIG. 44.

In FIGS. 33, 44, 54 and 65, the one labeled Z2 is the second transfer electrode;

In FIG. 35, the one labeled Z2 is the second transfer electrode in FIG. 33, and in FIG. 46, the one labeled Z2 is the second transfer electrode in FIG. 44.

As shown in FIGS. 35 and 46, the second transfer electrode Z2 includes a first electrode portion Z21, a second electrode portion Z22 and a third electrode portion Z23;

The first electrode portion Z21 is used as a connection electrode between the first power line VGH and the first electrode S8 of the eighth transistor T8, and the second electrode portion Z22 is a connection electrode between the first electrode S8 of the eighth transistor T8 and the first electrode S3 of the third transistor T3, and the third electrode portion Z23 is used as the first electrode S3 of the third transistor T3.

In FIG. 33, the one labeled D8 is the second electrode of T8, the one labeled S8 is the first electrode of T8, the one labeled D3 is the second electrode of T3, the one labeled S3 is the first electrode of T3, the one labeled S4 is the first electrode of T4, the one labeled D4 is the second electrode of T4, the one labeled S5 is the first electrode of T5, the one labeled D5 is the second electrode of T5, and the one labeled S7 is the first electrode of T7, the one labeled D7 is the second electrode of T7, the one labeled S9 is the first electrode of T9, the one labeled D9 is the second electrode of T9, and the one labeled D6 is the second electrode of T6.

In FIGS. 44, 54 and 65, the one labeled S8 is the first electrode of T8, the one labeled D3 is the second electrode of T3, the one labeled S3 is the first electrode of T3, and the one labeled S4 is the first electrode of T4, the one labeled D4 is the second electrode of T4, the one labeled S5 is the first electrode of T5, the one labeled D5 is the second electrode of T5, the one labeled S7 is the first electrode of T7, the one labeled D7 is the second electrode of T7, the one labeled S9 is the first electrode of T9, the one labeled D9 is the second electrode of T9, and the one labeled D6 is the second electrode of T6.

As shown in FIG. 35, the angle between the first electrode portion Z21 and the second electrode portion Z22 is greater than 90 degrees and less than or equal to 120 degrees.

As shown in FIG. 46, the included angle between the first electrode portion Z21 and the second electrode portion Z22 is equal to 90 degrees.

In FIGS. 34, 45, 55 and 66, the one labeled S2 is the first electrode of T2, the one labeled D2 is the second electrode of T2, the one labeled S1 is the first electrode of T1, and the one labeled D1 is the second electrode of T1.

As shown in FIGS. 27 to 34, 38 to 45, 48 to 56, and 48 to 68, S1 and S2 are integrally formed, and S2 is electrically connected to the second power line VGL through a via hole.

The display substrate according to at least one embodiment of the present disclosure further includes a third transfer electrode; the third transfer electrode includes a fourth electrode portion, a fifth electrode portion and a sixth electrode portion; the second input circuit includes a first transistor and an eighth transistor; the first transistor is a transistor that inputs the second voltage signal provided by the second power line to the second node under the control of the potential of the third node; the driving circuit also includes a second output circuit, the second output circuit includes a second transistor; the second transistor is a transistor that outputs the second voltage signal provided by the second power line to the second driving signal output terminal under the control of the potential of the third node; the eighth transistor is a transistor that inputs the first voltage signal provided by the first power line to the second node under the control of the potential of the third node; the control circuit includes a sixth transistor and a ninth transistor, the sixth transistor is a transistor that operates under the control of a clock signal;

The ninth transistor is a transistor that controls the connection between the third node and the first node under the control of the second voltage signal provided by the second power line; the first transistor and the second transistor are the first type of transistors, the eighth transistor and the ninth transistor are second type of transistors;

The fourth electrode portion is used to electrically connect the bottom gate electrode of the first transistor and the gate electrode of the eighth transistor; and/or, the fourth electrode portion is used to electrically connect the bottom gate electrode of the second transistor and the gate electrode of the eighth transistor;

The fifth electrode portion is used to electrically connect the fourth electrode portion, the first electrode of the ninth transistor and the top gate electrode of the first transistor; and/or the fifth electrode portion is used to electrically connect the fourth electrode portion, the first electrode of the ninth transistor, and the top gate electrode of the second transistor;

The sixth electrode portion is used to electrically connect the first electrode of the ninth transistor and the second electrode of the sixth transistor.

Optionally, the angle between the fourth electrode portion and the fifth electrode portion is greater than or equal to 90 degrees and less than 130 degrees.

Optionally, the fifth electrode portion is perpendicular or parallel to the sixth electrode portion.

Figure 36:
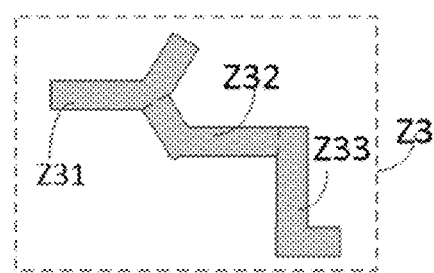
FIG. 36 is a structural diagram of the third transfer electrode in FIG. 33.
Figure 47:
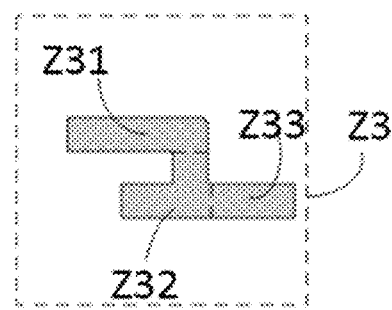
FIG. 47 is a structural diagram of the third transfer electrode Z3 in FIG. 44.

In FIGS. 33, 44, 54 and 65, the one labeled Z3 is the third transfer electrode;

In FIG. 36, the one labeled Z3 is the third transfer electrode in FIG. 33. In FIG. 47, the one labeled Z3 is the third transfer electrode in FIG. 44; in FIG. 57, the one labeled Z3 is the third transfer electrode in FIG. 54.

Figure 57:
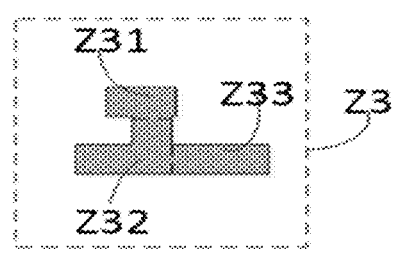
FIG. 57 is a structural diagram of the third transfer electrode Z3 in FIG. 54.

As shown in FIGS. 36, 47 and 57, the third transfer electrode Z3 includes a fourth electrode portion Z31, a fifth electrode portion Z32 and a sixth electrode portion Z33;

The fourth electrode portion Z31 is used to electrically connect the bottom gate electrode G11 of the first transistor T1 and the gate electrode G8 of the eighth transistor T8; the fourth electrode portion Z31 is used to electrically connect the bottom gate electrode G21 of the second transistor T2 and the gate electrode G8 of the eighth transistor T8;

The fifth electrode portion Z32 is used to electrically connect the fourth electrode portion Z31, the first electrode S9 of the ninth transistor T9 and the top gate electrode G12 of the first transistor T1; the fifth electrode portion Z32 is used to electrically connect the fourth electrode portion Z31, the first electrode S9 of the ninth transistor T9, and the top gate electrode of the second transistor T2;

The sixth electrode portion Z33 is used to electrically connect the first electrode S9 of the ninth transistor T9 and the second electrode D6 of the sixth transistor T6.

As shown in FIG. 36, the angle between Z31 and Z32 is greater than 90 degrees and less than or equal to 130 degrees.

As shown in FIG. 47 and FIG. 57, the angle between Z31 and Z32 is equal to 90 degrees.

As shown in FIGS. 36, Z32 and Z33 are perpendicular to each other.

As shown in FIG. 47 and FIGS. 57, Z32 and Z33 are parallel.

In at least one embodiment of the present disclosure, the first output circuit further includes a first capacitor, a first electrode plate of the first capacitor is electrically connected to the first node, and a second electrode plate of the first capacitor is electrically connected to the first driving signal output terminal; the display substrate also includes a first shielding portion;

The first electrode plate of the first capacitor is arranged between the base substrate and the second electrode plate of the first capacitor;

The first shielding portion is arranged on a side of the second electrode plate of the first capacitor away from the base substrate.

As shown in FIGS. 48 to 56 and 59 to 67, the first electrode plate C1a of the first capacitor C1 is arranged between the base substrate and the second electrode plate C1b of the first capacitor C1. The shielding portion B1 is provided on the side of the second electrode plate C1b of the first capacitor away from the base substrate, and the first shielding portion B1 is included in the shielding layer;

The first shielding portion B1 is used to prevent the metal layer arranged between the third power line VGH2 of the first source-drain metal layer and the electrode plate of the first capacitor C1 from generating additional parasitic capacitance. A first shielding portion is arranged between the electrode plate of the first capacitor C1 and the third power line VGH2.

Figure 58:
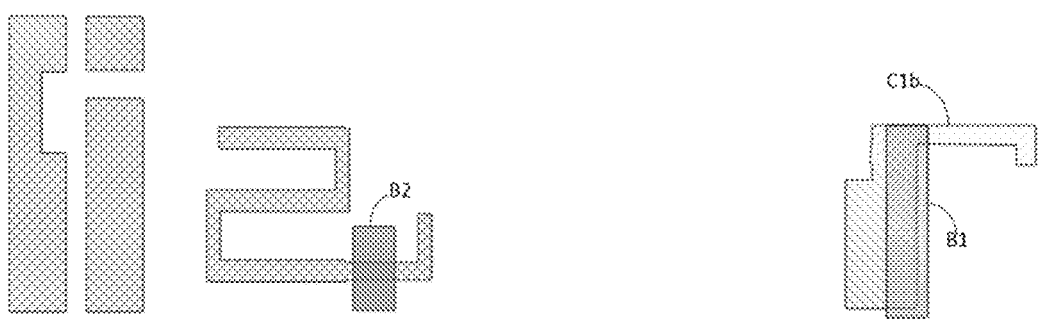
FIG. 58 is an overlapping schematic diagram between the shielding layer shown in FIG. 56 and the third gate metal layer shown in FIG. 53.

FIG. 58 is a schematic diagram of the overlay between the shielding layer shown in FIG. 56 and the third gate metal layer shown in FIG. 53.

Figure 68:
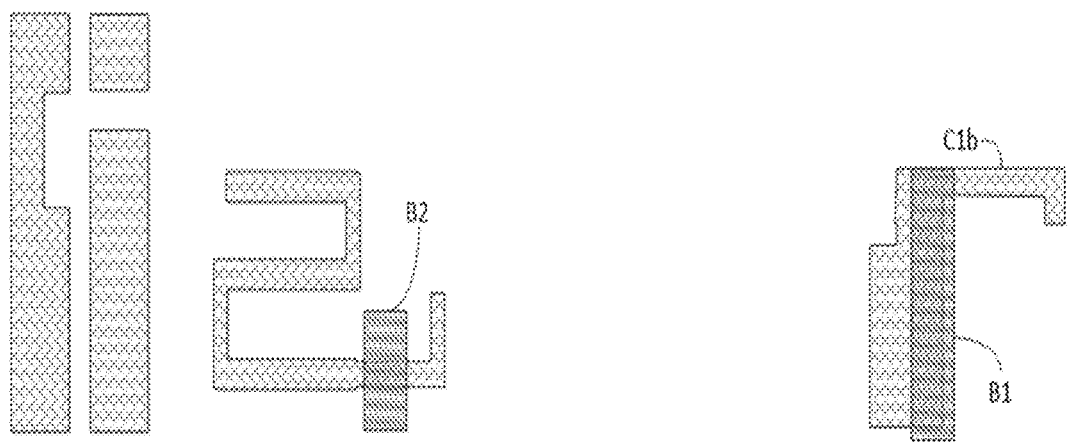
FIG. 68 is an overlapping schematic diagram between the shielding layer shown in FIG. 67 and the third gate metal layer shown in FIG. 64.

FIG. 68 is a schematic diagram of the overlay between the shielding layer shown in FIG. 67 and the third gate metal layer shown in FIG. 64.

The display substrate according to at least one embodiment of the present disclosure further includes a second shielding portion; the second input circuit includes a first transistor;

The second shielding portion is arranged on a side of the active layer of the first transistor away from the base substrate;

An orthographic projection area of the second shielding portion on the power line is larger than an orthographic projection area of the active layer of the first transistor on the power line.

As shown in FIGS. 48 to 56 and 59 to 67, the second shielding portion B2 is included in the shielding layer;

The second shielding portion B2 is provided on the side of the active layer A1 of the first transistor T1 away from the base substrate;

The orthographic projection area of the second shielding portion B2 on the first power line VGH is larger than the orthogonal projection area of the active layer A1 of the first transistor T1 on the first power line VGH.

In specific implementation, a second shielding portion is provided between the first power line VGH and the active layer A1 of the first transistor T1, and the second shielding portion is included in the shielding layer; the second shielding portion is used to shield the parasitic capacitance between the first power line VGH and the active layer A1 of the first transistor T1, and the parasitic capacitance between the first power line VGH and the gate electrode of the first transistor T1 (the gate electrode of the first transistor T1 includes the top gate electrode of the first transistor T1 and the bottom gate electrode of the first transistor T1).

In at least one embodiment of the present disclosure, when there is no overlap between the active layer A1 of the first transistor T1 and the first power line VGH, a shielding layer may also be provided in order to prevent parasitic capacitance from being generated. The shielding layer may be arranged between the third gate metal layer and the first source-drain metal layer.

Compared with FIG. 27, in at least one embodiment of the display substrate shown in FIG. 38, the active layer A8 of the eighth transistor T8 is arranged to extend along the first direction, so that the wiring length of the connection electrodes between the eighth transistor T8 and the first transistor can be reduced, which makes full use of the space on the side of the first power line VGH close to the seventh transistor T7, improves space utilization, and the space above the eighth transistor T8 can be saved to arrange the connection lines between the clock signal line and the transistor, which is conducive to shorten the vertical size, thereby achieving higher resolution. In addition, in order to prevent parasitic capacitance from being generated between the first power line VGH and the oxide, in at least one embodiment of the display panel shown in FIG. 38, the active layer A1 of the first transistor T1 does not overlap to the first power line VGH.

In at least one embodiment of the display substrate shown in FIG. 38, the length of the connection line between the top gate electrode G12 of the first transistor T1 and the second electrode D6 of the sixth transistor T6 and the first electrode S9 of the ninth transistor T9 is reduced. The wiring method is simplified. Through such changes, the length of the shift register in the first direction can be significantly shortened, and the width of at least one power line can be shortened.

Compared with FIG. 48, based on at least one embodiment of the display substrate shown in FIG. 38, the active layer A1 of the first transistor T1 is further moved closer to the second power line VGL, so that the width of the shift register along the first direction is further narrowed.

Compared with FIG. 59, at least one embodiment of the display substrate shown in FIG. 48 has changed the positions of the bottom gate electrode G11 of the first transistor T1 and the second electrode D1 of the first transistor T1 in the first direction;

In at least one embodiment shown in FIG. 48, there is more overlapping between the orthographic projection of the first power line VGH on the base substrate and the orthographic projection of the bottom gate electrode G11 of the first transistor T1 on the base substrate;

In at least one embodiment shown in FIG. 59, there is more overlapping between the orthographic projection of the first power line VGH on the substrate and the orthographic projection of the second electrode D1 of the first transistor T1 on the base substrate.

In at least one embodiment corresponding to FIG. 27, FIG. 38, FIG. 48, and FIG. 59, the first electrode of each P-type transistor and the active layer of the P-type transistor can be electrically connected through a via hole, and the second electrode of each P-type transistor and the active layer of the P-type transistor can also be electrically connected through a via hole;

The first electrode of the N-type transistor and the active layer of the N-type transistor can be electrically connected through a via hole, and the second electrode of the N-type transistor and the active layer of the N-type transistor can be electrically connected through a via hole. However, since the thickness of the oxide semiconductor layer is relatively thin, in order to prevent damage to the oxide semiconductor layer due to drilling; therefore, the first electrode of the N-type transistor and the active layer of the N-type transistor can also be directly electrically connected; the second electrode of the N-type transistor and the active layer of the N-type transistor may also be directly electrically connected.

Figure 69:
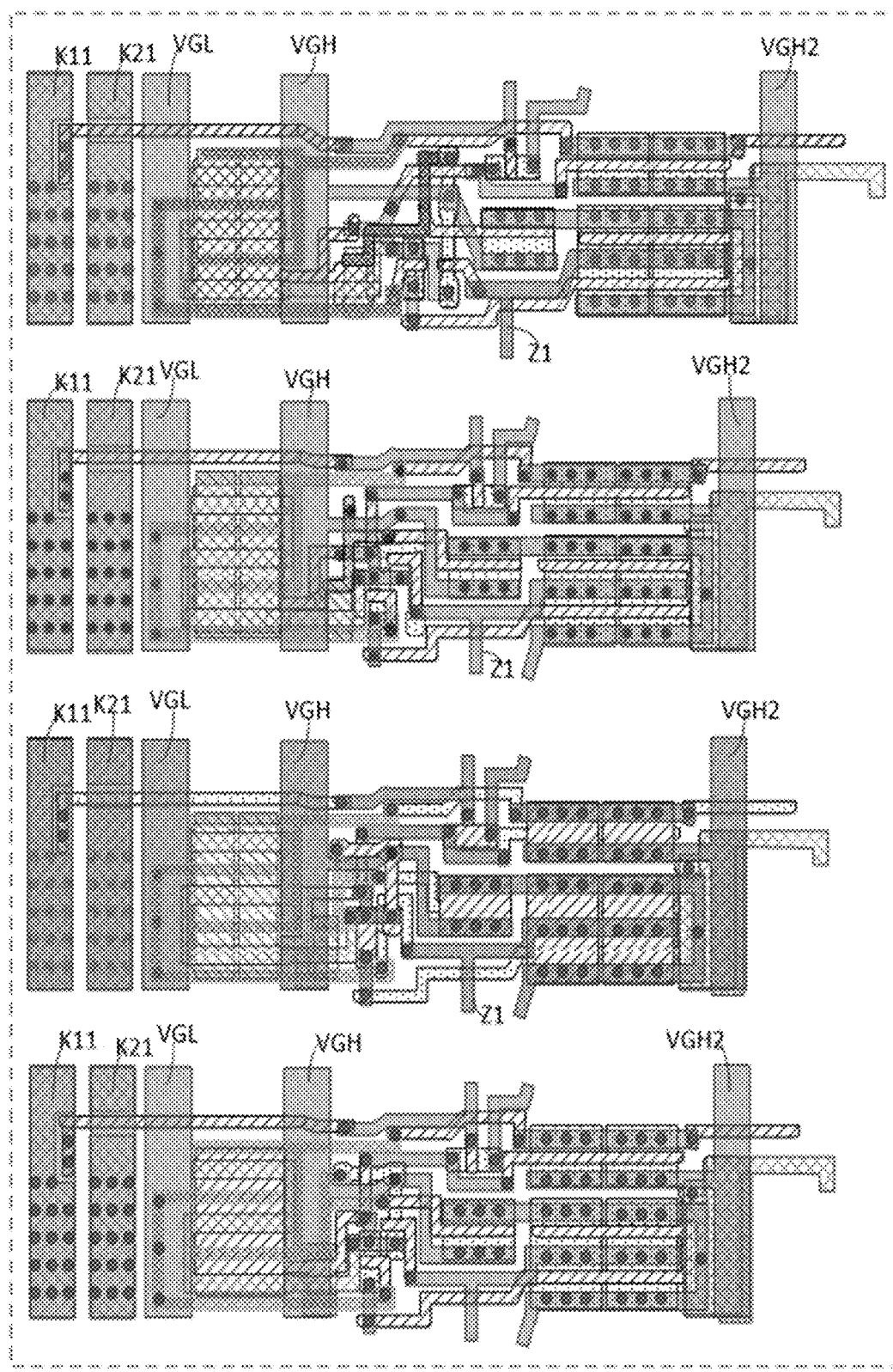
FIG. 69 is a comparative schematic diagram of at least one embodiment corresponding to FIG. 27, at least one embodiment corresponding to FIG. 38, at least one embodiment corresponding to FIG. 48, and at least one embodiment corresponding to FIG. 59.

FIG. 69 is a comparative diagram of at least one embodiment corresponding to FIG. 27, at least one embodiment corresponding to FIG. 38, at least one embodiment corresponding to FIG. 48, and at least one embodiment corresponding to FIG. 59.

As shown in FIG. 69, at least one embodiment corresponding to FIG. 27, at least one embodiment corresponding to FIG. 38, at least one embodiment corresponding to FIG. 48 and at least one embodiment corresponding to FIG. 59 are arranged in order from top to bottom, the width along the first direction of at least one embodiment of the driving circuit corresponding to FIG. 27, the width along the first direction of at least one embodiment of the driving circuit corresponding to FIG. 38 and the width along the first direction of at least one embodiment of the driving circuit corresponding to FIG. 48 gradually becomes narrower along the first direction, which is conducive to achieving the narrow frame.

Figure 70:
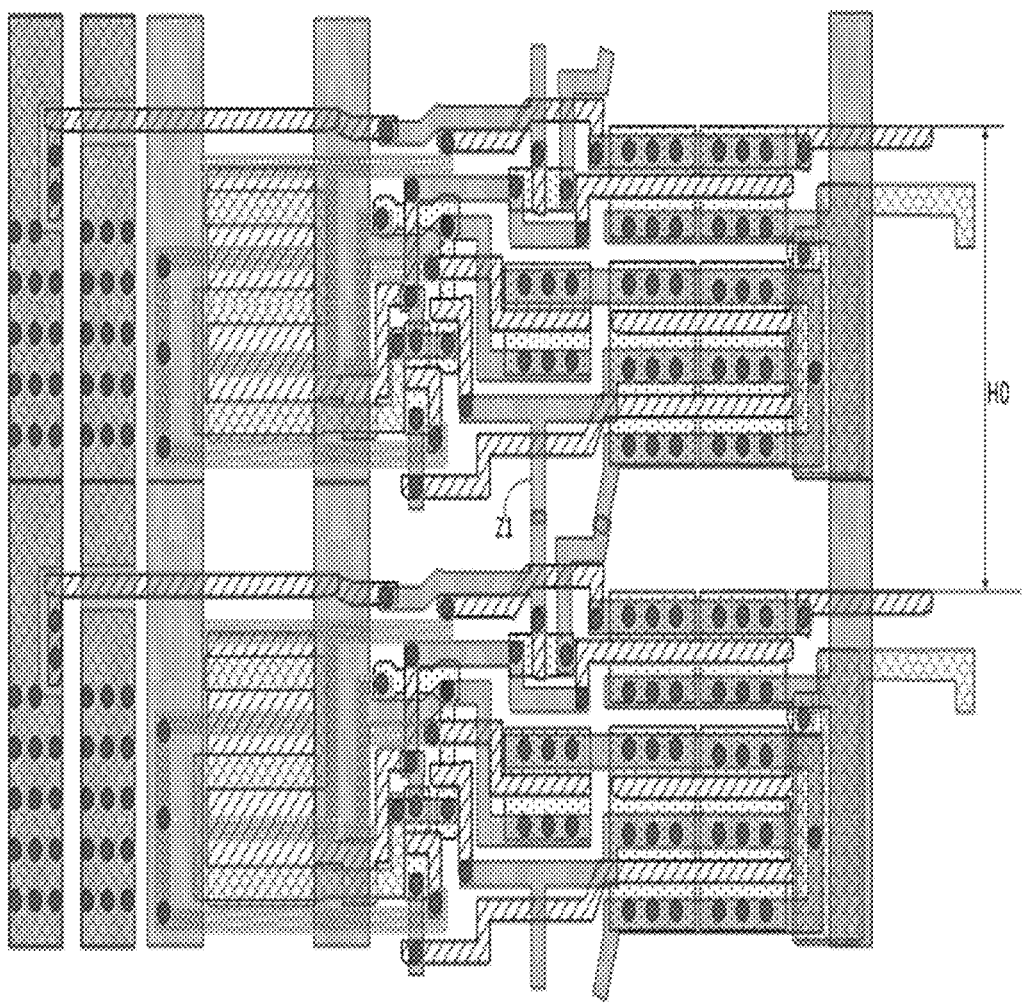
FIG. 70 is a layout diagram of adjacent two stages of driving circuits.

FIG. 70 is a layout diagram of at least one embodiment of an adjacent two stages of driving circuits. The structure of the driving circuit is shown in FIG. 59.

As shown in FIG. 70, the first electrode of the fifth transistor T5 in the current stage of driving circuit is electrically connected to the first clock signal line of the adjacent next stage of driving circuit, and the gate signal connection line of the seventh transistor T7 in the adjacent next stage of driving circuit is also connected to the first electrode of the fifth transistor T5 in the current stage of driving circuit, which can save the wiring of the clock signal line.

As shown in FIG. 70, the first transfer electrode Z1 is used to electrically connect the first electrode S5 of the fifth transistor T5 in the current stage of driving circuit and the gate electrode G6 of the sixth transistor T6 in the current stage of driving circuit, and so the first transfer electrode Z1 is used to electrically connect the gate electrode G6 of the sixth transistor T6 in the current stage of driving circuit and the gate electrode of the seventh transistor T7 included in the adjacent next stage of driving circuit.

As shown in FIG. 70, the height H0 of one stage of driving circuit can be the distance between the upper edge of the active layer of the fourth transistor in the current stage of driving circuit and the upper edge of the fourth transistor in the adjacent next stage of driving circuit, but not limited to this.

Figure 71:
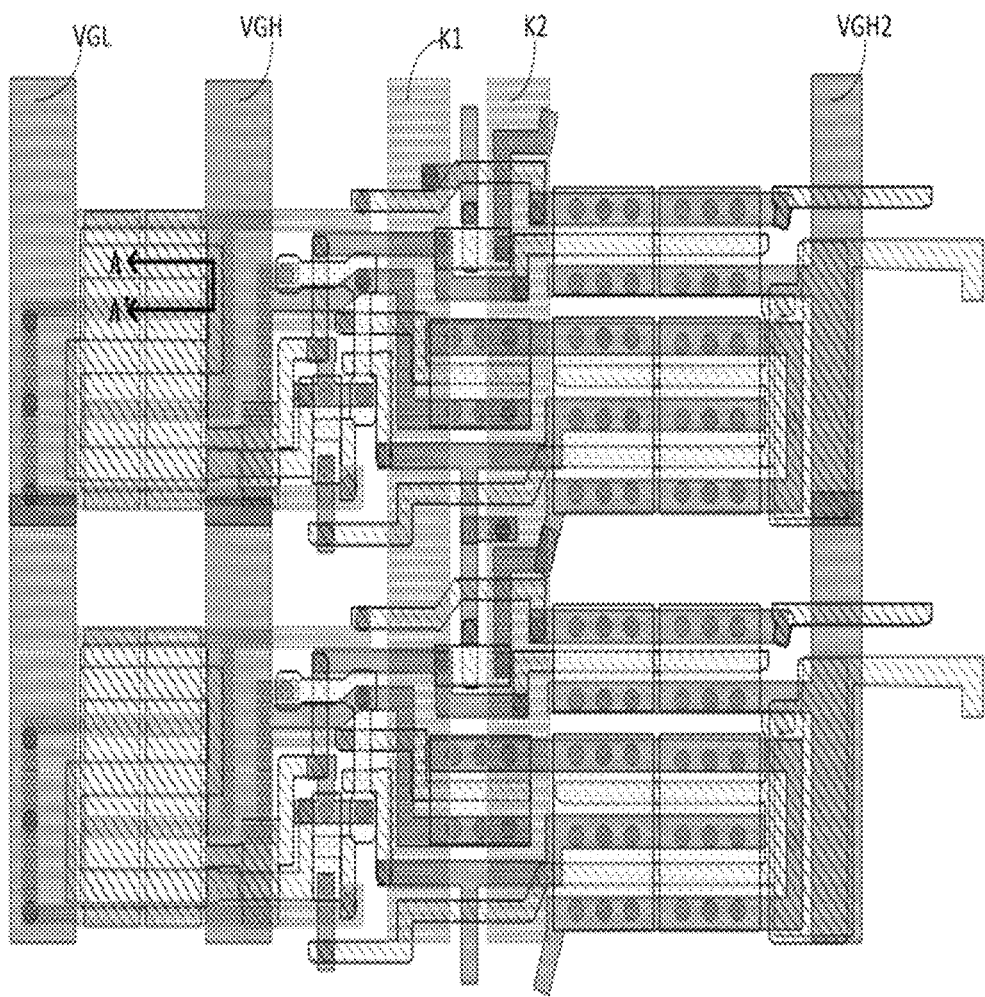
FIG. 71 is a layout diagram of adjacent two stages of driving circuits.

FIG. 71 is a layout diagram of at least one embodiment of an adjacent two stages of driving circuits.

The difference between the layout diagram shown in FIG. 71 and the layout diagram shown in FIG. 70 is that the first clock signal line K1 and the second clock signal line K2 are arranged between the first power line VGH and the third power line VGH2, and the first clock signal line K1 and the second clock signal line K2 are arranged on the second source-drain metal layer; the gate electrode of the seventh transistor included in the current stage of driving circuit and the clock signal line close to the first power line VGH is electrically connected, and the gate electrode of the seventh transistor of the adjacent next stage of driving circuit is electrically connected to a clock signal line far away from the first power line VGH.

In FIG. 71, the one labeled VGL is the second power line.

Compared with the above embodiments, at least one embodiment shown in FIG. 71 can further reduce the size of the driving circuit in the first direction, and can reduce the width of the two clock signal lines.

In at least one embodiment of the present disclosure, two adjacent driving circuits can be electrically connected to the same two clock signal lines. When the gate electrode of the seventh transistor included in the current stage of driving circuit is connected to the first clock signal, the gate electrode of the seventh transistor included in the next stage of driving circuit is connected to the second clock signal.

Figure 72:
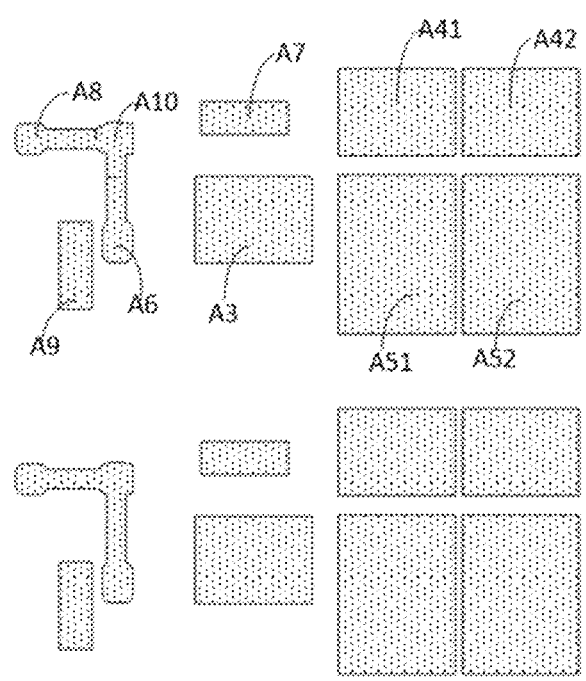
FIG. 72 is a layout diagram of the first semiconductor layer in FIG. 71.
Figure 73:
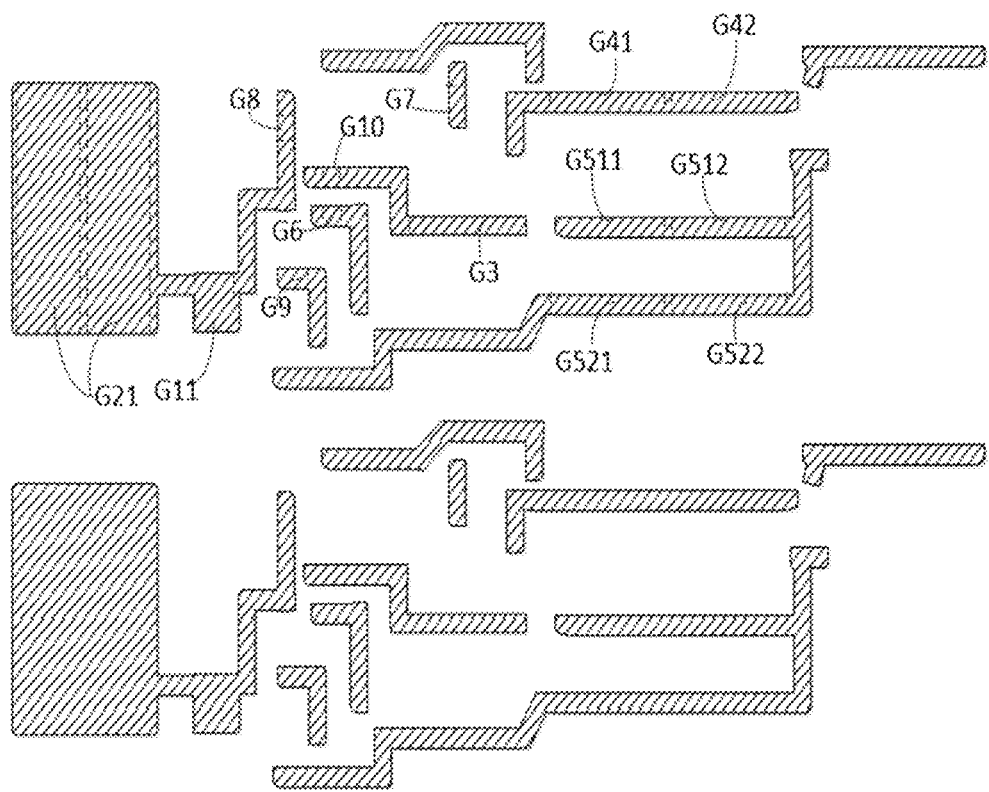
FIG. 73 is a layout diagram of the first gate metal layer in FIG. 71.
Figure 74:
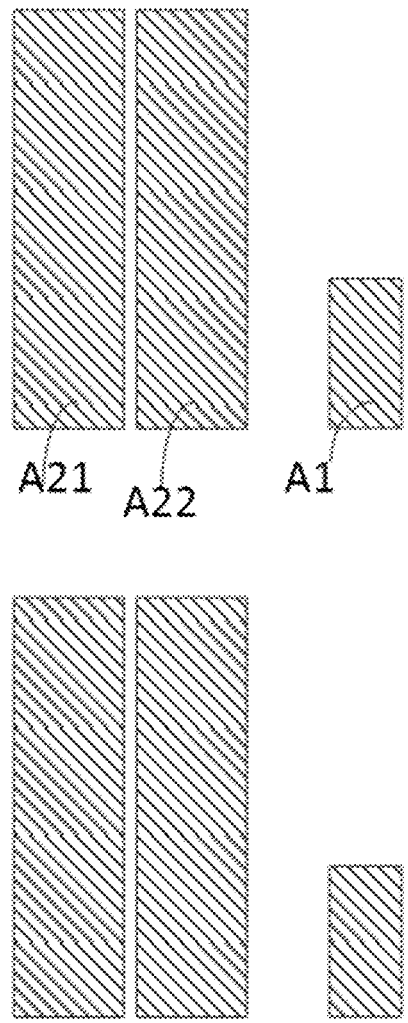
FIG. 74 is a layout diagram of the second semiconductor layer in FIG. 71.
Figure 75:
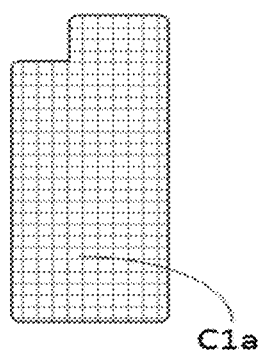
FIG. 75 is a layout diagram of the second gate metal layer in FIG. 71.
Figure 75:
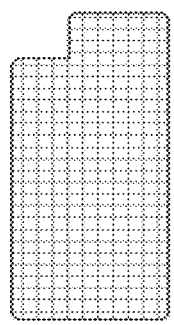
Figure 76:
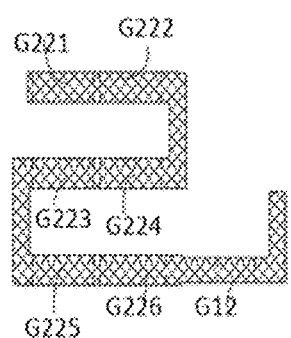
FIG. 76 is a layout diagram of the third gate metal layer in FIG. 71.
Figure 76:
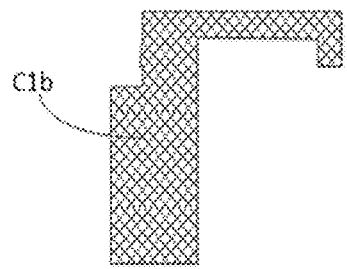
Figure 76:
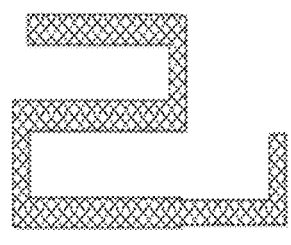
Figure 76:
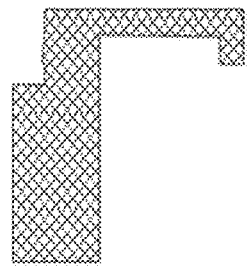
Figure 77:
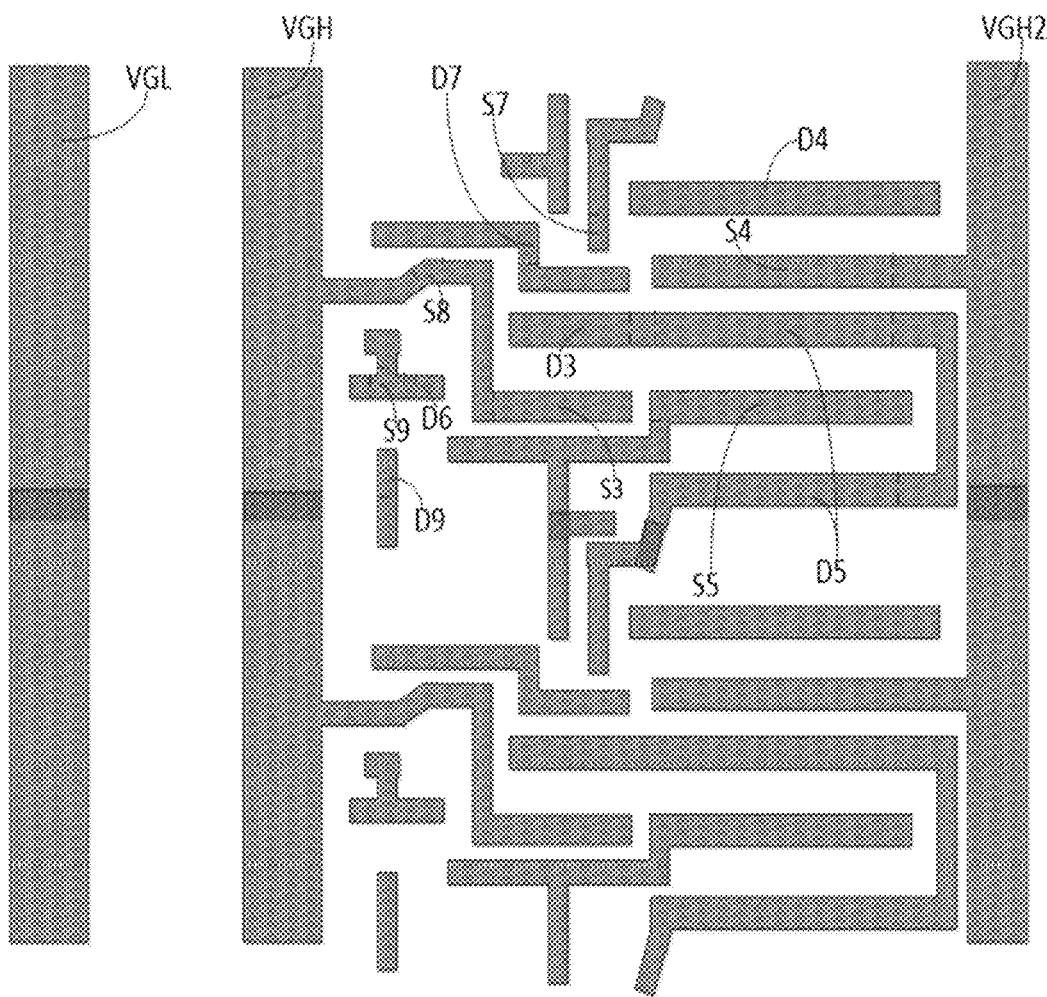
FIG. 77 is a layout diagram of the first source-drain metal layer in FIG. 71.
Figure 78:
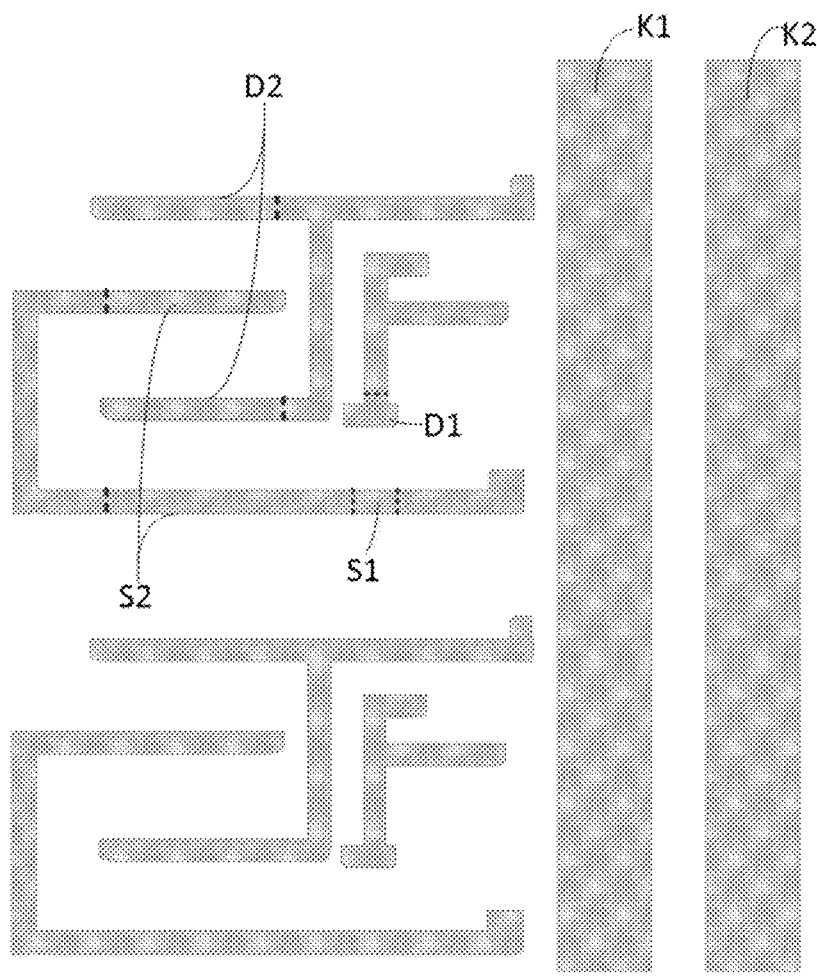
FIG. 78 is a layout diagram of the second source-drain metal layer in FIG. 71.

FIG. 72 is a layout diagram of the first semiconductor layer in FIG. 71, FIG. 73 is a layout diagram of the first gate metal layer in FIG. 71, FIG. 74 is a layout diagram of the second semiconductor layer in FIG. 71, and FIG. 75 is a layout diagram of the second gate metal layer in FIG. 71, FIG. 76 is the layout diagram of the third gate metal layer in FIG. 71, FIG. 77 is the layout diagram of the first source-drain metal layer in FIG. 71, FIG. 78 is the layout diagram of the second source-drain metal layer in FIG. 71.

In FIG. 72, A3 is the first active portion, A41 is the first second active portion, A42 is the second second active portion, A51 is the first third active portion, A52 is the second third active portion; A8 is the active layer of the eighth transistor, A10 is the active layer of the tenth transistor, A6 is the active layer of the sixth transistor, A7 is the active layer of the seventh transistor, A9 is the active layer of the ninth transistor, A8, A10 and A6 are continuous with each other.

In FIG. 73, G41 is the first gate pattern of the fourth transistor, G42 is the second gate pattern of the fourth transistor, and G511 is the first gate pattern of the fifth transistor. G512 is the second gate pattern of the fifth transistor, G521 is the third gate pattern of the fifth transistor, and G522 is the fourth gate pattern of the fifth transistor; G41 and G42 are formed integrally. G5111, G512, G521 and G522 are formed integrally;

G21 is the bottom gate electrode of the second transistor, G11 is the bottom gate electrode of the first transistor, G3 is the gate electrode of the third transistor, G6 is the gate electrode of the sixth transistor. G7 is the gate electrode of the seventh transistor, G8 is the gate electrode of the eighth transistor, G9 is the gate electrode of the ninth transistor, and G10 is the gate electrode of the tenth transistor.

In FIG. 74, A21 is the first active layer pattern of the second transistor, A22 is the second active layer pattern of the second transistor, and A1 is the active layer of the first transistor.

In FIG. 75, the one labeled C1a is the first electrode plate of the first capacitor.

In FIG. 76, the first gate pattern included in the top gate electrode of the second transistor is labeled G221, the second gate pattern included in the top gate electrode of the second transistor is labeled G222, and the third gate pattern included in the top gate electrode of the second transistor is labeled G223, the fourth gate pattern included in the top gate electrode of the second transistor is labeled G224, the fifth gate pattern included in the top gate electrode of the second transistor is labeled G225, and the sixth gate pattern included in the top gate electrode of the second transistor is labeled G226, the one labeled G12 is the top gate electrode of the first transistor, and the one labeled C1b is the second electrode plate of the first capacitor.

In FIG. 77, the one labeled S8 is the first electrode of T8, the one labeled D3 is the second electrode of T3, the one labeled S3 is the first electrode of T3, the one labeled S4 is the first electrode of T4, the one labeled D4 is the second electrode of T4, the one labeled S5 is the first electrode of T5, the one labeled D5 is the second electrode of T5, the one labeled S7 is the first electrode of T7, and the one labeled D7 is the second electrode of T7, the one labeled S9 is the first electrode of T9, the one labeled D9 is the second electrode of T9, the one labeled D6 is the second electrode of T6, the one labeled VGH is the first power line, the one labeled VGL is the second power line, and the one labeled VGH2 is the third power line.

In FIG. 78, the one labeled S2 is the first electrode of the second transistor, the one labeled D2 is the second electrode of the second transistor, the one labeled S1 is the first electrode of the first transistor, and the one labeled D1 is the second electrode of the first transistor, the one labeled K1 is the first clock signal line, and the one labeled K2 is the second clock signal line.

Figure 79:
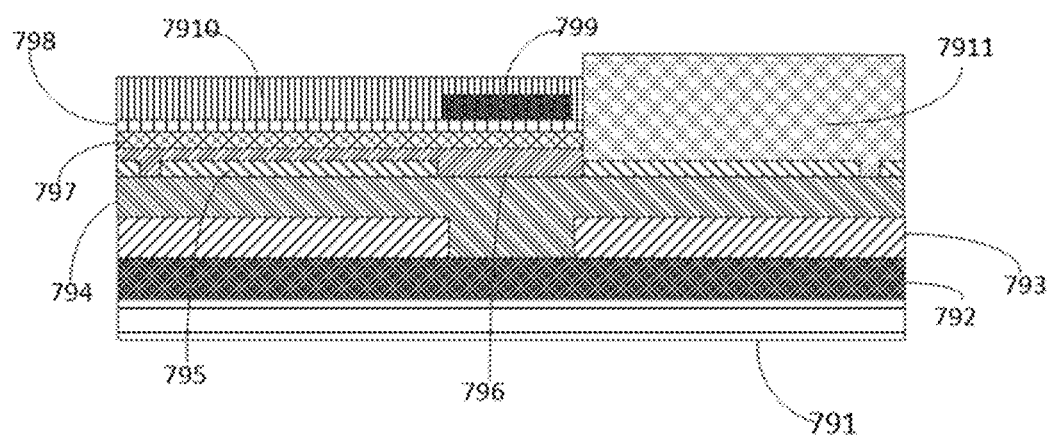
FIG. 79 is a A-A' cross-sectional view in FIG. 71.

FIG. 79 is a cross-sectional view along line A-A' in FIG. 71.

As shown in FIG. 79, the one labeled 791 is the base substrate, the one labeled 792 is the first insulating layer, the one labeled 793 is the first gate metal layer, the one labeled 794 is the second insulating layer, the one labeled 795 is the second semiconductor layer, the one labeled 796 is the third insulating layer, the one labeled 797 is the third gate metal layer, the one labeled 798 is the fourth insulating layer, the one labeled 799 is the first source-drain metal layer, the one labeled 7910 is the fifth insulating layer, the one labeled 7911 is the second source-drain metal layer.

As shown in FIG. 79, the first electrode of the first type of transistor provided on the second source-drain metal layer 7911 is electrically connected to the active layer of the first type of transistor provided on the second semiconductor layer 795. The second electrode of the first type of transistor provided on the second source-drain metal layer 7911 is electrically connected to the active layer of the first type of transistor provided on the second semiconductor layer 795.

In at least one embodiment of the present disclosure, the second semiconductor layer 795 is an oxide semiconductor layer, and the thickness of the second semiconductor layer 795 is relatively thin. For example, the thickness of the second semiconductor layer may be one-tenth of the thickness of the first semiconductor layer; in order to prevent damage to the oxide semiconductor layer caused by drilling, in at least one embodiment of the present disclosure, the second semiconductor layer and the second source-drain metal layer are directly electrically connected, but is not limited to this.

Figure 80:
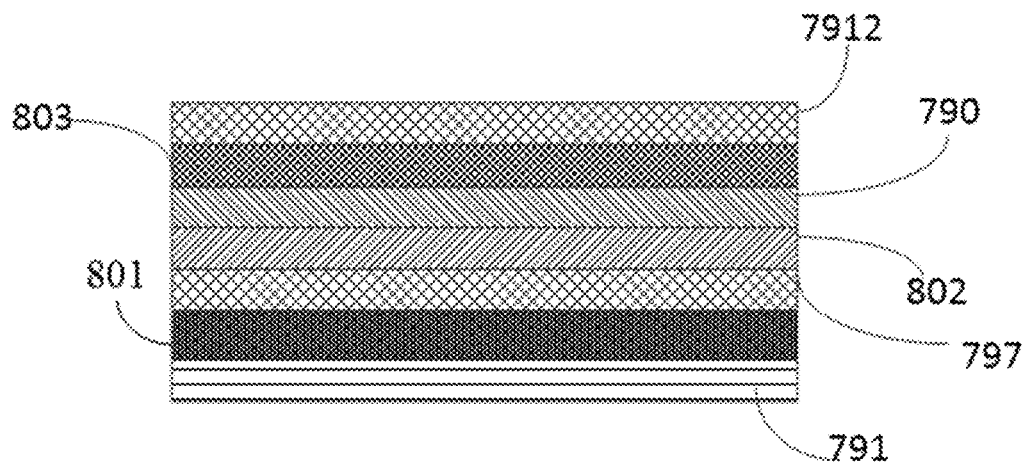
FIG. 80 is a B-B' cross-sectional view in FIG. 59.

FIG. 80 is a B-B' cross-sectional view in FIG. 59.

In FIG. 80, the one labeled 791 is the base substrate, the one labeled 801 is the sixth insulating layer, the one labeled 797 is the third gate metal layer, the one labeled 802 is the seventh insulating layer, the one labeled 790 is the shielding layer, the one labeled 7912 is the first source-drain metal layer, and the one labeled 803 is the eighth insulating layer.

As shown in FIG. 80, the shielding layer 790 is arranged between the third gate metal layer 797 and the first source-drain metal layer 7912, and the first shielding portion is arranged between the second electrode plate of the first capacitor and the third power line, so as to prevent additional parasitic capacitance between the second electrode plate of the first capacitor and the third power line; wherein, the first shielding portion is provided on the shielding layer 790, and the second electrode plate of the first capacitor is provided on the third gate metal layer 797, and the third power line is provided on the first source-drain metal layer 7912, but is not limited to this.

The display substrate according to the embodiment of the present disclosure includes a shift register arranged on the base substrate. The shift register includes a plurality of stages of driving circuits. The driving circuit includes a first input circuit, a second input circuit, a first output circuit. circuit, a control circuit and a second output circuit; the first output circuit is configured to provide a first scanning driving signal to the first driving signal output terminal under the control of the potential of the first node and the potential of the second node; the first input circuit is configured to input a signal to the third node under the control of the clock signal; the second input circuit is configured to input the signal provided by the power line to the second node under the control of the potential of the third node; the control circuit is configured to control the potential of the third node and the potential of the first node; the second output circuit is configured to control to output a second scanning driving signal through the second driving signal output terminal under the control of the potential of the third node; the second input circuit includes a first transistor; the second output circuit includes a second transistor;

The driving circuit is used to provide scanning driving signals for the display area;

The gate electrode of the first transistor is electrically connected to the third node, the first electrode of the first transistor is electrically connected to the second power line, and the second electrode of the first transistor is electrically connected to the second node; the gate electrode of the second transistor is electrically connected to the third node, the first electrode of the second transistor is electrically connected to the second power line, the second electrode of the second transistor is electrically connected to the second driving signal output terminal; the first transistor and the second transistor are N-type transistors;

The ratio of the area of the oxide active layer of the second transistor to the area of the oxide active layer of the first transistor is greater than or equal to 8.74.

In FIG. 19, the one labeled A21 is the first active layer pattern of the second transistor T2, and the one labeled A22 is the second active layer pattern of the second transistor T2; the active layer of the second transistor T2 includes a first active layer pattern A21 of the second transistor T2 and the second active layer pattern A22 of the second transistor T2; the active layer of the second transistor T2 is an oxide active layer, and the active layer A1 of the first transistor T1 is an oxide active layer; the area of the active layer of the second transistor T2 is equal to the sum of the area of A21 and the area of A22, and the ratio between the area of the active layer of the second transistor T2 and the area of A1 is greater than or equal to 8.74.

Optionally, the fourth transistor is a transistor included in the second output circuit that outputs a third voltage signal; the fourth transistor is a P-type transistor; the active layer of the fourth transistor is a low-temperature polysilicon active layer;

The ratio of the area of the oxide active layer of the second transistor to the area of the active layer of the fourth transistor is greater than or equal to 1.4.

In FIG. 19, A41 is the first second active portion, and A42 is the second second active portion. A41 and A42 are used as active layers of the fourth transistor T4. The area of the active layer of the fourth transistor T4 is equal to the sum of the area of A41 and the area of A42;

The ratio of the area of the active layer of the second transistor T2 to the area of the active layer of the fourth transistor T4 is greater than or equal to 1.4.

In at least one embodiment of the present disclosure, the power line includes a first power line and a third power line; the second input circuit is used to input the first voltage signal provided by the first power line to the second node under the control of the potential of the third node; the second output circuit is electrically connected to the third power line, and is used to provide the third voltage signal provided by the third power line to the second driving signal output terminal under the control of the potential of the third node.

The voltage value of the third voltage signal is greater than or equal to the voltage value of the first voltage signal.

Optionally, the voltage value of the third voltage signal is greater than or equal to 1.4 times the voltage value of the first voltage signal.

Optionally, the gate electrode of the first transistor includes a first gate electrode and a second gate electrode, the gate electrode of the second transistor includes a first gate electrode and a second gate electrode, and the first gate electrode is a bottom gate electrode, the second gate electrode is a top gate electrode; the display substrate includes a first gate metal layer, a second gate metal layer and a third gate metal layer stacked along a side away from the base substrate;

The bottom gate electrode is included in the first gate metal layer, and the top gate electrode is included in the second gate metal layer; or the bottom gate electrode is included in the second gate metal layer, and the top gate electrode is included in the third gate metal layer; or, the bottom gate electrode is included in the first gate metal layer, and the top gate electrode is included in the third gate metal layer.

In at least one embodiment of the present disclosure, the first gate electrode of the first transistor and the first gate electrode of the second transistor have an integrated structure, and the second gate electrode of the first transistor and the second gate electrode of the second transistor have an integrated structure. The display substrate also includes a first source-drain metal layer and a second source-drain metal layer arranged on a side of the third gate metal layer away from the base substrate; the first source-drain metal layer is arranged between the third gate metal layer and the second source-drain metal layer;

The first gate electrode of the first transistor and the second gate electrode of the first transistor are electrically connected to each other through the connection electrode, and the connection electrode is included in the first source-drain metal layer or the second source-drain metal layer.

In the embodiments corresponding to FIGS. 27 to 34, the connection electrode may be the third transfer electrode Z3, the first gate electrode of the first transistor T1 is the bottom gate electrode G11 of the first transistor T1, and the second gate electrode of the first transistor T1 is the top gate electrode G12 of the first transistor T1, the first gate electrode of the second transistor T2 is the bottom gate electrode G21 of the second transistor T2, and the second gate electrode of the second transistor T2 is the top gate electrode of the second transistor T2. The bottom gate electrode G11 of the first transistor T1 and the top gate electrode G12 of the first transistor T1 are electrically connected through the third transfer electrode Z3, and the third transfer electrode Z3 is included in the first source-drain metal layer.

The embodiment of the present disclosure provides a series of driving circuits and corresponding layout diagrams. On the premise of reducing current leakage, the transistors and signal lines (the signal lines include power lines and clock signal lines) are reasonably laid out to shorten the width in the first direction and to achieve the narrow frame. The height in the second direction is shortened vertically to achieve high resolution.

The display device according to the embodiment of the present disclosure includes the above-mentioned display substrate.

Figure 81:
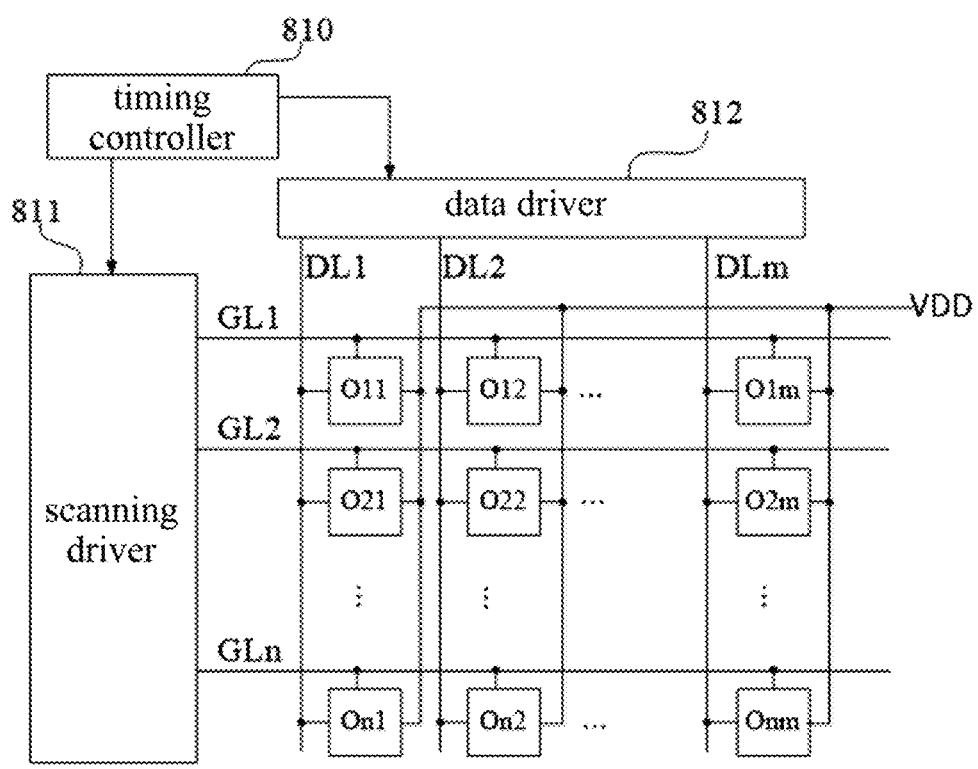
FIG. 81 is a structural diagram of a display device according to at least one embodiment of the present disclosure.

FIG. 81 is a structural diagram of a display device according to at least one embodiment of the present disclosure. In at least one embodiment of the display device shown in FIG. 81, the display device may be an organic light emitting display. For example, the display device may be an organic light emitting diode (OLED) display or a quantum dot light emitting diode (QLED for short) displays or Micro Light Emitting Diodes (Micro LED for short) displays, etc., but are not limited to this.

In FIG. 81, the one labeled O11 is the first row and the first column of pixel circuit, the one labeled O12 is the first row and the second column of pixel circuit, the one labeled O1m is the first row and the mth column of pixel circuit; m is greater than an integer of 2;

The one labeled O21 is the second row and the first column of pixel circuit, the one labeled O22 is the second row and the second column of pixel circuit, and the one labeled O2m is the second row and the mth column pixel circuit;

The one labeled On1 is the nth row and the first column of pixel circuit, the one labeled On2 is the nth row and the second column of pixel circuit, and the one labeled Onm is the nth row and the mth column of pixel circuit; n is an integer greater than 2.

In FIG. 81, the one labeled VDD is a high voltage terminal, and each pixel circuit included in the display device is electrically connected to the high voltage terminal VDD.

As shown in FIG. 81, the pixel circuits located in the first row are all electrically connected to the first row of scanning line GL1, the pixel circuits located in the second row are electrically connected to the second row of scanning line GL2, and the pixel circuits located in the nth row are all electrically connected to the nth row of scanning line GLn;

The pixel circuits located in the first column are all electrically connected to the first column of data line DL1, the pixel circuits located in the second column are all electrically connected to the second column of data line DL2, and the pixel circuits located in the mth column are all electrically connected to the mth column of data line DLm.

As shown in FIG. 81, the display device according to at least one embodiment of the present disclosure also includes a timing controller 810, a scanning driver 811 and a data driver 812;

The timing controller 810 is electrically connected to the scanning driver 811 and the data driver 812 respectively, and is used to provide corresponding control signals to the scanning driver 811 and the data driver 812 respectively;

The scanning driver 811 is electrically connected to the first row of scanning line GL1, the second row of scanning line GL2 and the nth row of scanning line GLn respectively, and is used to provide corresponding scanning signals to the first row of scanning line GL1, the second row of scanning line GL2 and the nth row of scanning line GLn; for example, the scanning driver 81 may sequentially provide corresponding scanning signals to the first row of scanning line GL1 to the nth row of scanning line GLn;

The data driver 812 is electrically connected to the first column of data line DL1, the second column of data line DL2 and the mth column of data line DLm respectively, and is used to provide corresponding data signals to the first column of data line DL1, the second column of data line DL2 and the mth column of data line DLm.

When at least one embodiment of the display device shown in FIG. 81 of the present disclosure is working, the timing controller 81 is also used to send the external data (not shown in FIG. 81) to the data driver 812; the scanning driver 811 is used to provide a scanning signal to the pixel circuit included in the display device. The data driver 812 is used to provide a data signal to the pixel circuit. The pixel circuit is charged with the data signal under the control of the scanning signal, the pixel circuit emits light accordingly.

The display device provided in the embodiment of the present disclosure can be any product or component with a display function such as a mobile phone, a tablet computer, a television, a monitor, a notebook computer, a digital photo frame, a navigator, etc.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A display substrate, comprising a shift register arranged on a base substrate, wherein the shift register includes a plurality of stages of driving circuits; the driving circuit includes a first input circuit, a second input circuit, a first output circuit and a control circuit; the first output circuit is configured to provide a first scanning driving signal to a first driving signal output terminal under the control of a potential of a first node and a potential of a second node; the first input circuit is configured to input a signal to a third node under the control of a clock signal; the second input circuit is configured to input a signal provided by a power line to the second node under the control of a potential of the third node; the control circuit is configured to control the potential of the third node and the potential of the first node;

a plurality of stages of driving circuits are provided in a driving circuit area of the base substrate; wherein a stage of driving circuit area includes a first area and a second area, and a first type of transistor included in the driving circuit is arranged in the first area, a second type of transistor included in the driving circuit is arranged in the second area;

one side of the first area is a side of the power line away from the second area, and the other side of the first area is a side close to the second area of an active layer of the first type of transistor close to the second area;

one side of the second area is a side of the power line away from the first area, and the other side of the second area is the side close to the second area of the active layer of the first type of transistor close to the second area.

2. The display substrate according to claim 1, wherein the power line includes a first power line; the second input circuit is configured to input a first voltage signal provided by a first power line into the second node under the control of the potential of the third node;

$X1/X3 \geq 0.21$;

wherein, X1 is a width of the first area in a first direction, and X3 is a width of the second area in the first direction;

the first direction is a direction intersecting an extending direction of the first power line.

3. The display substrate according to claim 2, wherein the second input circuit includes a first transistor; a gate electrode of the first transistor is electrically connected to the third node, and a first electrode of the first transistor is electrically connected to the second power line, a second electrode of the first transistor is electrically connected to the second node; the first transistor is a first type of transistor;

$WT1/X1 \geq 0.258$;

wherein, WT1 is a width of an active layer of the first transistor along the first direction.

4. The display substrate according to claim 1, wherein the power line includes a second power line; the second input circuit is configured to input a second voltage signal provided by a second power line to the second node under the control of the potential of the third node;

$X1/X3 \geq 0.52$;

wherein, X1 is a width of the first area in a first direction, and X3 is a width of the second area in the first direction;

the first direction is a direction intersecting an extension direction of the second power line.

5. The display substrate according to claim 4, wherein the first type of transistor is an N-type transistor, and the second type of transistor is a P-type transistor;

a distance between at least one of the N-type transistors and the second power line is smaller than a distance between the P-type transistor and the second power line.

6. The display substrate according to claim 4, wherein the driving circuit further includes a second output circuit, and the second output circuit is configured to control the second driving signal output terminal to output the second scanning driving signal under the control of the potential of the third node; the second output circuit includes a second transistor; a gate electrode of the second transistor is electrically connected to the third node, and a first electrode of the second transistor is electrically connected to the second power line, a second electrode of the second transistor is electrically connected to the second driving signal output terminal; the second transistor is a first type of transistor;

$WT2/X1 \geq 0.33$;

WT2 is a width of the active layer of the second transistor along the first direction;

or wherein the second input circuit includes a first transistor; a gate electrode of the first transistor is electrically connected to the third node, and a first electrode of the first transistor is electrically connected to the second power line, a second electrode of the first transistor is electrically connected to the second node; the driving circuit also includes a second output circuit, the second output circuit is configured to control the second driving signal output terminal to output a second scanning driving signal under the control of the potential of the third node; the second output circuit includes a second transistor; a gate electrode of the second transistor is electrically connected to the third node, and a first electrode of the second transistor is electrically connected to the second power line, and a second electrode of the second transistor is electrically connected to the second driving signal output terminal; both the first transistor and the second transistor are first type of transistors;

$WT2/WT1 \geq 3.25$;

the width of the active layer of the first transistor along the first direction is WT1, and WT2 is the width of the active layer of the second transistor along the first direction.

7. The display substrate according to claim 1, wherein the display substrate further includes a clock signal line group arranged in a driving circuit area, the clock signal line group is configured to provide the clock signal;

an active layer of at least one first type of transistor is located between the clock signal line group and the power line in the first direction;

an overlapping area between an orthographic projection of the active layer of at least one first type of transistor on the base substrate and an orthographic projection of the power line on the base substrate is less than or equal to five-sixth of an area of the active layer of the at least one first type of transistor.

8. The display substrate according to claim 1, wherein a ratio of a length of the active layer of at least one first type of transistor along the second direction to a height of the driving circuit is less than or equal to 0.75.

9. The display substrate according to claim 1, wherein the display substrate further includes a first active layer arranged in the second area; the first active layer includes a first active portion, two second active portions, and two third active portions; the display substrate further includes a second output circuit;

the first active portion serves as an active layer of a third transistor, the two second active portions serve as an active layer of a fourth transistor, and the two third active portions serve as an active layer of a fifth transistor;

the third transistor is a transistor included in the first output circuit that outputs a first voltage signal, the fifth transistor is a transistor included in the first output circuit that outputs a clock signal, and the fourth transistor is a transistor included in the second output circuit that outputs a third voltage signal;

a channel area of an nth transistor is ARn, ARn≥2 (n-1) i, where n is equal to 1, 2 or 3, and i is an unit channel area.

10. The display substrate according to claim 9, wherein an area P1 of the first active portion is p, a sum P2 of areas of the two second active portions is greater than or equal to 2p and less than or equal to 3p; a sum P3 of areas of the two third active portions is greater than or equal to 3p and less than or equal to 4p;

or wherein the display substrate further includes a clock signal line arranged in the driving circuit area; the clock signal line is configured to provide the clock signal; a first electrode of the fourth transistor is electrically connected to the third power line;

a ratio between a first distance and a length of the active layer of the third transistor in the first direction is less than or equal to 10.78;

the first distance is a distance between a side of the clock signal line away from the display area and a side of the third power line close to the display area;

or wherein the display substrate further includes a clock signal line arranged in the driving circuit area; the clock signal line is configured to provide a clock signal; the first electrode of the fourth transistor is electrically connected to the third power line; a ratio between the line width of the first power line and the first distance is greater than or equal to 0.060; the line width of the first power line is a length of the first power line along the first direction, the first distance is a distance between the side of the clock signal line away from the display area and the side of the third power line close to the display area;

or wherein the display substrate further includes a clock signal line arranged in the driving circuit area; the clock signal line is configured to provide a clock signal; the first electrode of the fourth transistor is electrically connected to the third power line;

a ratio between the line width of the third power line and the first distance is less than or equal to 0.045; the line width of the third power line is the length of the third power line along the first direction, and the first distance is the distance between the side of the clock signal line away from the display area and the side of the third power line close to the display area.

11. The display substrate according to claim 9, wherein the first output circuit further includes a first capacitor, a first electrode plate of the first capacitor is electrically connected to the first node, and a second electrode plate of the first capacitor is electrically connected to the first driving signal output terminal; the display substrate also includes a first shielding portion;

the first electrode plate of the first capacitor is arranged between the base substrate and the second electrode plate of the first capacitor;

the first shielding portion is arranged on a side of the second electrode plate of the first capacitor away from the base substrate;

or further comprising a second shielding portion; wherein the second input circuit includes a first transistor;

the second shielding portion is arranged on a side of the active layer of the first transistor away from the base substrate;

an orthographic projection area of the second shielding portion on the power line is larger than an orthographic projection area of the active layer of the first transistor on the power line.

12. The display substrate according to claim 1, wherein the display substrate further includes a clock signal line group arranged in the driving circuit area; the clock signal line group includes at least one clock signal line, and the clock signal line is configured to provide a clock signal; the display substrate includes at least two power lines;

the clock signal line group is located between two of the at least two power lines; or, the clock signal line group is located on a side of the power line away from the display area.

13. The display substrate according to claim 12, wherein the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node;

a ratio of a second distance to a length of the active layer of the third transistor in the first direction is less than or equal to 8.47;

the third transistor is a transistor included in the first output circuit that outputs a first voltage signal; the second distance is a distance between a side of the first power line away from the display area and a side of the third power line close to the display area;

or wherein the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node;

a ratio between the line width of the first power line and the second distance is greater than or equal to 0.077;

the line width of the first power line is the length of the first power line in the first direction; the second distance is a distance between the side of the first power line away from the display area and the side of the third power line close to the display area;

or wherein the display substrate includes a first power line and a third power line; the display substrate further includes a second output circuit; the second input circuit is configured to input the first voltage signal provided by the first power line to the second node under the control of the potential of the third node; the second output circuit is configured to output the third voltage signal provided by the third power line to the second driving signal output terminal under the control of the potential of the third node;
a ratio between the line width of the third power line and the second distance is greater than or equal to 0.058;
the line width of the third power line is the length of the third power line in the first direction; the second distance is the distance between the side of the first power line away from the display area and the side of the third power line close to the display area.

14. The display substrate according to claim 12, wherein the display substrate includes a first source-drain metal layer and a second source-drain metal layer sequentially stacked in a direction away from the base substrate;
the clock signal line includes a first clock signal line portion arranged on the first source-drain metal layer or a second clock signal line portion arranged on the second source-drain metal layer,
wherein the display substrate further includes a third gate metal layer arranged between the first source-drain metal layer and the base substrate;
the clock signal line further includes a third clock signal line portion arranged on the third gate metal layer;
the clock signal line includes the first clock signal line portion, and the third clock signal line portion and the first clock signal line portion are in direct contact or are electrically connected to each other through a via hole; or, the clock signal line portion includes the second clock signal line portion, and the third clock signal line portion and the second clock signal line portion are in direct contact or are electrically connected to each other through a via hole,
wherein the clock signal line includes two clock signal line portions coupled to each other, and the two clock signal line portions are respectively arranged on different metal layers; one of the two clock signal line portions is continuous, and the other of the two clock signal line portions is discontinuous.

15. The display substrate according to claim 12, wherein the display substrate includes a first transfer electrode;
a first electrode of the fifth transistor included in a current stage of driving circuit, a gate electrode of the sixth transistor included in the current stage of driving circuit, and a gate electrode of the seventh transistor included in an adjacent stage of driving circuit are connected to each other through a same first transfer electrode;
the fifth transistor is a transistor included in the first output circuit that outputs a clock signal, the sixth transistor is a transistor included in the control circuit that operates under the control of a clock signal, and the seventh transistor is a transistor included in the first input circuit that provides an input voltage to the third node.

16. The display substrate according to claim 12, wherein the display substrate includes a first power line, the display substrate further includes a second transfer electrode, and the second transfer electrode and the first power line are an integral structure; the second input circuit includes an eighth transistor; the first output circuit includes a third transistor; the eighth transistor is a transistor that inputs the first voltage signal provided by the first power line to the second node under control of the potential of the third node; the third transistor is a transistor included in the first output circuit that outputs a first voltage signal;
the second transfer electrode includes a first electrode portion, a second electrode portion and a third electrode portion;
the first electrode portion serves as a connection electrode between the first power line and the first electrode of the eighth transistor, and the second electrode portion is a connection electrode between the first electrode of the eighth transistor and the first electrode of the third transistor, the third electrode portion serves as the first electrode of the third transistor;
an angle between the first electrode portion and the second electrode portion is greater than or equal to 90 degrees and less than or equal to 120 degrees.

17. The display substrate according to claim 12, wherein the display substrate further includes a third transfer electrode; the third transfer electrode includes a fourth electrode portion, a fifth electrode portion and a sixth electrode portion; the second input circuit includes a first transistor and an eighth transistor; the first transistor is a transistor that inputs the second voltage signal provided by the second power line to the second node under the control of the potential of the third node; the driving circuit also includes a second output circuit, the second output circuit includes a second transistor; the second transistor is a transistor that outputs the second voltage signal provided by the second power line to the second driving signal output terminal under the control of the potential of the third node; the eighth transistor is a transistor that inputs the first voltage signal provided by the first power line to the second node under the control of the potential of the third node; the control circuit includes a sixth transistor and a ninth transistor, the sixth transistor is a transistor that operates under the control of a clock signal;
the ninth transistor is a transistor that controls the connection between the third node and the first node under the control of the second voltage signal provided by the second power line; the first transistor and the second transistor are first type of transistors, the eighth transistor and the ninth transistor are second type of transistors;
the fourth electrode portion is configured to electrically connect a bottom gate electrode of the first transistor and the gate electrode of the eighth transistor; and/or, the fourth electrode portion is configured to electrically connect a bottom gate electrode of the second transistor and the gate electrode of the eighth transistor;
the fifth electrode portion is configured to electrically connect the fourth electrode portion, the first electrode of the ninth transistor and a top gate electrode of the first transistor; and/or the fifth electrode portion is configured to electrically connect the fourth electrode portion, a first electrode of the ninth transistor, and a top gate electrode of the second transistor;
the sixth electrode portion is configured to electrically connect the first electrode of the ninth transistor and the second electrode of the sixth transistor,
wherein an angle between the fourth electrode portion and the fifth electrode portion is greater than or equal to 90 degrees and less than 130 degrees,
wherein the fifth electrode portion is perpendicular or parallel to the sixth electrode portion.

18. The display substrate according to claim 1, wherein the display substrate includes a first power line and a second power line; the display substrate further includes a second output circuit; the first input circuit includes a seventh transistor; and the second input circuit includes an eighth transistor; the seventh transistor is a transistor that provides an input voltage to the third node, and the eighth transistor is a transistor that inputs the first voltage signal provided by the first power line to the second node under the control of the potential of the third node; the fourth transistor is a transistor included in the second output circuit that outputs a third voltage signal;

an extension direction of the active layer of the seventh transistor is the same as or perpendicular to an extension direction of the active layer of the eighth transistor;

in a same stage of driving circuit, a position of the first electrode of the seventh transistor in the second direction is lower than a position of the second electrode of the fourth transistor in the second direction.

19. A display device, comprising the display substrate according to claim 1.

20. The display device according to claim 19, further comprising a timing controller, a scanning driver and a data driver; wherein the timing controller is electrically connected to the scanning driver and the data driver respectively, and is configured to provide corresponding control signals to the scanning driver and the data driver respectively;

the scanning driver is electrically connected to a plurality of rows of scanning lines, and is configured to provide corresponding scanning signals to the plurality of rows of scanning lines;

the data driver is electrically connected to a plurality of columns of data lines, and is configured to provide corresponding data signals to the plurality of columns of data lines.

\* \* \* \* \*